US 8,080,458 B2

(12) United States Patent
Masuoka et al.

(10) Patent No.: US 8,080,458 B2
(45) Date of Patent: Dec. 20, 2011

(54) SEMICONDUCTOR DEVICE AND MANUFACTURING METHOD THEREOF

(75) Inventors: Fujio Masuoka, Tokyo (JP); Hiroki Nakamura, Tokyo (JP); Shintaro Arai, Tokyo (JP); Tomohiko Kudo, Tokyo (JP); Navab Singh, Singapore (SG); Kavitha Devi Buddharaju, Singapore (SG); Shen Nansheng, Singapore (SG); Rukmani Devi Sayanthan, Singapore (SG)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/761,735

(22) Filed: Apr. 16, 2010

(65) Prior Publication Data

US 2010/0264485 A1    Oct. 21, 2010

Related U.S. Application Data

(60) Provisional application No. 61/214,584, filed on Apr. 24, 2009.

(30) Foreign Application Priority Data

Apr. 20, 2009    (JP) ................................. 2009-119233

(51) Int. Cl.
*H01L 21/336* (2006.01)
(52) U.S. Cl. .................................. 438/268; 257/E21.41
(58) Field of Classification Search .................. 438/268; 257/E21.41
See application file for complete search history.

(56) References Cited

U.S. PATENT DOCUMENTS

| | | | |
|---|---|---|---|
| 5,382,816 A | 1/1995 | Mitsui | |
| 6,300,198 B1 | 10/2001 | Aeugle et al. | |
| 6,461,900 B1 | 10/2002 | Sundaresan et al. | |
| 6,747,314 B2 | 6/2004 | Sundaresan et al. | |
| 7,115,476 B1 | 10/2006 | Izumida | |
| 7,348,243 B2 | 3/2008 | Kim | |
| 7,442,976 B2 | 10/2008 | Juengling | |
| 7,482,229 B2 | 1/2009 | Juengling | |
| 7,683,428 B2 | 3/2010 | Chidambarrao et al. | |
| 2003/0075758 A1 | 4/2003 | Sundaresan et al. | |

(Continued)

FOREIGN PATENT DOCUMENTS

JP     02-071556 A     3/1990

(Continued)

OTHER PUBLICATIONS

Extended European Search Report for European Application No. 10003947.8, dated Nov. 17, 2010, 9 pages.

*Primary Examiner* — Alexander G. Ghyka
*Assistant Examiner* — Stanetta Isaac
(74) *Attorney, Agent, or Firm* — Brinks Hofer Gilson & Lione

(57) ABSTRACT

A method of manufacturing a semiconductor device includes the steps of forming a first columnar semiconductor layer on a substrate forming a first flat semiconductor layer forming a first semiconductor layer of a second conductive type, and forming a first insulating film. The method further includes the steps of forming a gate insulating film and a gate electrode, forming a second semiconductor layer of the second conductive type, forming a semiconductor layer of a first conductive type and forming a metal-semiconductor compound. The first insulating film has a thickness larger than that of the gate insulating film formed around the first columnar silicon layer.

23 Claims, 42 Drawing Sheets

U.S. PATENT DOCUMENTS

| | | |
|---|---|---|
| 2005/0142771 A1 | 6/2005 | Kim |
| 2005/0224847 A1* | 10/2005 | Masuoka et al. ............. 257/288 |
| 2006/0046407 A1 | 3/2006 | Juengling |
| 2006/0258109 A1 | 11/2006 | Juengling |
| 2008/0061370 A1* | 3/2008 | Matsuo ........................ 257/347 |
| 2009/0042347 A1 | 2/2009 | Oyu |
| 2009/0078993 A1 | 3/2009 | Fujimoto |
| 2009/0096000 A1 | 4/2009 | Juengling |
| 2009/0200604 A1 | 8/2009 | Chidambarrao et al. |

FOREIGN PATENT DOCUMENTS

| | | |
|---|---|---|
| JP | 02-145761 A | 6/1990 |
| JP | 02-188966 A | 7/1990 |
| JP | 06-021389 A | 1/1994 |
| JP | 06-021467 A | 1/1994 |
| JP | 07-245291 A | 9/1995 |
| JP | 07-263677 A | 10/1995 |
| JP | 08-227997 A | 9/1996 |
| JP | 2003-179160 A | 6/2003 |
| JP | 2005-197704 A | 7/2005 |
| JP | 2006-108514 A | 4/2006 |
| JP | 2006-310651 A | 11/2006 |
| JP | 2006-351745 A | 12/2006 |
| JP | 2007-520883 A | 7/2007 |
| JP | 2008-511997 A | 4/2008 |
| JP | 2009-081163 A | 4/2009 |
| WO | WO 2005/079182 A2 | 9/2005 |
| WO | WO 2006/028777 A1 | 3/2006 |

* cited by examiner (a)

(b)

(a)

(b)

(a)

(b)

(a)

(b)

SEMICONDUCTOR DEVICE AND MANUFACTURING METHOD THEREOF

RELATED APPLICATIONS

Pursuant to 35 U.S.C. §119(e), this application claims the benefit of the filing date of Provisional U.S. Patent Application Ser. No. 61/214,584 filed on Apr. 24, 2009. This application also claims priority under 35 U.S.C. §119(a) to JP2009-119233 filed on Apr. 20, 2009. The entire contents of these applications are hereby incorporated by reference.

BACKGROUND OF THE INVENTION

1. Field of the Invention

The present invention relates to a semiconductor device and a method of manufacturing the semiconductor device.

2. Description of the Related Art

In semiconductor integrated circuits, particularly an integrated circuit using a MOS transistor, the degree of integration has become increasingly higher. Along with such a high degree of integration, miniaturization of a MOS transistor for highly integrated circuits has been progressed into a nano region. The progress in miniaturization of the MOS transistor involves problems about difficulty in suppressing a leakage current and restriction on reduction in circuit occupancy area due to a need for ensuring a required current amount. With a view to solving this problem, there has been proposed a surrounding gate transistor (SGT) having a structure where a source, a gate and a drain are vertically arranged relative to a substrate, and the gate is formed to surround a columnar (pillar-shaped) semiconductor layer (see, for example, the following Patent Documents 1 to 3).

Patent Document 1: JP 02-071556A
Patent Document 2: JP 02-188966A
Patent Document 3: JP 02-145761A In the SGT, a channel region is formed to surround a lateral surface of the columnar semiconductor, so that a large gate width is achieved within a small occupancy area. This means that it is required to allow a large ON-current to pass through the small occupancy area. In this case, if resistances of the source and drain are high, the large ON-current will cause difficulty in applying a desired voltage to the source and drain. Therefore, there is a need for an SGT manufacturing method (including a design technique) for reducing the resistances of the source and drain. The large ON-current also gives rise to a need for reducing resistances of contacts.

In a conventional MOS transistor, a gate electrode is formed by depositing a gate material, transferring a gate pattern to a resist on a substrate through lithography to form a mask, and etching the gate material using the mask. That is, in the conventional MOS transistor, a gate length is designed based on the gate pattern. In contrast, in the SGT, the lateral surface of the columnar semiconductor serves as a channel region, and thereby a current flows vertically relative to the substrate. That is, in the SGT, a gate length is designed based on a manufacturing method, instead of based on a gate pattern, so that the gate length and a variation in the gate length are determined by the manufacturing method.

In the SGT, it is required to reduce a diameter of the columnar semiconductor in order to suppress an increase in leakage current along with the miniaturization. In addition, it is necessary to establish a manufacturing method capable of optimizing the source and drain to restrain a short channel effect so as to suppress a leakage current.

Further, in the SGT, it is necessary to reduce a parasitic capacitance in order to minimize power consumption. Thus, there is a need for a manufacturing method capable of reducing a parasitic capacitance.

As with the conventional MOS transistor, the SGT has a need for reducing a manufacturing cost thereof. For this purpose, it is necessary to reduce the number of steps in a manufacturing process.

SUMMARY OF THE INVENTION

It is therefore an object of the present invention to provide an SGT manufacturing method capable of obtaining a structure for reducing resistances of a source and a drain, a structure for reducing a parasitic capacitance, a desired gate length, desired configurations of the source and drain, and a desired diameter of a columnar semiconductor.

In order to achieve this object, according to a first aspect of the present invention, there is provided a method of manufacturing a semiconductor device, which comprises the steps of: forming a first columnar semiconductor layer on a substrate, and forming a first flat semiconductor layer in an upper portion of the substrate lying under the first columnar semiconductor layer; forming a first semiconductor layer of a second conductive type in a lower portion of the first columnar semiconductor layer and an entirety or an upper portion of the first flat semiconductor layer; forming a first insulating film around a lower sidewall of the first columnar silicon layer and above the first flat semiconductor layer; forming a gate insulating film and a gate electrode around the first columnar silicon layer; forming a sidewall-shaped second insulating film to surround an upper sidewall of the first columnar silicon layer while contacting an upper surface of the gate electrode and to surround a sidewall of the gate electrode and the first insulating film; forming a second semiconductor layer of the second conductive type in an upper portion of the first columnar silicon layer, and forming a semiconductor layer of a first conductive type between the first semiconductor layer of the second conductive type and the second semiconductor layer of the second conductive type; and forming a metal-semiconductor compound on each of an upper surface of the first semiconductor layer of the second conductive type and an upper surface of the second semiconductor layer of the second conductive type, wherein the first insulating film has a thickness larger than that of the gate insulating film formed around the first columnar silicon layer.

Preferably, in the method of the present invention, a length between a central axis of the first columnar silicon layer and an edge of the first columnar silicon layer is larger than a sum of a length between the central axis of the first columnar silicon layer and a sidewall of the first columnar silicon layer, the thickness of the gate insulating film, a thickness of the gate electrode, and a thickness of the sidewall-shaped second insulating film formed to surround the sidewall of the gate electrode and the first insulating film.

Preferably, in the method of the present invention, the gate electrode has a thickness larger than that of the sidewall-shaped second insulating film formed to surround the upper sidewall of the first columnar silicon layer while contacting the upper surface of the gate electrode.

In the method of the present invention, it is preferable that the first flat semiconductor layer being a first flat silicon layer, the first columnar semiconductor layer being a first columnar silicon layer, the semiconductor layer of the first conductive type being a silicon layer of the first conductive type, the first semiconductor layer of the second conductive type being a first silicon layer of the second conductive type, and the second semiconductor layer of the second conductive type being a second silicon layer of the second conductive type.

In the above method, the semiconductor layer of the first conductive type may be a p-type silicon layer or a non-doped silicon layer. Further, the first semiconductor layer of the second conductive type may be an n-type silicon layer, and the second semiconductor layer of the second conductive type may be an n-type silicon layer.

Alternatively, the semiconductor layer of the first conductive type may be an n-type silicon layer or a non-doped silicon layer. Further, the first semiconductor layer of the second conductive type may be a p-type silicon layer, and the second semiconductor layer of the second conductive type may be a p-type silicon layer.

Preferably, the above method includes the steps of: forming a pad oxide film on the silicon substrate; forming on the pad oxide film a first nitride film for use as a mask during the formation of the first columnar silicon layer; forming a first amorphous silicon or polysilicon film on the first nitride film; applying a resist onto the first amorphous silicon or polysilicon film, and transferring a first columnar layer pattern to the resist through lithography to leave a first resist corresponding to the first columnar layer pattern; and etching the first amorphous silicon or polysilicon film and the first nitride film in turn to form a first hard mask.

Preferably, the above method includes the step of forming the first columnar semiconductor layer by a dry etching process using the first hard mask.

Preferably, in the above method, the first amorphous silicon or polysilicon film serving as the first hard mask is fully etched during the dry etching process to cause a change in plasma emission intensity detectable by a dry etching apparatus, wherein the step of forming the first columnar semiconductor layer includes detecting the change in the plasma emission intensity, and determining a termination timing of the dry etching process based on the detection result to control a height dimension of the first columnar silicon layer.

Preferably, in the above method, a height dimension of the first amorphous silicon or polysilicon film before the dry etching process is less than that of the first columnar silicon layer.

Preferably, the above method includes the step of sacrificially oxidizing a surface of the first columnar silicon layer fabricated on the substrate so as to reduce irregularities of a sidewall of the first columnar silicon layer for use as a channel region while removing a surface portion of the first columnar silicon layer having carbon implanted thereinto during the dry etching process, and protect the first columnar silicon layer from contaminations including a by-product to be produced during a subsequent dry etching process.

Preferably, the above method includes the steps of: applying a resist onto the substrate having the first columnar silicon layer, and transferring a first flat silicon layer pattern to the resist through lithography to leave a second resist corresponding to the first flat silicon layer pattern; and etching the silicon substrate to form the first flat silicon layer, and removing the second resist.

Preferably, the above method includes the steps of: depositing a filling oxide film on the first flat silicon layer and substrate having the first columnar silicon layer; flattening the filling oxide film; and etching the filling oxide film in such a manner as to allow a surface of an upper portion of the first flat silicon layer to be exposed.

Preferably, the above method includes the step of: the offset spacer formation on the sidewall of the first columnar silicon layer.

Preferably, in the above method, the first silicon layer of the second conductive type is formed in the lower portion of the first columnar semiconductor layer and the entirety or the upper portion of the first flat semiconductor layer by introducing an impurity of the second conductive type into the first flat semiconductor layer having the first columnar silicon layer with a offset spacer through an impurity introduction process comprising an impurity injection process. And then, the offset spacer is etched.

Preferably, in the above method, the first silicon layer of the second conductive type is formed in the lower portion of the first columnar semiconductor layer without injecting any impurity into the upper portion of the first columnar silicon layer.

Preferably, the above method includes the steps of: depositing a first insulating film material above and around the first columnar silicon layer fabricated on the first flat silicon layer, in such a manner that the first insulating film material deposited above the first columnar silicon layer and around the lower sidewall of the first columnar silicon layer has a thickness larger than that of the first insulating film material deposited around an intermediate/upper sidewall of the first columnar silicon layer; and etching the first insulating film material around the intermediate/upper sidewall of the first columnar silicon layer to form the first insulating film above the first columnar silicon layer and around the lower sidewall of the first columnar silicon layer, in such a manner as to have a thickness larger than that of the gate insulating film to be formed around the first columnar silicon layer.

Preferably, in the above method, the gate insulating film is formed on the sidewall of the first columnar silicon layer with a first hard mask of nitride film fabricated on the first flat silicon layer, wherein the method includes the steps of: forming a second amorphous silicon or polysilicon film serving as a gate electrode material, on an in-process structure obtained by the step of forming the gate insulating film, in such a manner as to allow the first columnar silicon layer to be embedded therein; and polishing the second amorphous silicon or polysilicon film by a chemical mechanical polishing process to have a flattened upper surface, wherein the nitride film serving as the first hard mask is used as a stopper against the chemical mechanical polishing process to control a polishing amount with enhanced reproducibility.

Preferably, the above method includes the steps of: etching back the second amorphous silicon or polysilicon film serving as the gate electrode material, to allow the gate electrode to be formed with a desired gate length; and depositing a first oxide film on an in-process structure obtained by the step of etching back the second amorphous silicon or polysilicon film, whereby the first oxide film can protect an upper surface of the gate electrode from a wet etching or dry etching process to be performed in a subsequent step, so as to suppress a change or variation in the gate length and damage of the gate insulating film from the upper surface of the gate electrode.

Preferably, the above method includes the steps of: forming a second nitride film on the first oxide film; etching back the second nitride film to form a third insulating film sidewall, and etching the first oxide film; applying a bottom anti-reflective coating (BARC) layer onto an in-process structure obtained by the step of etching back the second nitride film, applying a resist onto the BARC layer, and transferring a gate wiring pattern to the resist through lithography to leave a third resist corresponding to the gate wiring pattern; etching the BARC layer, and the second amorphous silicon or polysilicon film serving as the gate electrode material, using the third resist as a mask, to form a gate electrode body and a gate wiring which make up the gate electrode; partly removing the first insulating film by a dry etching or wet etching to allow the surface of the first semiconductor layer of the second conductive type lying under the first columnar silicon layer to be exposed; the removing the resist and the BARC; forming the fourth oxide layer on an exposed surface of the gate electrode and the surfaces of the first semiconductor layer of the second conductive type lying under the first columnar silicon layer; removing the first nitride film above the first columnar silicon layer and the second nitride film around the first columnar silicon layer by an etching process; and removing the pad oxide film, and the first oxide film and the fourth oxide layer.

Preferably, the above method includes the steps of: forming a third nitride film on the first columnar silicon layer fabricated on the first flat silicon layer, the gate electrode surrounding the first columnar silicon layer, etching back the third nitride film in such a manner that the respective upper surfaces of the first semiconductor layer of the second conductive type lying under the first columnar silicon layer, and the upper portion of the first columnar silicon layer, are exposed, and forming a second insulating film sidewall serving as the sidewall-shaped second insulating film, to surround the upper sidewall of the first columnar silicon layer while contacting the upper surface of the gate electrode and to surround the sidewall of the gate electrode; introducing an impurity of the second conductive type into the upper portion of the first columnar silicon layer through an impurity introduction process comprising an impurity injection process, to form the second silicon layer of the second conductive type in the upper portion of the first columnar silicon layer, and form the silicon layer of the first conductive type between the first silicon layer of the second conductive type and the second silicon layer of the second conductive type; and forming a first metal film such as a nickel (Ni) film or a cobalt (Co) film, on the respective exposed surface of the first silicon layer of the second conductive type and the gate electrode, and an upper surface of the second silicon of the second conductive type, by a sputtering process, subjecting the first metal film to a heat treatment, and removing an unreacted part of the heat-treated film, to form a metal-semiconductor compound on each of the first silicon layer of the second conductive type and the second silicon layer of the second conductive type.

Preferably, the above method includes the steps of: forming a contact stopper such as a nitride film, on the first columnar silicon layer fabricated on the first flat silicon layer, the gate electrode surrounding the first columnar silicon layer; forming a third oxide film serving as an interlayer insulating film, on the contact stopper, and flattening the third oxide film by a chemical mechanical polishing process; forming a contact hole in the third oxide film at position on the upper side of the second silicon layer of the second conductive type formed in the upper portion of the first columnar silicon layer, by an etching process; forming contact holes in the third oxide film at positions on respective upper sides of the first silicon layer of the second conductive type formed in the entirety or the upper portion of the first flat semiconductor layer lying under the first columnar silicon layer, and the gate electrode, by an etching process; etching the portion of the contact stopper corresponding to the respective contact holes.

According to a second aspect of the present invention, there is provided a semiconductor device which comprises: a first flat semiconductor layer formed on a substrate; a first columnar semiconductor layer formed on the first flat semiconductor layer; a first semiconductor layer of a second conductive type formed in a lower portion of the first columnar semiconductor layer and an entirety or an upper portion of the first flat semiconductor layer; a second semiconductor layer of the second conductive type formed in an upper portion of the first columnar silicon layer; a semiconductor layer of a first conductive type formed between the first semiconductor layer of the second conductive type formed in the lower portion of the first columnar semiconductor layer, and the second semiconductor layer of the second conductive type formed in the upper portion of the first columnar silicon layer; a gate insulating film and a gate electrode which are formed around the first columnar silicon layer; a first insulating film formed between the gate electrode and the first flat semiconductor layer; a sidewall-shaped second insulating film formed to surround an upper sidewall of the first columnar silicon layer while contacting an upper surface of the gate electrode and to surround a sidewall of the gate electrode and the first insulating film; a metal-semiconductor compound formed on each of an upper surface of the first semiconductor layer of the second conductive type formed in the entirety or the upper portion of the first flat semiconductor layer, and an upper surface of the second semiconductor layer of the second conductive type formed in the upper portion of the first columnar semiconductor layer, wherein the first insulating film formed between the gate electrode and the first flat semiconductor layer has a thickness larger than that of the gate insulating film formed around the first columnar silicon layer.

According to a third aspect of the present invention, there is provided a semiconductor device which comprises: a first flat semiconductor layer formed on a substrate; a first columnar semiconductor layer formed on the first flat semiconductor layer; a first semiconductor layer of a second conductive type formed in a lower portion of the first columnar semiconductor layer and an entirety or an upper portion of the first flat semiconductor layer; a second semiconductor layer of the second conductive type formed in an upper portion of the first columnar silicon layer; a semiconductor layer of a first conductive type formed between the first semiconductor layer of the second conductive type formed in the lower portion of the first columnar semiconductor layer, and the second semiconductor layer of the second conductive type formed in the upper portion of the first columnar silicon layer; a gate insulating film and a gate electrode which are formed around the first columnar silicon layer; a first insulating film formed between the gate electrode and the first flat semiconductor layer; a sidewall-shaped second insulating film formed to surround an upper sidewall of the first columnar silicon layer while contacting an upper surface of the gate electrode and to surround a sidewall of the gate electrode and the first insulating film; a metal-semiconductor compound formed on each of an upper surface of the first semiconductor layer of the second conductive type formed in the entirety or the upper portion of the first flat semiconductor layer, and an upper surface of the second semiconductor layer of the second conductive type formed in the upper portion of the first columnar semiconductor layer, wherein: the first insulating film formed between the gate electrode and the first flat semiconductor layer has a thickness larger than that of the gate insulating film formed around the first columnar silicon layer; and a length between a central axis of the first columnar silicon layer and an edge of the first columnar silicon layer is larger than a sum of a length between the central axis of the first columnar silicon layer and a sidewall of the first columnar silicon layer, the thickness of the gate insulating film, a thickness of the gate electrode, and a thickness of the sidewall-shaped second insulating film formed to surround the sidewall of the gate electrode and the first insulating film.

According to a fourth aspect of the present invention, there is provided a semiconductor device which comprises: a first flat semiconductor layer formed on a substrate; a first columnar semiconductor layer formed on the first flat semiconductor layer; a first semiconductor layer of a second conductive type formed in a lower portion of the first columnar semiconductor layer and an entirety or an upper portion of the first flat semiconductor layer; a second semiconductor layer of the second conductive type formed in an upper portion of the first columnar silicon layer; a semiconductor layer of a first conductive type formed between the first semiconductor layer of the second conductive type formed in the lower portion of the first columnar semiconductor layer, and the second semiconductor layer of the second conductive type formed in the upper portion of the first columnar silicon layer; a gate insulating film and a gate electrode which are formed around the first columnar silicon layer; a first insulating film formed between the gate electrode and the first flat semiconductor layer; a sidewall-shaped second insulating film formed to surround an upper sidewall of the first columnar silicon layer while contacting an upper surface of the gate electrode and to surround a sidewall of the gate electrode; a metal-semiconductor compound formed on each of an upper surface of the first semiconductor layer of the second conductive type formed in the entirety or the upper portion of the first flat semiconductor layer, and an upper surface of the second semiconductor layer of the second conductive type formed in the upper portion of the first columnar semiconductor layer, wherein: the first insulating film formed between the gate electrode and the first flat semiconductor layer has a thickness larger than that of the gate insulating film formed around the first columnar silicon layer; and the gate electrode has a thickness larger than that of the sidewall-shaped second insulating film formed to surround the upper sidewall of the first columnar silicon layer while contacting the upper surface of the gate electrode.

As above, the method according to the first aspect of the present invention, comprises the steps of: forming a first columnar semiconductor layer on a substrate, and forming a first flat semiconductor layer in an upper portion of the substrate lying under the first columnar semiconductor layer; forming a first semiconductor layer of a second conductive type in a lower portion of the first columnar semiconductor layer and an entirety or an upper portion of the first flat semiconductor layer; forming a first insulating film around a lower sidewall of the first columnar silicon layer and above the first flat semiconductor layer; forming a gate insulating film and a gate electrode around the first columnar silicon layer; forming a sidewall-shaped second insulating film to surround an upper sidewall of the first columnar silicon layer while contacting an upper surface of the gate electrode and to surround a sidewall of the gate electrode and the first insulating film; forming a second semiconductor layer of the second conductive type in an upper portion of the first columnar silicon layer, and forming a semiconductor layer of a first conductive type between the first semiconductor layer of the second conductive type and the second semiconductor layer of the second conductive type; and forming a metal-semiconductor compound on each of an upper surface of the first semiconductor layer of the second conductive type and an upper surface of the second semiconductor layer of the second conductive type, wherein the first insulating film has a thickness larger than that of the gate insulating film formed around the first columnar silicon layer.

The above feature of the present invention makes it possible to provide an SGT manufacturing method capable of obtaining a structure for reducing resistances of a source and a drain, a structure for reducing a parasitic capacitance, a desired gate length, desired configurations of the source and drain, and a desired diameter of a columnar semiconductor.

In the method according to one preferred embodiment of the present invention, a length between a central axis of the first columnar silicon layer and an edge of the first columnar silicon layer is larger than a sum of a length between the central axis of the first columnar silicon layer and a sidewall of the first columnar silicon layer, the thickness of the gate insulating film, a thickness of the gate electrode, and a thickness of the sidewall-shaped second insulating film formed to surround the sidewall of the gate electrode and the first insulating film. This feature makes it possible to adequately form a metal-semiconductor compound on the first semiconductor layer of the second conductive type formed in the entirety or the upper portion of the first flat semiconductor layer lying under the first columnar semiconductor layer, so as to reduce a resistance of the first semiconductor layer of the second conductive type formed in the entirety or the upper portion of the first flat semiconductor layer lying under the first columnar semiconductor layer.

In the method according to one preferred embodiment of the present invention, the gate electrode has a thickness larger than that of the sidewall-shaped second insulating film formed to surround the upper sidewall of the first columnar silicon layer while contacting the upper surface of the gate electrode. This feature makes it possible to adequately form a metal-semiconductor compound on the gate electrode, according to need, so as to reduce a resistance of the gate electrode.

The method according to one preferred embodiment of the present invention includes the steps of: forming a pad oxide film on the silicon substrate; forming on the pad oxide film a first nitride film for use as a mask during the formation of the first columnar silicon layer; forming a first amorphous silicon or polysilicon film on the first nitride film; applying a resist onto the first amorphous silicon or polysilicon film, and transferring a first columnar layer pattern to the resist through lithography to leave a first resist corresponding to the first columnar layer pattern; and etching the first amorphous silicon or polysilicon film and the first nitride film in turn to form a first hard mask. This feature makes it possible to control a height of the first columnar silicon layer according to determination of a termination timing of a dry etching process in the subsequent step.

The method according to one preferred embodiment of the present invention includes the step of forming the first columnar semiconductor layer by a dry etching process using the first hard mask. During this dry etching process, the first amorphous silicon or polysilicon film serving as the first hard mask is fully etched to cause a change in plasma emission intensity detectable by a dry etching apparatus. Thus, the change in the plasma emission intensity can be detected to determine a termination timing of the dry etching process based on the detection result to control a height dimension of the first columnar silicon layer.

In the method according to one preferred embodiment of the present invention, a height dimension of the first amorphous silicon or polysilicon film before the dry etching process is less than that of the first columnar silicon layer. This feature makes it possible to adequately determine the termination timing of the dry etching process.

The method according to one preferred embodiment of the present invention includes the step of sacrificially oxidizing a surface of the first columnar silicon layer fabricated on the substrate. This feature makes it possible to reduce irregularities of a sidewall of the first columnar silicon layer for use as a channel region while removing a surface portion of the first columnar silicon layer having carbon implanted thereinto during the dry etching process, and protect the first columnar silicon layer from contaminations including a by-product to be produced during a subsequent dry etching process.

The method according to one preferred embodiment of the present invention includes the steps of: applying a resist onto the substrate having the first columnar silicon layer, and transferring a first flat silicon layer pattern to the resist through lithography to leave a second resist corresponding to the first flat silicon layer pattern; and etching the silicon substrate to form the first flat silicon layer, and removing the second resist. This feature makes it possible to adequately achieve an interelement isolation.

The method according to one preferred embodiment of the present invention includes the steps of: depositing a filling oxide film on the first flat silicon layer and substrate having the first columnar silicon layer; flattening the filling oxide film; and etching the filling oxide film in such a manner as to allow a surface of an upper portion of the first flat silicon layer to be exposed. This feature makes it possible to adequately achieve an interelement isolation.

The method according to one preferred embodiment of the present invention includes the step of: the offset spacer formation on the sidewall of the first columnar silicon layer. This feature makes it possible to prevent an impurity from being implanted from the sidewall of the first columnar silicon layer during an impurity injection process.

In the method according to one preferred embodiment of the present invention, the first silicon layer of the second conductive type is formed in the lower portion of the first columnar semiconductor layer and the entirety or the upper portion of the first flat semiconductor layer by introducing an impurity of the second conductive type into the first flat semiconductor layer having the first columnar silicon layer with a offset spacer through an impurity introduction process comprising an impurity injection process. And then, the offset spacer is etched. This feature makes it possible to efficiently form the first silicon layer of the second conductive type.

In the method according to one preferred embodiment of the present invention, the first silicon layer of the second conductive type is formed in the lower portion of the first columnar semiconductor layer without injecting any impurity into the upper portion of the first columnar silicon layer. This feature makes it possible to easily optimize conditions of respective impurity injection processes for the upper portion of the first columnar silicon layer and the first flat silicon layer lying the first columnar silicon layer, to restrain a short channel effect so as to reduce a leakage current.

The method according to one preferred embodiment of the present invention includes the steps of: depositing a first insulating film material above and around the first columnar silicon layer fabricated on the first flat silicon layer, in such a manner that the first insulating film material deposited above the first columnar silicon layer and around the lower sidewall of the first columnar silicon layer has a thickness larger than that of the first insulating film material deposited around an intermediate/upper sidewall of the first columnar silicon layer; and etching the first insulating film material around the intermediate/upper sidewall of the first columnar silicon layer to form the first insulating film above the first columnar silicon layer and around the lower sidewall of the first columnar silicon layer, in such a manner as to have a thickness larger than that of the gate insulating film to be formed around the first columnar silicon layer. This feature makes it possible to reduce a gate-source parasitic capacitance.

In the method according to one preferred embodiment of the present invention, the gate insulating film is formed on the sidewall of the first columnar silicon layer with a first hard mask of nitride film fabricated on the first flat silicon layer, wherein the method includes the steps of: forming a second amorphous silicon or polysilicon film serving as a gate electrode material, on an in-process structure obtained by the step of forming the gate insulating film, in such a manner as to allow the first columnar silicon layer to be embedded therein; and polishing the second amorphous silicon or polysilicon film by a chemical mechanical polishing process to have a flattened upper surface. According to this feature, the nitride film serving as the first hard mask can be used as a stopper against the chemical mechanical polishing process to control a polishing amount with enhanced reproducibility.

The method according to one preferred embodiment of the present invention includes the steps of: etching back the second amorphous silicon or polysilicon film serving as the gate electrode material, to allow the gate electrode to be formed with a desired gate length; and depositing a first oxide film on an in-process structure obtained by the step of etching back the second amorphous silicon or polysilicon film. According to this feature, the first oxide film can protect an upper surface of the gate electrode from a wet etching or dry etching process to be performed in a subsequent step, so as to suppress a change or variation in the gate length and damage of the gate insulating film from the upper surface of the gate electrode.

The method according to one preferred embodiment of the present invention includes the steps of: forming a second nitride film on the first oxide film; etching back the second nitride film to form a third insulating film sidewall, and etching the first oxide film; applying a bottom anti-reflective coating (BARC) layer onto an in-process structure obtained by the step of etching back the second nitride film, applying a resist onto the BARC layer, and transferring a gate wiring pattern to the resist through lithography to leave a third resist corresponding to the gate wiring pattern; etching the BARC layer, and the second amorphous silicon or polysilicon film serving as the gate electrode material, using the third resist as a mask, to form a gate electrode body and a gate wiring which make up the gate electrode; partly removing the first insulating film by a dry etching or wet etching to allow the surface of the first semiconductor layer of the second conductive type lying under the first columnar silicon layer to be exposed; the removing the resist and the BARC; forming the fourth oxide layer on an exposed surface of the gate electrode and the surfaces of the first semiconductor layer of the second conductive type lying under the first columnar silicon layer; removing the first nitride film above the first columnar silicon layer and the second nitride film around the first columnar silicon layer by an etching process; and removing the pad oxide film, and the first oxide film and the fourth oxide layer. This feature makes it possible to form the gate electrode around the first columnar silicon layer.

The method according to one preferred embodiment of the present invention includes the steps of: forming a third nitride film on the first columnar silicon layer fabricated on the first flat silicon layer, the gate electrode surrounding the first columnar silicon layer, etching back the third nitride film in such a manner that the respective upper surfaces of the first semiconductor layer of the second conductive type lying under the first columnar silicon layer, and the upper portion of the first columnar silicon layer, are exposed, and forming a second insulating film sidewall serving as the sidewall-shaped second insulating film, to surround the upper sidewall of the first columnar silicon layer while contacting the upper surface of the gate electrode and to surround the sidewall of the gate electrode; introducing an impurity of the second conductive type into the upper portion of the first columnar silicon layer through an impurity introduction process comprising an impurity injection process, to form the second silicon layer of the second conductive type in the upper portion of the first columnar silicon layer, and form the silicon layer of the first conductive type between the first silicon layer of the second conductive type and the second silicon layer of the second conductive type; and forming a first metal film such as a nickel (Ni) film or a cobalt (Co) film, on the respective exposed surface of the first silicon layer of the second conductive type and the gate electrode, and an upper surface of the second silicon of the second conductive type, by a sputtering process, subjecting the first metal film to a heat treatment, and removing an unreacted part of the heat-treated film, to form a metal-semiconductor compound on each of the first silicon layer of the second conductive type and the second silicon layer of the second conductive type. According to this feature, the gate electrode, and each of the first silicon layer of the second conductive type formed under the first columnar silicon layer and the second silicon layer of the second conductive type formed in the upper portion of the first columnar silicon layer, are isolated from each other by the second insulating film sidewall. This makes it possible to prevent a short between the gate electrode and the respective ones of the first silicon layer of the second conductive type formed under the first columnar silicon layer and the second silicon layer of the second conductive type formed in the upper portion of the first columnar silicon layer, due to the metal-semiconductor compounds. In addition, the upper sidewall of the first columnar silicon layer is covered by the second insulating film sidewall. This makes it possible to prevent a metal-semiconductor compound from being formed on the upper sidewall of the first columnar silicon layer.

The method according to one preferred embodiment of the present invention includes the steps of: forming a contact stopper such as a nitride film, on the first columnar silicon layer fabricated on the first flat silicon layer, the gate electrode surrounding the first columnar silicon layer; forming a third oxide film serving as an interlayer insulating film, on the contact stopper, and flattening the third oxide film by a chemical mechanical polishing process; forming a contact hole in the third oxide film at position on the second silicon layer of the second conductive type formed in the upper portion of the first columnar silicon layer, by an etching process; forming two contact holes in the third oxide film at positions on respective upper sides of the first silicon layer of the second conductive type formed in the entirety or the upper portion of the first flat semiconductor layer lying under the first columnar silicon layer, and the gate electrode, by an etching process; etching the portion of the contact stopper corresponding to the respective contact holes. This feature makes it possible to reduce a resistance of the contact.

The semiconductor device according to the second aspect of the present invention comprises: a first flat semiconductor layer formed on a substrate; a first columnar semiconductor layer formed on the first flat semiconductor layer; a first semiconductor layer of a second conductive type formed in a lower portion of the first columnar semiconductor layer and an entirety or an upper portion of the first flat semiconductor layer; a second semiconductor layer of the second conductive type formed in an upper portion of the first columnar silicon layer; a semiconductor layer of a first conductive type formed between the first semiconductor layer of the second conductive type formed in the lower portion of the first columnar semiconductor layer, and the second semiconductor layer of the second conductive type formed in the upper portion of the first columnar silicon layer; a gate insulating film and a gate electrode which are formed around the first columnar silicon layer; a first insulating film formed between the gate electrode and the first flat semiconductor layer; a sidewall-shaped second insulating film formed to surround an upper sidewall of the first columnar silicon layer while contacting an upper surface of the gate electrode and to surround a sidewall of the gate electrode and the first insulating film; a metal-semiconductor compound formed on each of an upper surface of the first semiconductor layer of the second conductive type formed in the entirety or the upper portion of the first flat semiconductor layer, and an upper surface of the second semiconductor layer of the second conductive type formed in the upper portion of the first columnar semiconductor layer, wherein the first insulating film formed between the gate electrode and the first flat semiconductor layer has a thickness larger than that of the gate insulating film formed around the first columnar silicon layer.

In the semiconductor device according to the second aspect of the present invention, different voltages can be applied to respective ones of the first semiconductor layer of the second conductive type formed in the entirety or the upper portion of the first flat semiconductor layer lying under the first columnar semiconductor layer, the gate electrode, and the second semiconductor layer of the second conductive type formed in the upper portion of the first columnar semiconductor layer. In addition, respective resistances of the first semiconductor layer of the second conductive type formed in the entirety or the upper portion of the first flat semiconductor layer lying under the first columnar semiconductor layer, and the second semiconductor layer of the second conductive type formed in the upper portion of the first columnar semiconductor layer, can be reduced while reducing a gate-source parasitic capacitance.

The semiconductor device according to the third aspect of the present invention comprises: a first flat semiconductor layer formed on a substrate; a first columnar semiconductor layer formed on the first flat semiconductor layer; a first semiconductor layer of a second conductive type formed in a lower portion of the first columnar semiconductor layer and an entirety or an upper portion of the first flat semiconductor layer; a second semiconductor layer of the second conductive type formed in an upper portion of the first columnar silicon layer; a semiconductor layer of a first conductive type formed between the first semiconductor layer of the second conductive type formed in the lower portion of the first columnar semiconductor layer, and the second semiconductor layer of the second conductive type formed in the upper portion of the first columnar silicon layer; a gate insulating film and a gate electrode which are formed around the first columnar silicon layer; a first insulating film formed between the gate electrode and the first flat semiconductor layer; a sidewall-shaped second insulating film formed to surround an upper sidewall of the first columnar silicon layer while contacting an upper surface of the gate electrode and to surround a sidewall of the gate electrode and the first insulating film; a metal-semiconductor compound formed on each of an upper surface of the first semiconductor layer of the second conductive type formed in the entirety or the upper portion of the first flat semiconductor layer, and an upper surface of the second semiconductor layer of the second conductive type formed in the upper portion of the first columnar semiconductor layer, wherein: the first insulating film formed between the gate electrode and the first flat semiconductor layer has a thickness larger than that of the gate insulating film formed around the first columnar silicon layer; and a length between a central axis of the first columnar silicon layer and an edge of the first columnar silicon layer is larger than a sum of a length between the central axis of the first columnar silicon layer and a sidewall of the first columnar silicon layer, the thickness of the gate insulating film, a thickness of the gate electrode, and a thickness of the sidewall-shaped second insulating film formed to surround the sidewall of the gate electrode and the first insulating film.

In the semiconductor device according to the third aspect of the present invention, in addition to the advantages of the semiconductor device according to the third aspect of the present invention, the metal-semiconductor compound can be adequately formed on the first semiconductor layer of the second conductive type formed in the entirety or the upper portion of the first flat semiconductor layer lying under the first columnar semiconductor layer to reduce a resistance of the first semiconductor layer of the second conductive type formed in the entirety or the upper portion of the first flat semiconductor layer lying under the first columnar semiconductor layer.

The semiconductor device according to the fourth aspect of the present invention comprises: a first flat semiconductor layer formed on a substrate; a first columnar semiconductor layer formed on the first flat semiconductor layer; a first semiconductor layer of a second conductive type formed in a lower portion of the first columnar semiconductor layer and an entirety or an upper portion of the first flat semiconductor layer; a second semiconductor layer of the second conductive type formed in an upper portion of the first columnar silicon layer; a semiconductor layer of a first conductive type formed between the first semiconductor layer of the second conductive type formed in the lower portion of the first columnar semiconductor layer, and the second semiconductor layer of the second conductive type formed in the upper portion of the first columnar silicon layer; a gate insulating film and a gate electrode which are formed around the first columnar silicon layer; a first insulating film formed between the gate electrode and the first flat semiconductor layer; a sidewall-shaped second insulating film formed to surround an upper sidewall of the first columnar silicon layer while contacting an upper surface of the gate electrode and to surround a sidewall of the gate electrode; a metal-semiconductor compound formed on each of an upper surface of the first semiconductor layer of the second conductive type formed in the entirety or the upper portion of the first flat semiconductor layer, and an upper surface of the second semiconductor layer of the second conductive type formed in the upper portion of the first columnar semiconductor layer, wherein: the first insulating film formed between the gate electrode and the first flat semiconductor layer has a thickness larger than that of the gate insulating film formed around the first columnar silicon layer; and the gate electrode has a thickness larger than that of the sidewall-shaped second insulating film formed to surround the upper sidewall of the first columnar silicon layer while contacting the upper surface of the gate electrode.

In the semiconductor device according to the fourth aspect of the present invention, in addition to the advantages of the semiconductor device according to the third aspect of the present invention, a metal-semiconductor compound can be adequately on the gate electrode, according to need, to reduce a resistance of the gate electrode.

BRIEF DESCRIPTION OF THE DRAWINGS

FIG. 15(b) is a sectional view taken along the line A-A' in FIG. 15(a).

FIG. 19(*b*) is a sectional view taken along the line A-A' in FIG. 19(*a*).

FIG. 20(*b*) is a sectional view taken along the line A-A' in FIG. 20(*a*).

FIG. 21(*b*) is a sectional view taken along the line A-A' in FIG. 21(*a*).

FIG. 22(*b*) is a sectional view taken along the line A-A' in FIG. 22(*a*).

FIG. 23(*b*) is a sectional view taken along the line A-A' in FIG. 23(*a*).

FIG. 24(*b*) is a sectional view taken along the line A-A' in FIG. 24(*a*).

FIG. 25(*b*) is a sectional view taken along the line A-A' in FIG. 25(*a*).

FIG. 26(*b*) is a sectional view taken along the line A-A' in FIG. 26(*a*).

FIG. 27(*b*) is a sectional view taken along the line A-A' in FIG. 27(*a*).

FIG. 28(*b*) is a sectional view taken along the line A-A' in FIG. 28(*a*).

FIG. 29(*b*) is a sectional view taken along the line A-A' in FIG. 29(*a*).

FIG. 30(*b*) is a sectional view taken along the line A-A' in FIG. 30(*a*).

FIG. 31(*b*) is a sectional view taken along the line A-A' in FIG. 31(*a*).

FIG. 32(*b*) is a sectional view taken along the line A-A' in FIG. 32(*a*).

FIG. 33(*b*) is a sectional view taken along the line A-A' in FIG. 33(*a*).

FIG. 34(*b*) is a sectional view taken along the line A-A' in FIG. 34(*a*).

FIG. 35(*b*) is a sectional view taken along the line A-A' in FIG. 35(*a*).

FIG. 36(*b*) is a sectional view taken along the line A-A' in FIG. 36(*a*).

FIG. 37(*b*) is a sectional view taken along the line A-A' in FIG. 37(*a*).

FIG. 38(*b*) is a sectional view taken along the line A-A' in FIG. 38(*a*).

FIG. 39(*b*) is a sectional view taken along the line A-A' in FIG. 39(*a*).

FIG. 40(*b*) is a sectional view taken along the line A-A' in FIG. 40(*a*).

FIG. 41(*b*) is a sectional view taken along the line A-A' in FIG. 41(*a*).

DETAILED DESCRIPTION OF THE PREFERRED EMBODIMENTS

Figure 41:
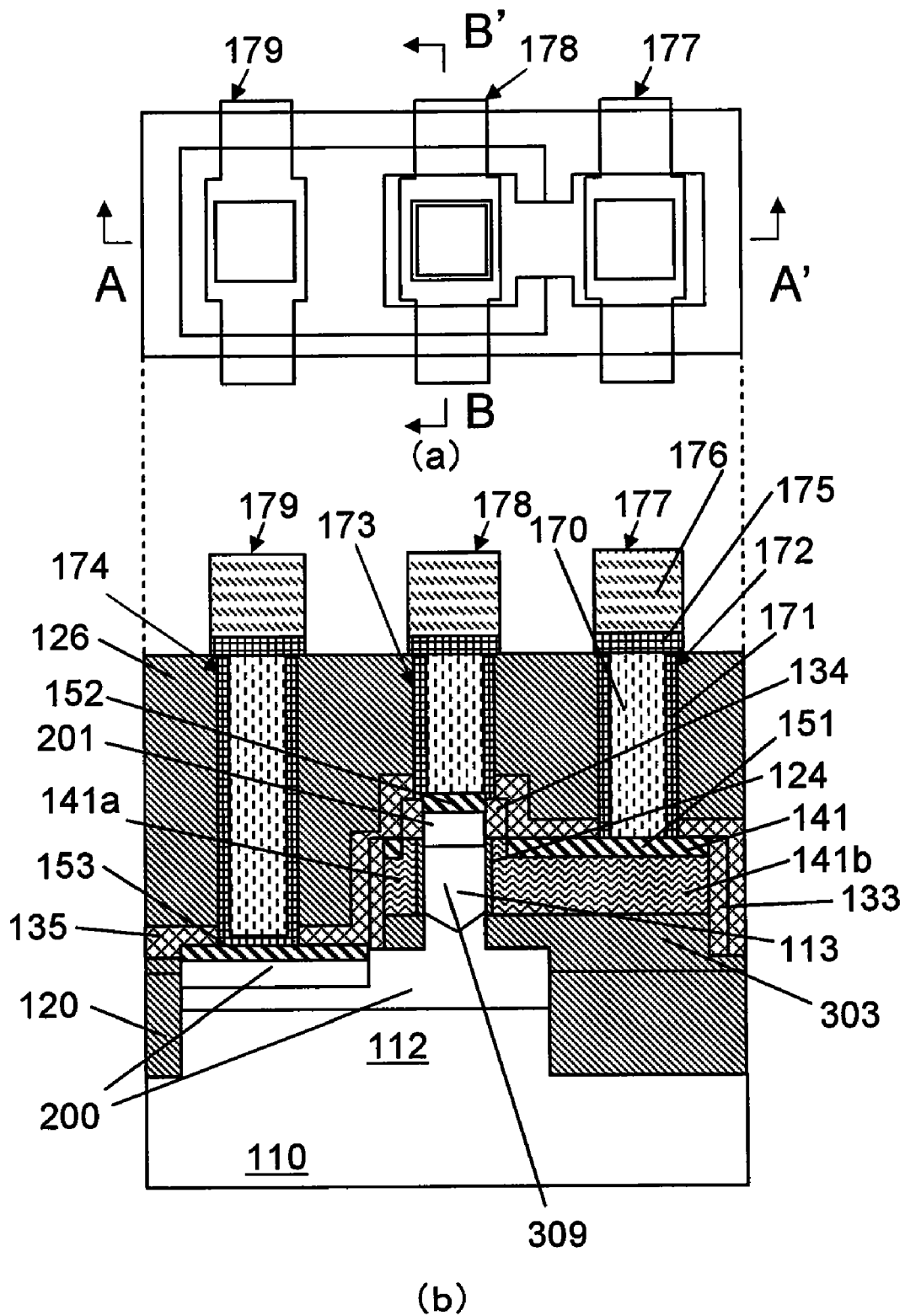
FIG. 41(*a*) is a top plan view showing a semiconductor device obtained by the method.

FIG. 41(*a*) is a top plan view showing an NMOS (N-channel metal oxide semiconductor)-type SGT obtained by an SGT manufacturing method according to one embodiment of the present invention, and FIG. 41(*b*) is a sectional view taken along the line A-A' in FIG. 41(*a*). With reference to FIGS. 41(*a*) and 41(*b*), a structure of the NMOS-type SGT will be described below.

A first flat silicon layer 112 which is a first flat semiconductor layer, is formed on a silicon substrate 110 which is a substrate, and a first columnar silicon layer 113 which is a first columnar semiconductor layer, is formed on the first flat silicon layer 112. A source diffusion layer 200 which is a first semiconductor layer of a second conductive type, is formed in a lower portion of the first columnar silicon layer 113 and an upper portion (or an entirety) of the flat silicon layer 112, and a drain diffusion layer 201 which is a second semiconductor layer of the second conductive type, is formed in an upper portion of the columnar silicon layer 113.

A body 309 which is a semiconductor layer of a first conductive type, is formed between the source diffusion layer 200 formed in the lower portion of the first columnar silicon layer 113 and the upper portion (or an entirety) of the flat silicon layer 112, and the drain diffusion layer 201 formed in the upper portion of the columnar silicon layer 113.

A gate insulating film 124, and a gate electrode 141 (a gate electrode body 141*a* surrounding the body 309, and a gate wiring 141*b* extending from the gate electrode body 141*a*), are formed around the first columnar silicon layer 113.

Further, a first insulating film 303, i.e., an oxide film having a thickness larger than that of the gate insulating film 124, is formed between the gate electrode 141 and the source diffusion layer 200. Based on forming the first insulating film 303, i.e., the oxide film having a thickness larger than that of the gate insulating film 124, between the gate electrode 141 and the source diffusion layer 200, a gate-source parasitic capacitance can be reduced.

A second insulating film sidewall 134, i.e., a sidewall-shaped second insulating film, is formed to surround an upper sidewall of the first columnar silicon layer 113 while contacting an upper surface of the gate electrode 141 (gate electrode body 141a), and a second insulating film sidewall 133, i.e., a sidewall-shaped second insulating layer, is formed to surround a sidewall of the gate electrode 141.

A metal-semiconductor compound 153 is formed in an upper surface of the source diffusion layer 200, and a metal-semiconductor compound 152 is formed in an upper surface of the drain diffusion layer 201. Further, a metal-semiconductor compound 151 is formed in an upper surface of the gate electrode 141.

A contact 174 is formed on the source diffusion layer 200 (metal-semiconductor compound 153), and a contact 173 is formed on the drain diffusion layer 201 (metal-semiconductor compound 152). Further, a contact 172 is formed on the gate wiring 141b (the metal-semiconductor compound 151).

Figure 42:
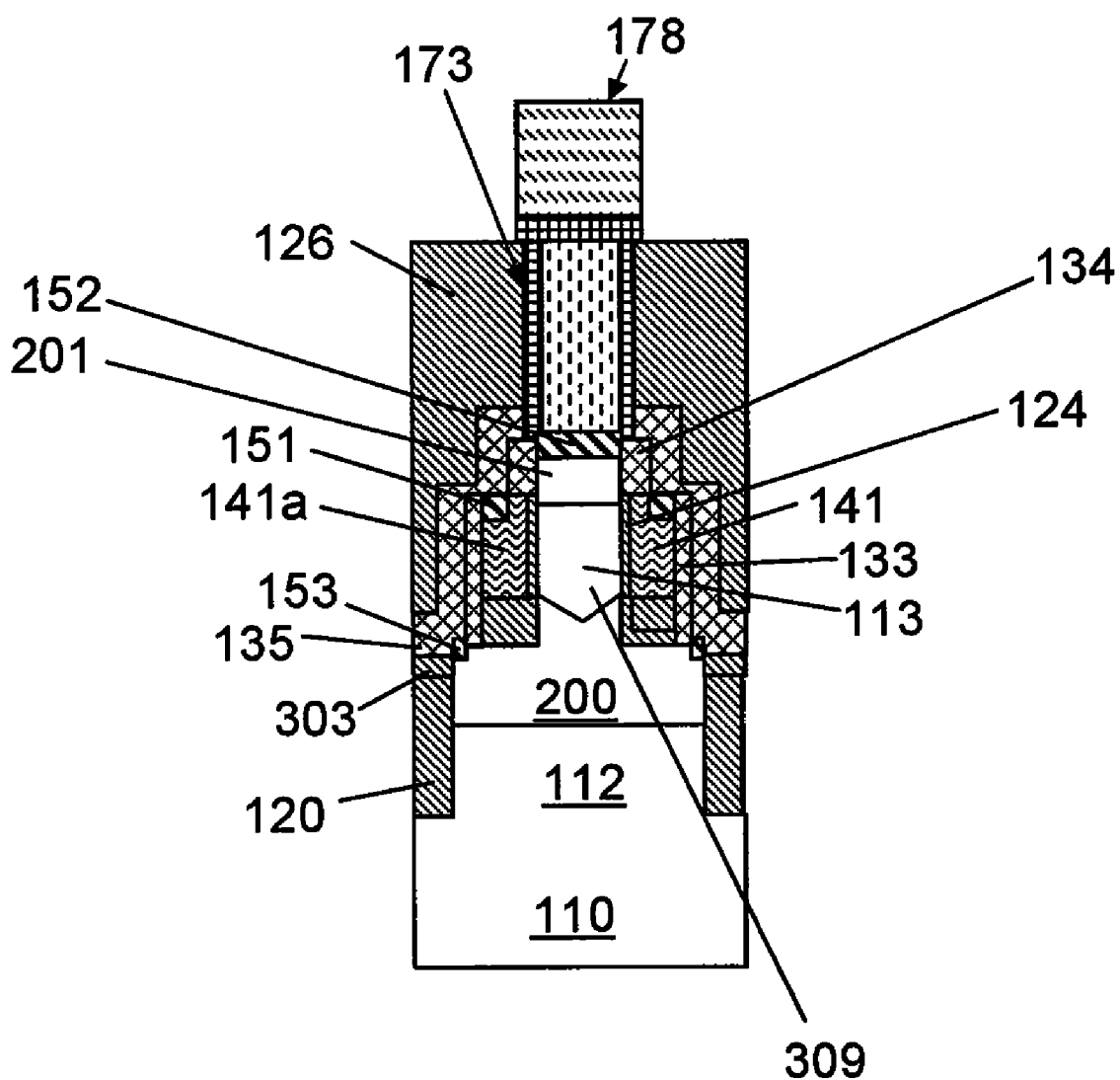
FIG. 42 is a sectional view taken along the line B-B' in FIG. 41(*a*).

FIG. 42 is a sectional view taken along the line B-B' in FIG. 41(a). The metal-semiconductor compound 153 is formed as a means to reduce a resistance of a source region. In order to allow the metal-semiconductor compound 153 to be formed in the source diffusion layer 200, it is necessary to satisfy the following conditional formula (1) in FIG. 42:

$$Wa > Wp + Wox + Wg + Ws \quad (1),$$

wherein: Wa is a length between a central axis of the first columnar silicon layer 113 and an edge of the source diffusion layer 200;

Wp is a length between the central axis of the first columnar silicon layer 113 and a sidewall thereof;

Wox is a thickness of the gate insulating film 124 (first columnar silicon layer 113);

Wg is a width (thickness) of the gate electrode 141 (gate electrode body 141a); and Ws is a width (thickness) of the second insulating film sidewall 133 (i.e., second insulating film).

The metal-semiconductor compound 151 is formed as a means to reduce a resistance of a gate region. In order to allow the metal-semiconductor compound 151 to be formed in the gate electrode 141, it is necessary to satisfy the following conditional formula (2) in FIG. 42:

$$Wg > Ws \quad (2),$$

wherein Wg is the width of the gate electrode 141 (gate electrode body 141a), and Ws is the width of the second insulating film sidewall 134 (i.e., second insulating film).

A structure satisfying the conditional formulas (1) and (2) allows the metal-semiconductor compound 151, 152, 153 to be formed so as to reduce resistance of the gate electrode, the drain region and the source region to increase an ON-current.

The SGT can perform a transistor operation by applying a potential of zero to Vcc to the gate electrode 141 under a condition that the source diffusion layer 200 and the drain diffusion layer 201 are connected to a GND potential and a Vcc potential, respectively.

The diffusion layer to be formed in the upper portion of the first columnar silicon layer 113, and the diffusion layer to be formed in the lower portion of the first columnar silicon layer 113 and the upper portion (or an entirety) of the flat silicon layer 112, may be a source diffusion layer and a drain diffusion layer, respectively.

With reference to FIGS. 1(a) to 41(b), an SGT manufacturing method according to one embodiment of the present invention will be described below. FIGS. 1(a) to 41(b) show respective steps in the SGT manufacturing method according to the embodiment, wherein each of FIGS. 1 to 41 with the suffix (a) is a top plan view, and each of FIGS. 1 to 41 with the suffix (b) is a sectional view taken along the line A-A' in a corresponding one of FIGS. 1 to 41 with the suffix (a). In FIGS. 1(a) to 41(b), the same element is defined by a common reference numeral or code. In the following description, a combination of FIGS. 1(a) and 1(b) to a combination of FIGS. 41(a) and 41(b) will be referred to as "FIG. 1" to "FIG. 41", respectively.

Figure 1:
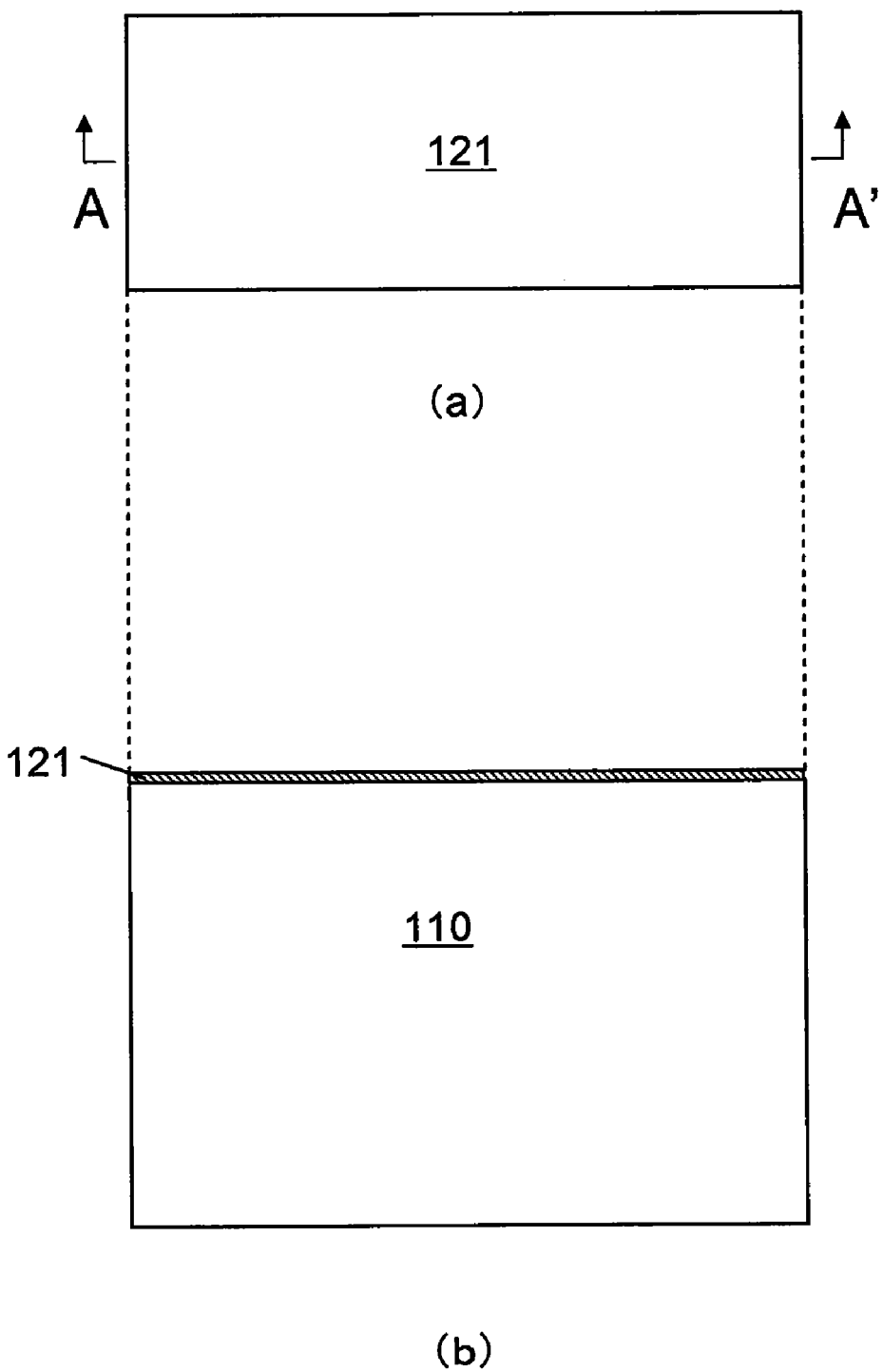
FIG. 1(a) is a top plan view showing one step in a method of manufacturing a semiconductor device, according to one embodiment of the present invention.
FIG. 1(b) is a sectional view taken along the line A-A' in FIG. 1(a).

Referring to FIG. 1, a pad oxide film 121 is formed on a silicon substrate 110.

Figure 2:
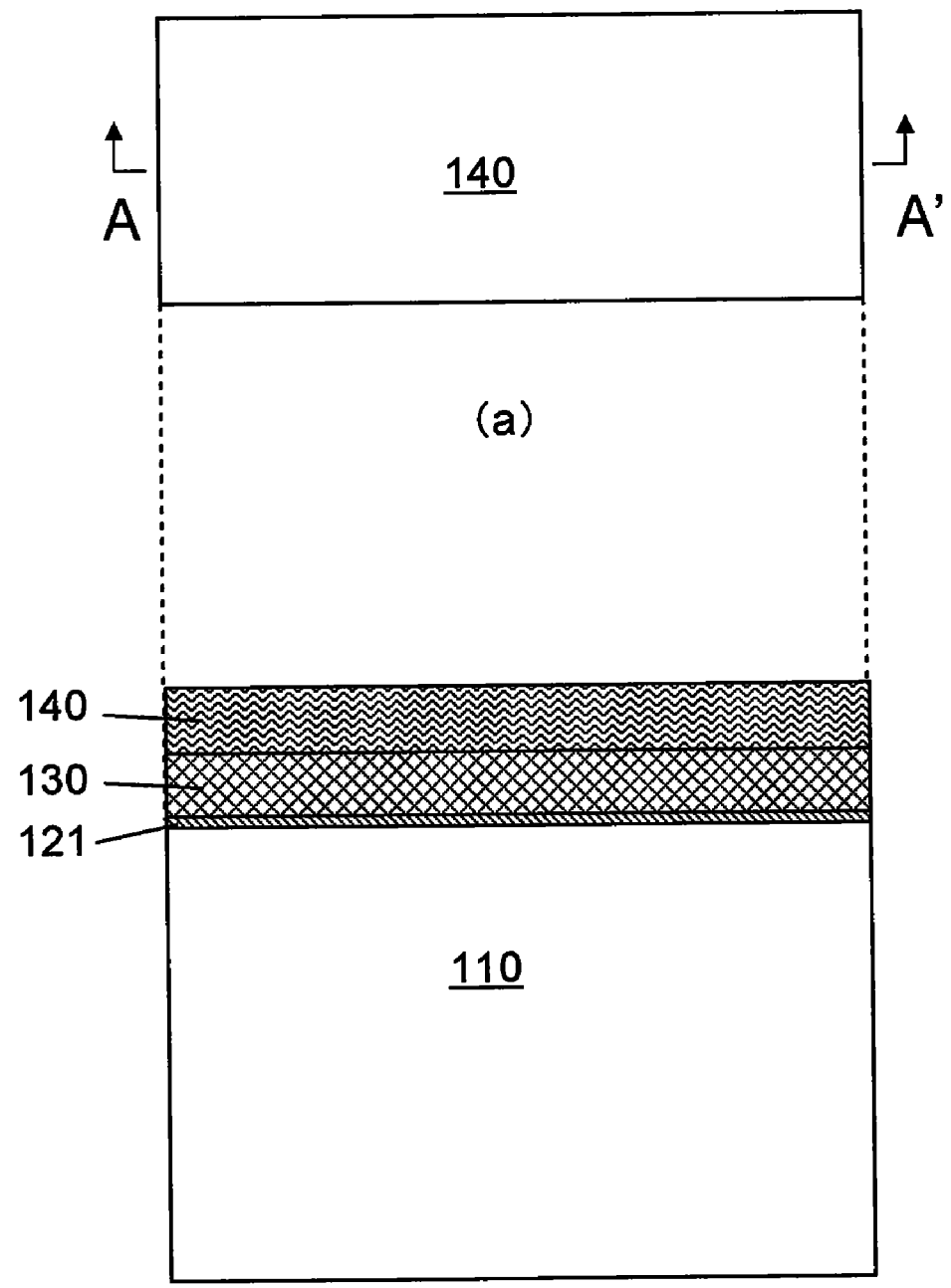
FIG. 2(a) is a top plan view showing one step in the method.
FIG. 2(b) is a sectional view taken along the line A-A' in FIG. 2(a).

Referring to FIG. 2, a first nitride film 130 is formed on the pad oxide film 121, and then a first amorphous silicon or polysilicon film 140 is formed on the first nitride film 130.

Figure 3:
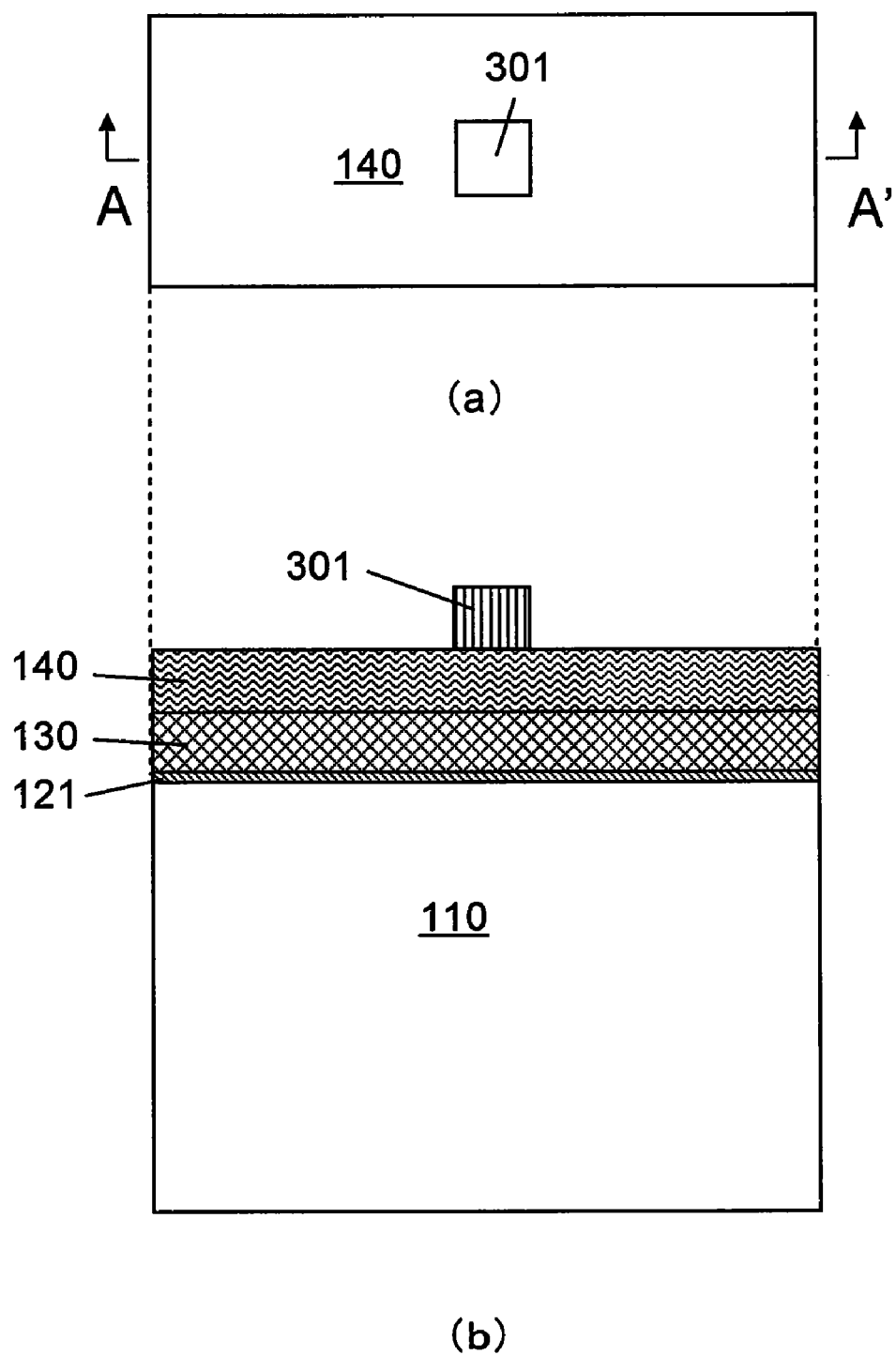
FIG. 3(a) is a top plan view showing one step in the method.
FIG. 3(b) is a sectional view taken along the line A-A' in FIG. 3(a).

Referring to FIG. 3, a resist is applied onto the first amorphous silicon or polysilicon film 140, and a first columnar layer pattern is transferred to the resist through lithography to leave a first resist 301 corresponding to the first columnar layer pattern.

Figure 4:
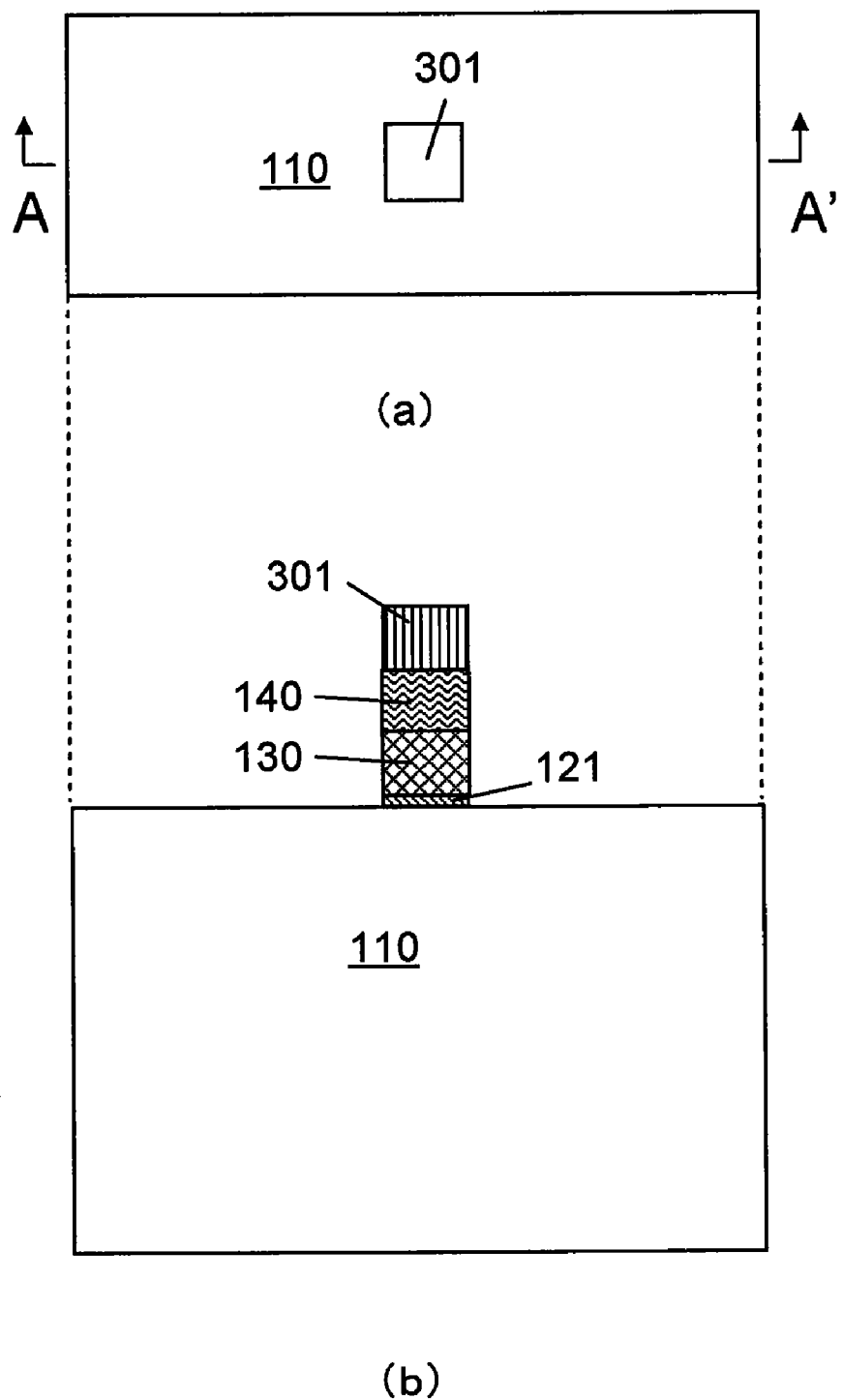
FIG. 4(a) is a top plan view showing one step in the method.
FIG. 4(b) is a sectional view taken along the line A-A' in FIG. 4(a).

Referring to FIG. 4, the first amorphous silicon or polysilicon film 140 and the first nitride film 130 are etched in turn to form a first hard mask, and then the pad oxide film 121 is etched.

Figure 5:
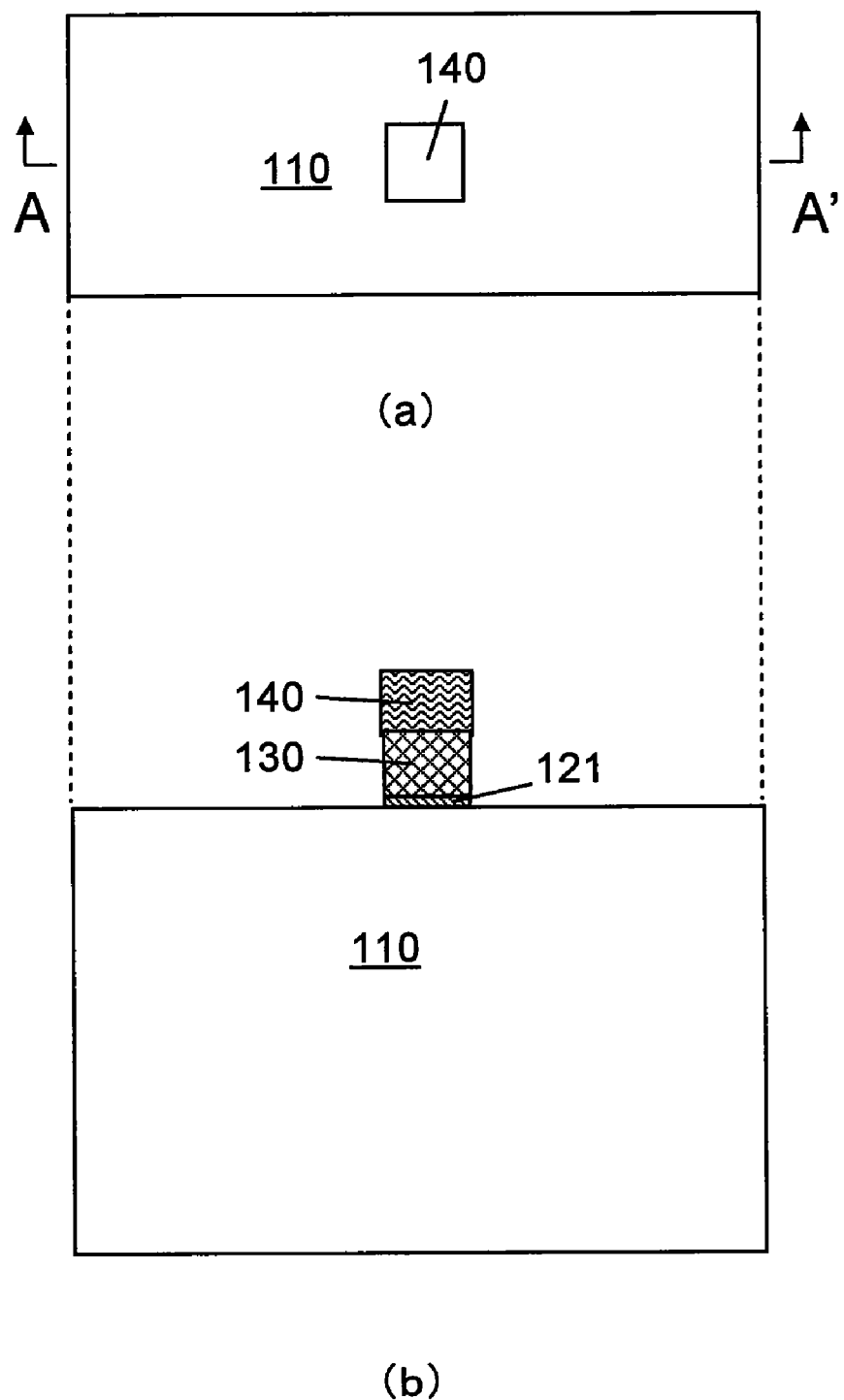
FIG. 5(a) is a top plan view showing one step in the method.
FIG. 5(b) is a sectional view taken along the line A-A' in FIG. 5(a).

Referring to FIG. 5, the first resist 301 is removed.

Figure 6:
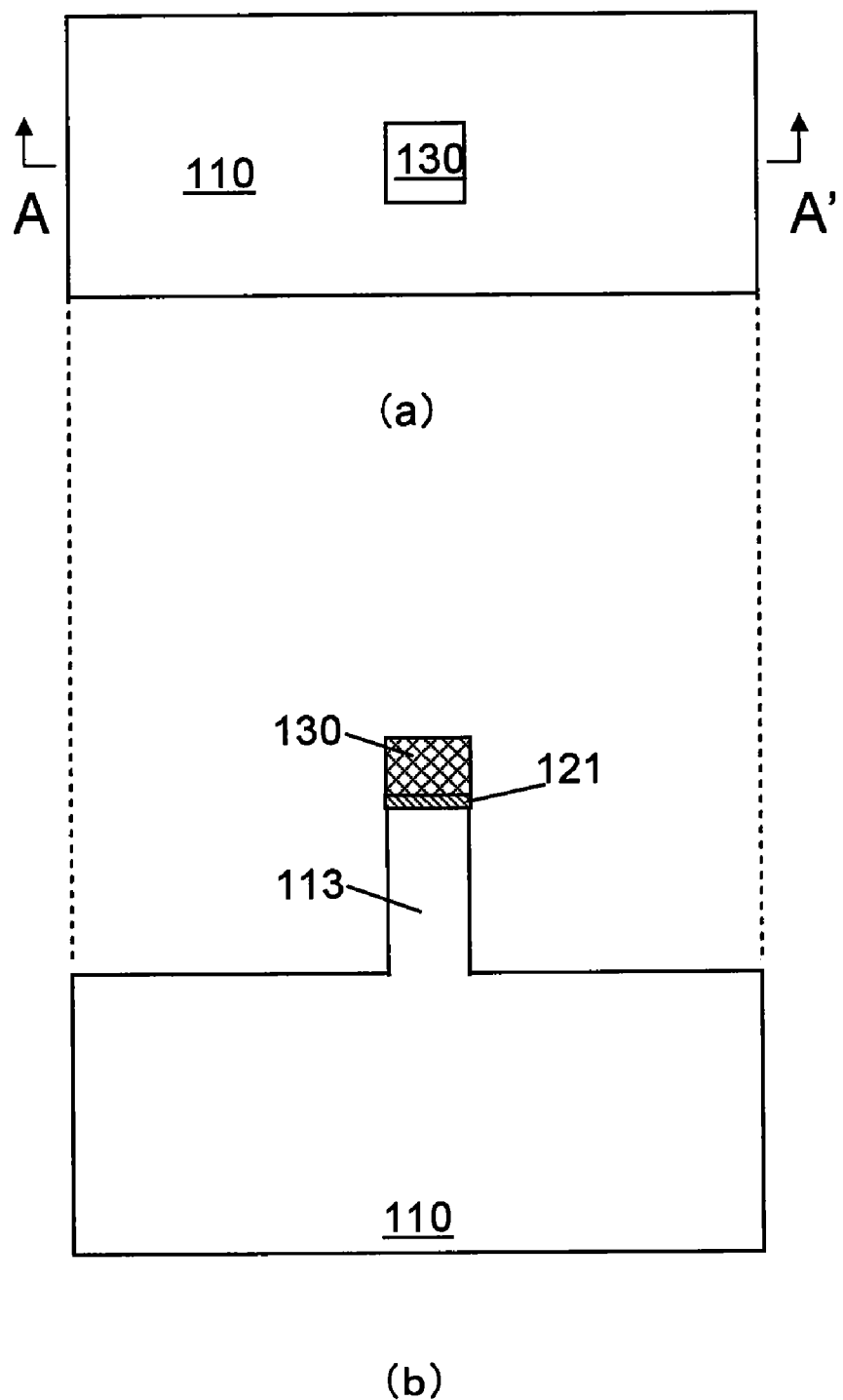
FIG. 6(a) is a top plan view showing one step in the method.
FIG. 6(b) is a sectional view taken along the line A-A' in FIG. 6(a).

Referring to FIG. 6, the silicon substrate 110 is dry-etched, using the first hard mask consisting of respective remaining portions of the first amorphous silicon or polysilicon film 140 and the first nitride film 130, to form a first columnar silicon layer 113. During this dry etching process, the first amorphous silicon or polysilicon film 140 is also etched. In this case, when the first amorphous silicon or polysilicon film 140 is fully etched, a plasma emission intensity detectable by a dry etching apparatus is changed. Thus, a termination timing of the dry etching process can be determined by detecting the change in plasma emission intensity, so as to stably control a height dimension of the first columnar silicon layer 113 irrespective of an etching rate.

In order to utilize the above termination-timing detection technique, it is necessary that a thickness (height dimension) of the first amorphous silicon or polysilicon film 140 before the dry etching process for forming the first columnar silicon layer 113 is less than that of the first columnar silicon layer 113.

Figure 7:
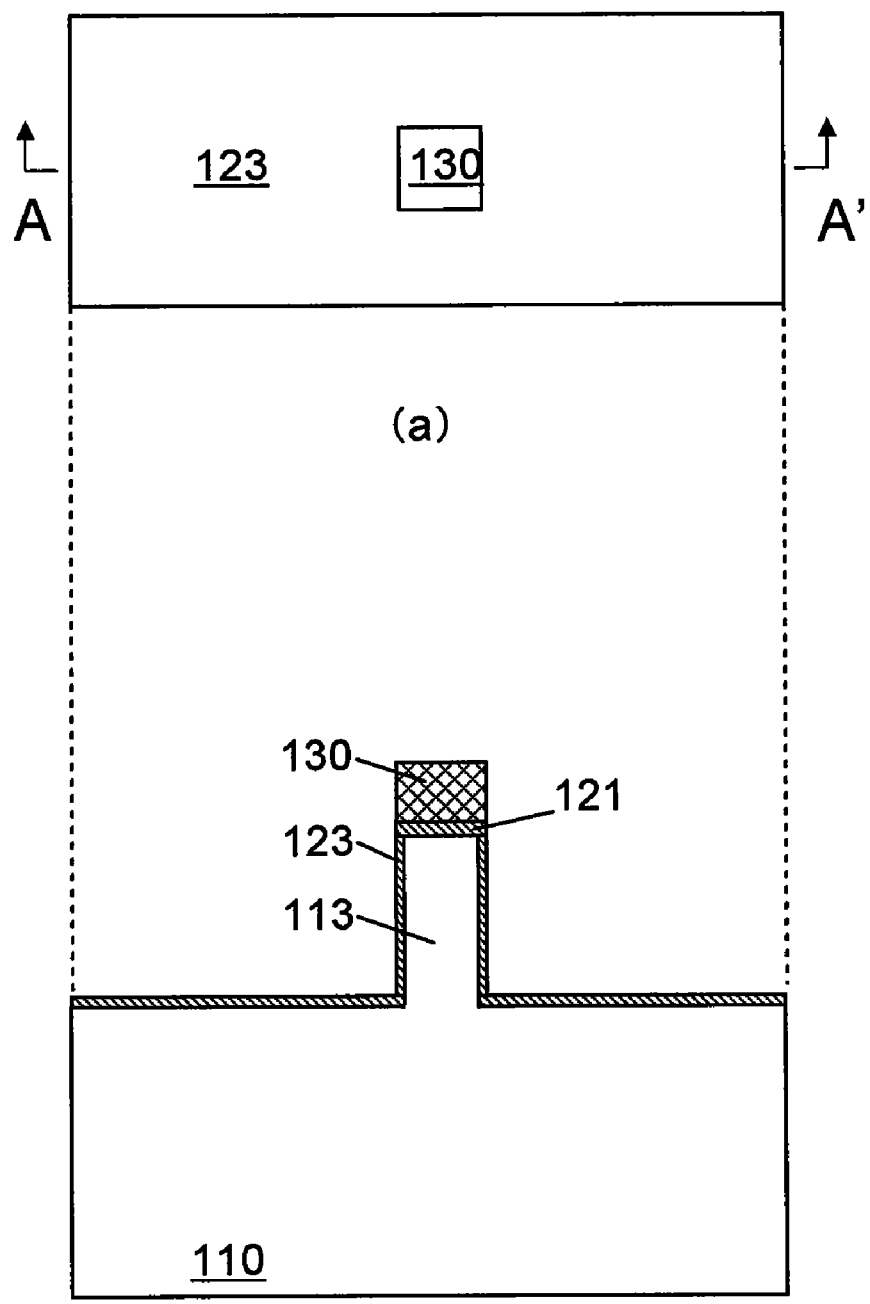
FIG. 7(a) is a top plan view showing one step in the method.
FIG. 7(b) is a sectional view taken along the line A-A' in FIG. 7(a).

Referring to FIG. 7, respective surfaces of the first columnar silicon layer 113 and the silicon substrate 110 are sacrificially oxidized to form a sacrificial oxide film 123 so as to reduce irregularities of a sidewall of the first columnar silicon layer 113 for use as a channel region, and remove respective surface portions of the first columnar silicon layer 113 and the silicon substrate 110 (i.e., silicon surface) having carbon and others implanted thereinto during the dry etching process.

Figure 8:
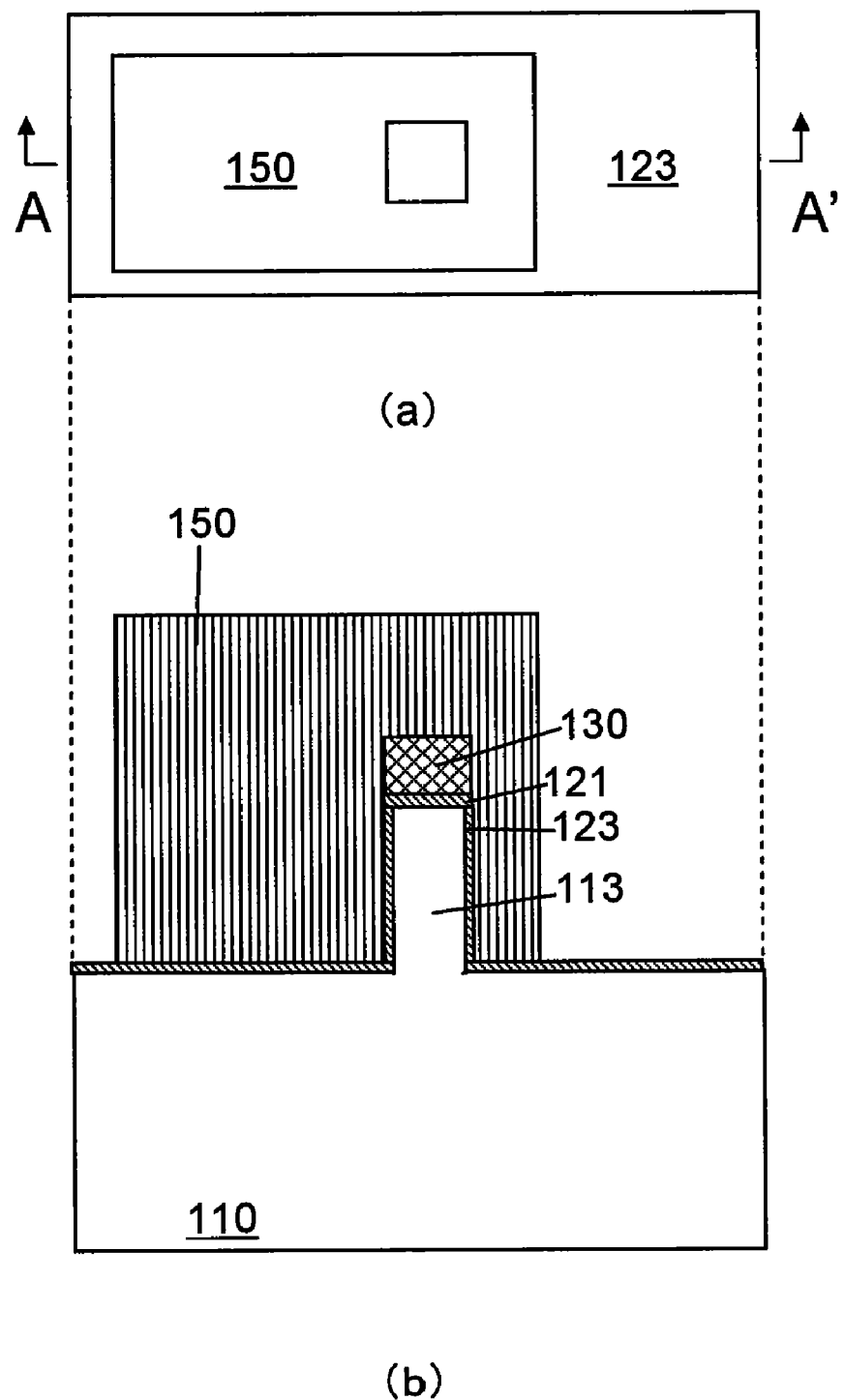
FIG. 8(a) is a top plan view showing one step in the method.
FIG. 8(b) is a sectional view taken along the line A-A' in FIG. 8(a).

Referring to FIG. 8, a resist is applied onto the in-process structure in FIG. 7, and a first flat silicon layer pattern is transferred to the resist through lithography to leave a second resist 150 corresponding to the first flat silicon layer pattern. The above sacrificial oxide film 123 formed on the first columnar silicon layer 113 and the silicon substrate 110 by the sacrificial oxidation can protect the silicon surface from contaminations, such as by-products to be produced during a subsequent dry etching process.

Figure 9:
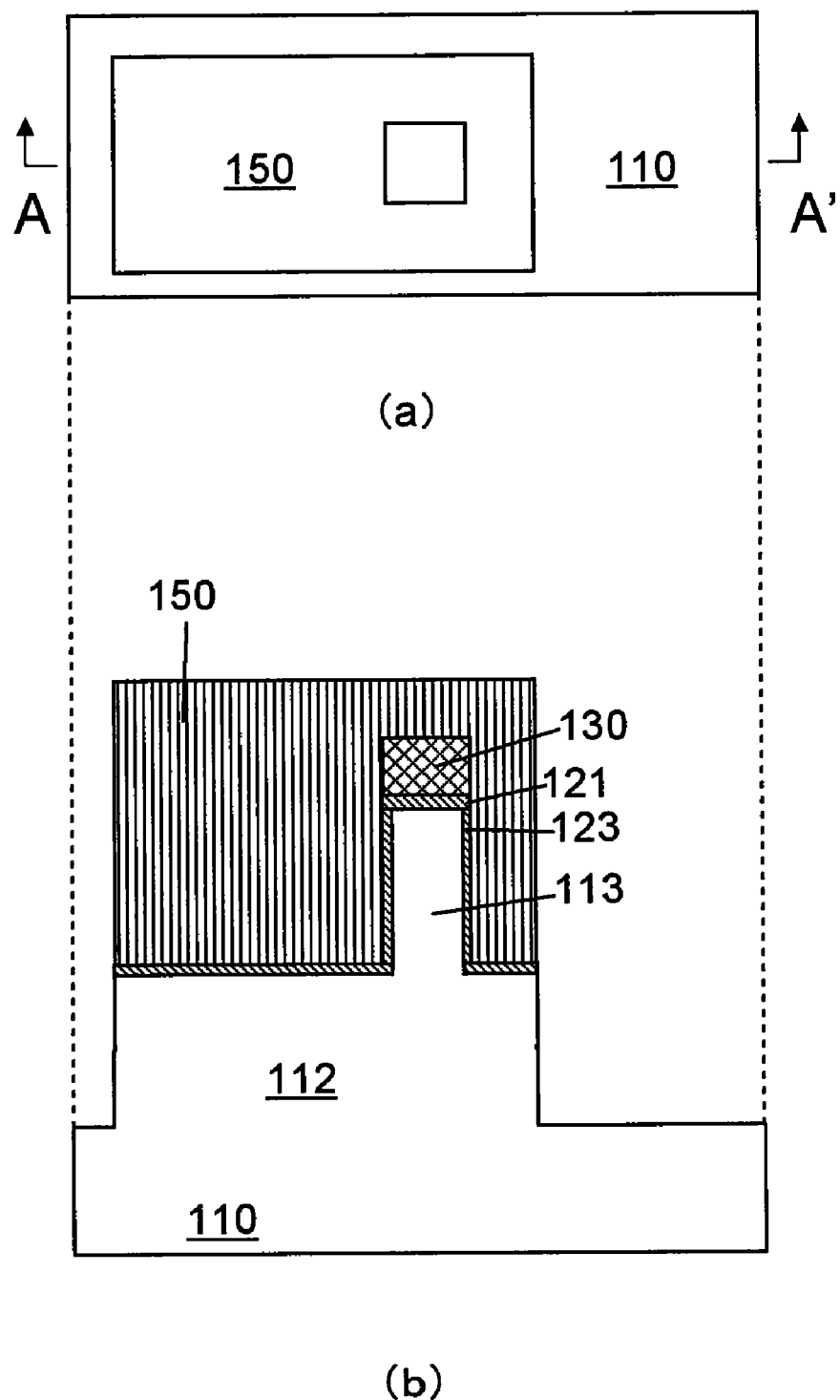
FIG. 9(a) is a top plan view showing one step in the method.
FIG. 9(b) is a sectional view taken along the line A-A' in FIG. 9(a).

Referring to FIG. 9, the silicon substrate 110 is dry-etched to form a first flat silicon layer 112.

Figure 10:
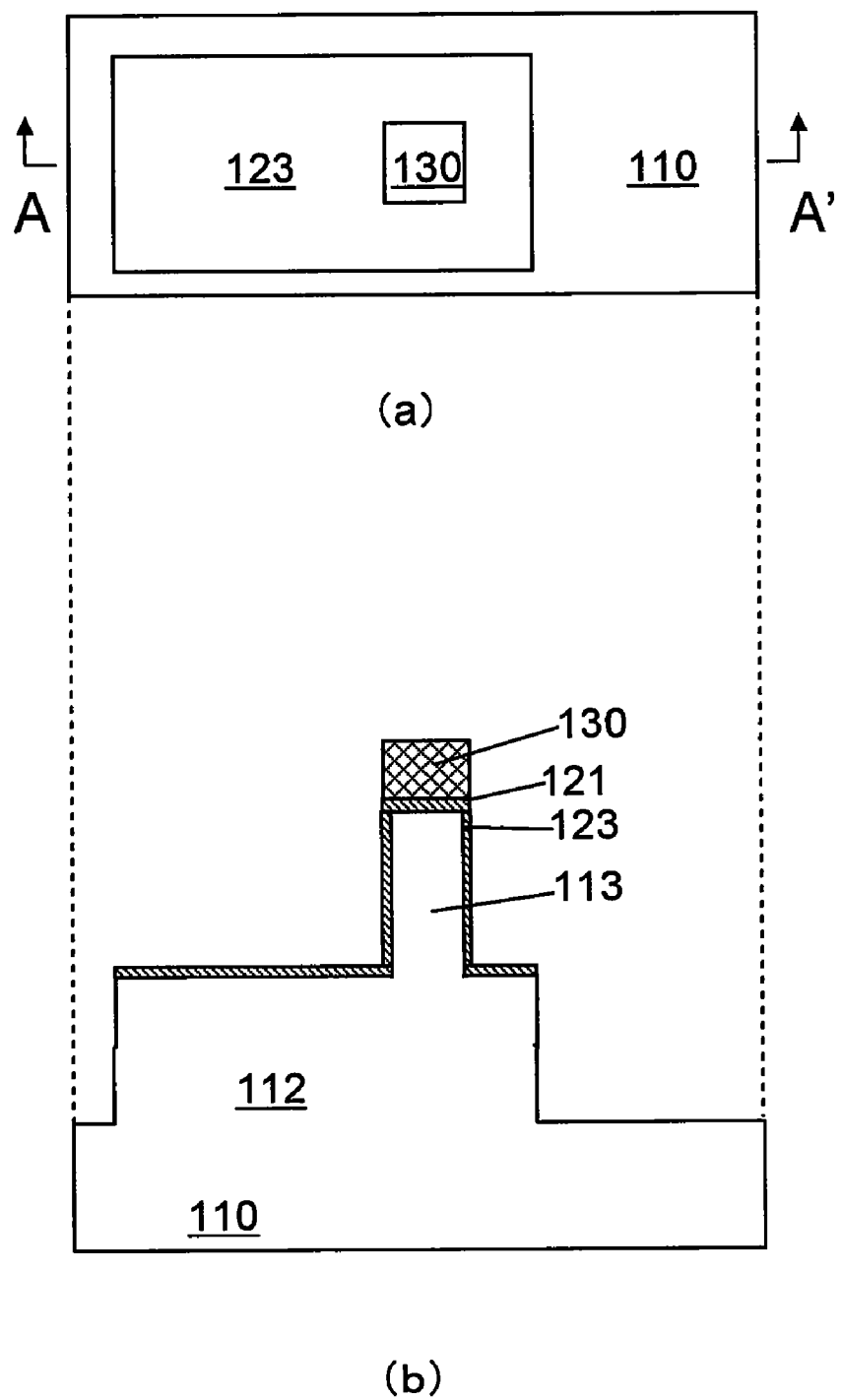
FIG. 10(a) is a top plan view showing one step in the method.
FIG. 10(b) is a sectional view taken along the line A-A' in FIG. 10(a).

Referring to FIG. 10, the second resist 150 is removed.

Figure 11:
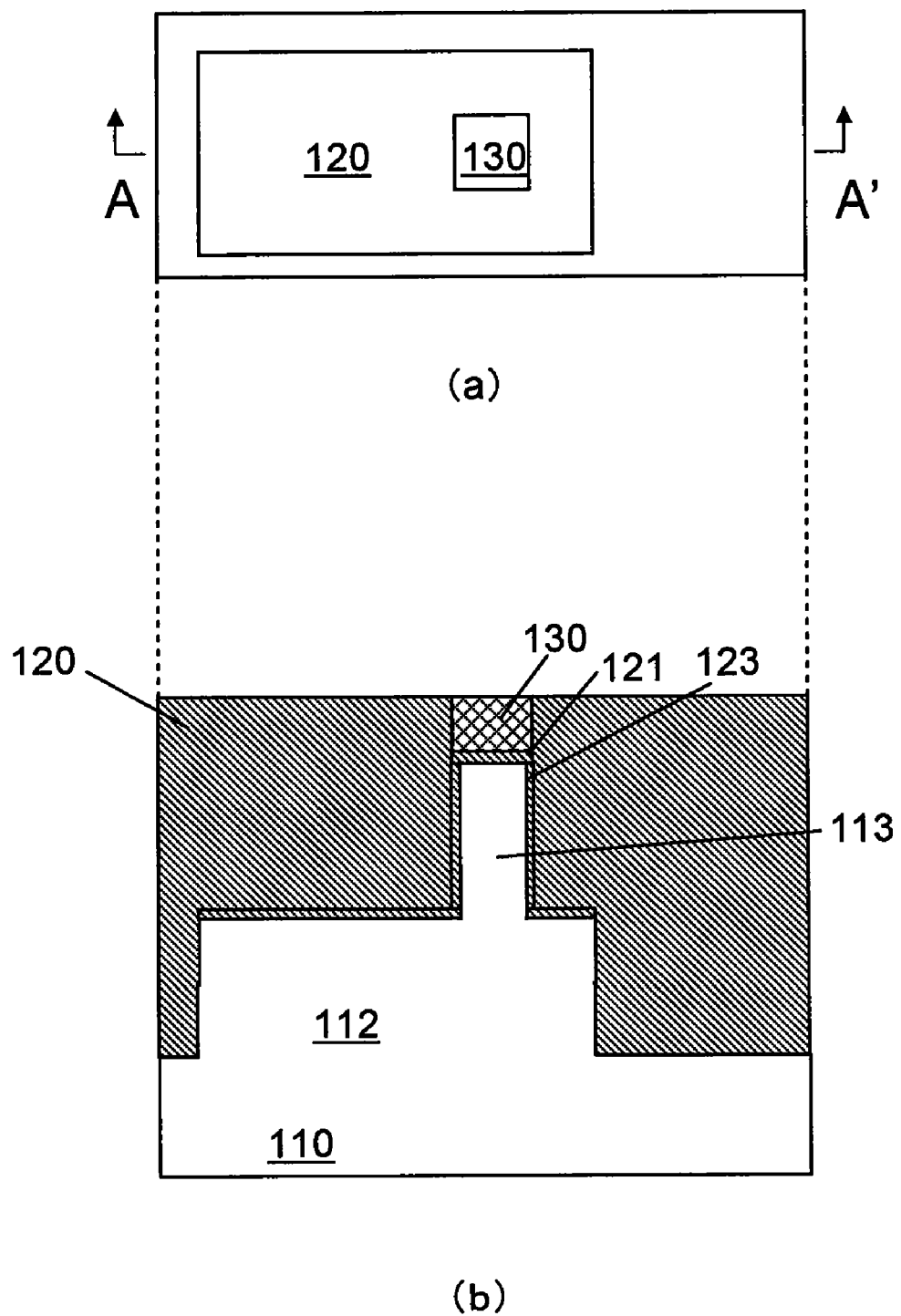
FIG. 11(a) is a top plan view showing one step in the method.
FIG. 11(b) is a sectional view taken along the line A-A' in FIG. 11(a).

Referring to FIG. 11, a filling oxide film 120 is deposited on the in-process structure in FIG. 10, and flattened to have a surface flush with an upper surface of the first nitride film 130.

Figure 12:
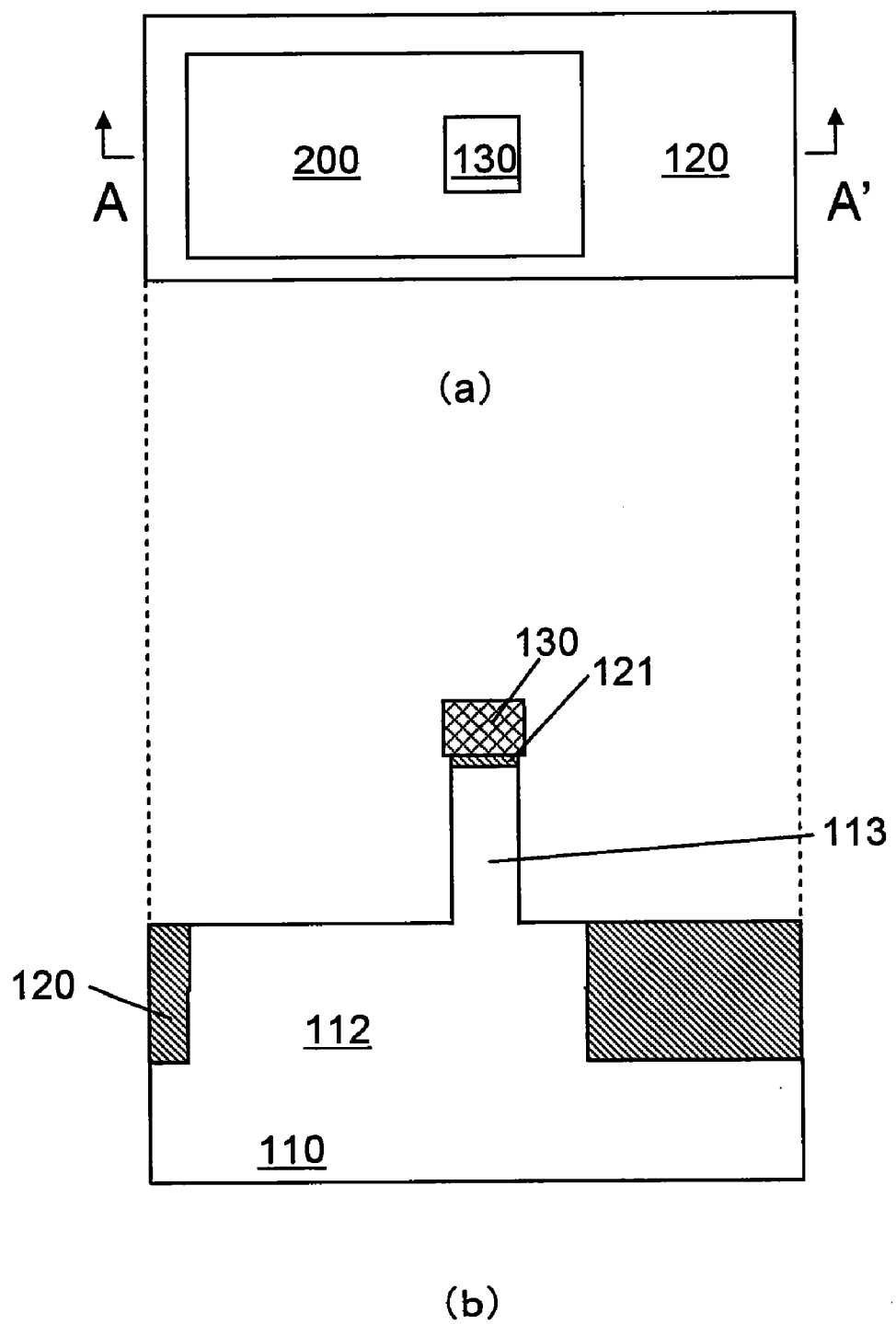
FIG. 12(a) is a top plan view showing one step in the method.
FIG. 12(b) is a sectional view taken along the line A-A' in FIG. 12(a).

Referring to FIG. 12, the filling oxide film 120 is etched in such a manner as to allow a surface of an upper portion of the first flat silicon layer 112 to be exposed.

Figure 13:
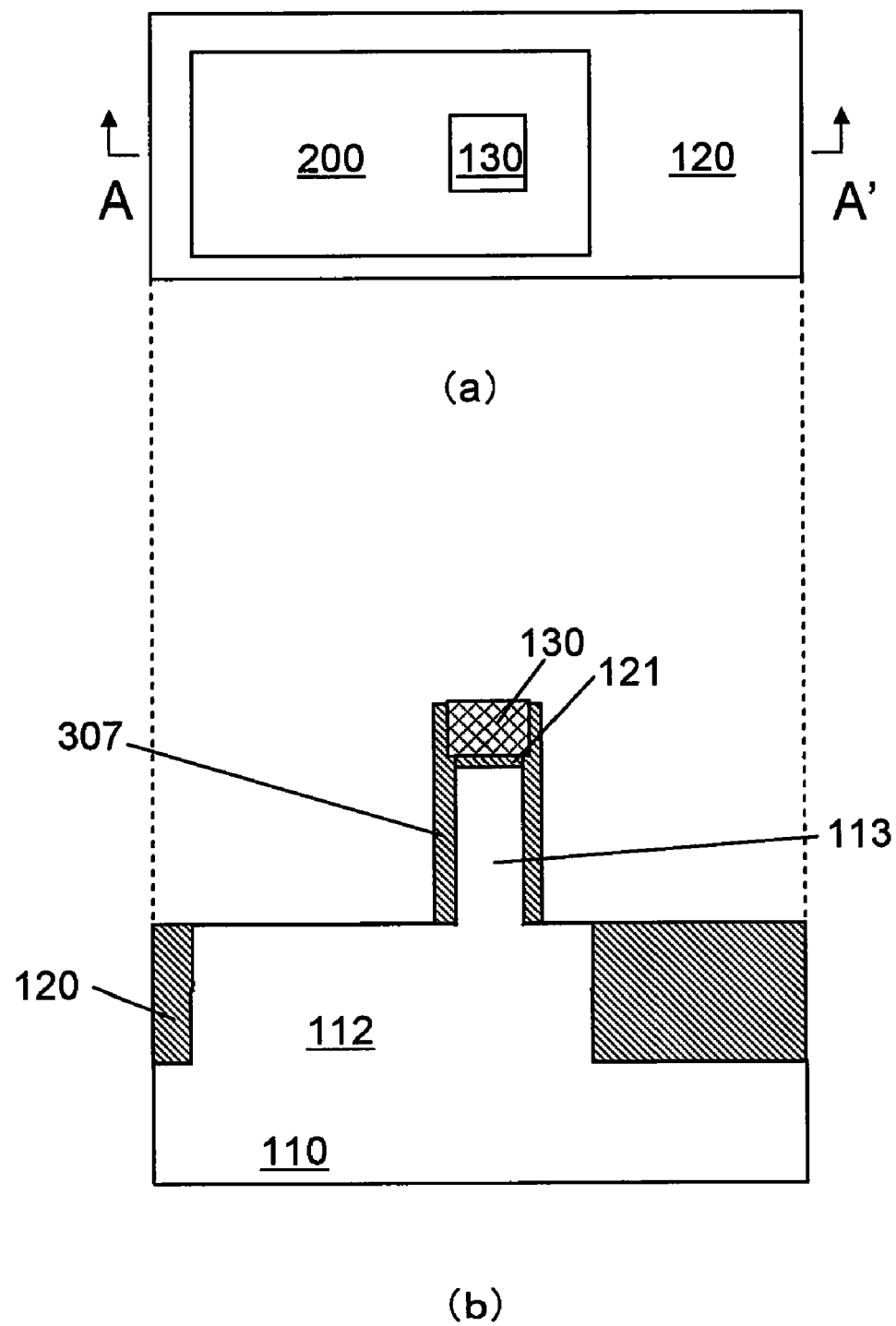
FIG. 13(a) is a top plan view showing one step in the method.
FIG. 13(b) is a sectional view taken along the line A-A' in FIG. 13(a).
Figure 14:
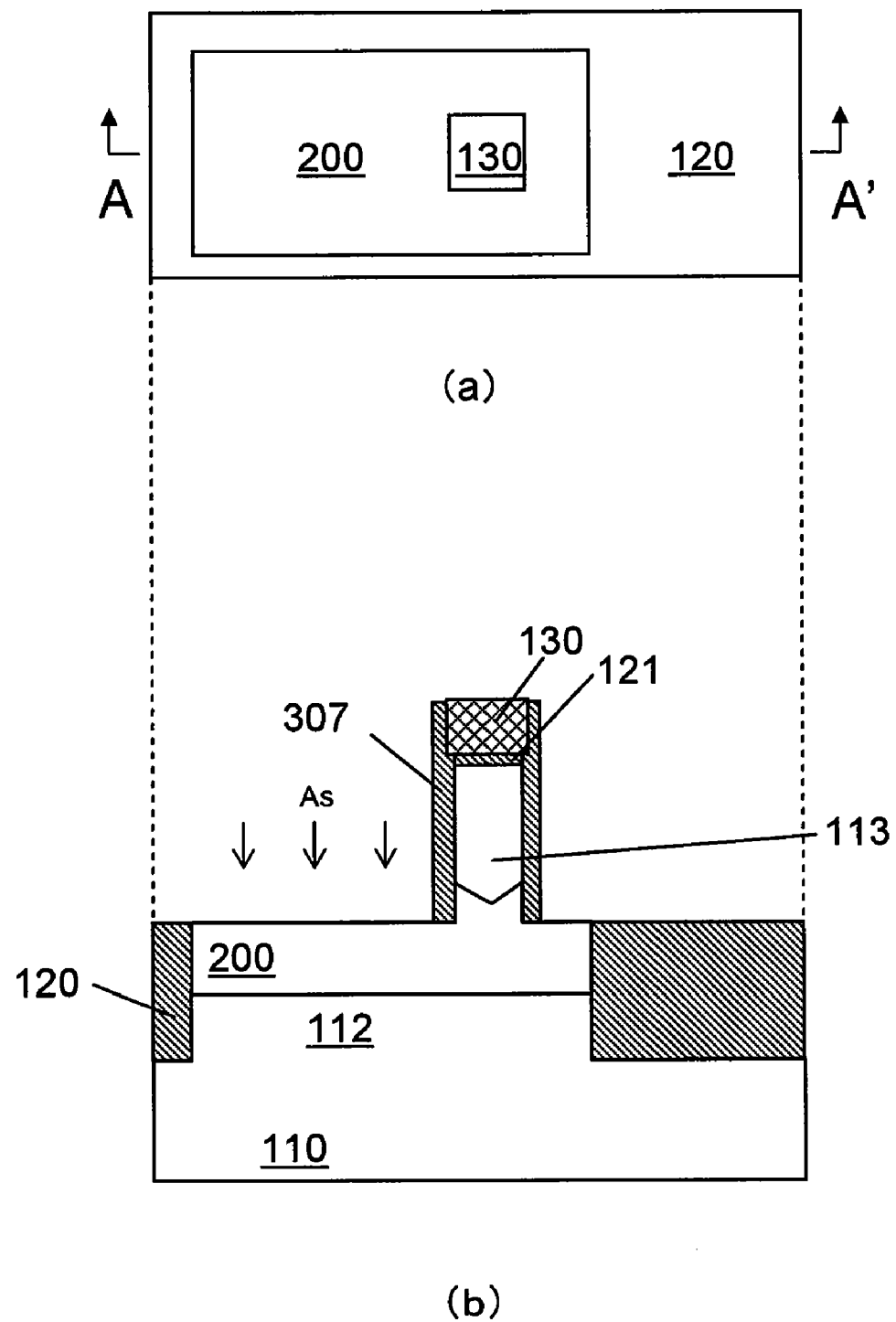
FIG. 14(a) is a top plan view showing one step in the method.
FIG. 14(b) is a sectional view taken along the line A-A' in FIG. 14(a).

Referring to FIG. 13, offset spacer 307 is formed on a sidewall of the first columnar silicon layer 113 to protect the first columnar silicon layer in source implant. Referring to FIG. 14, an impurity, such as arsenic (As) or phosphorus (P), is injected into the first flat silicon layer 112 to form a source diffusion layer 200 which is a silicon layer of a second conductive type, in a lower portion of the first columnar silicon layer 113 and an upper portion (or an entirety) of the first flat silicon layer 112.

In this step, the first nitride film 130 formed above the first columnar silicon layer 113 prevents the impurity from being injected into the upper portion of the first columnar silicon layer 113. The impurity injection for the source diffusion layer 200 to be formed in the upper portion (or an entirety) of the first flat silicon layer 112, and the impurity injection for the drain diffusion layer 201 to be formed in the upper portion of the first columnar silicon layer 113, are performed separately, so that conditions of the respective impurity injections can be easily optimized to restrain a short channel effect so as to reduce a leakage current.

Figure 15:
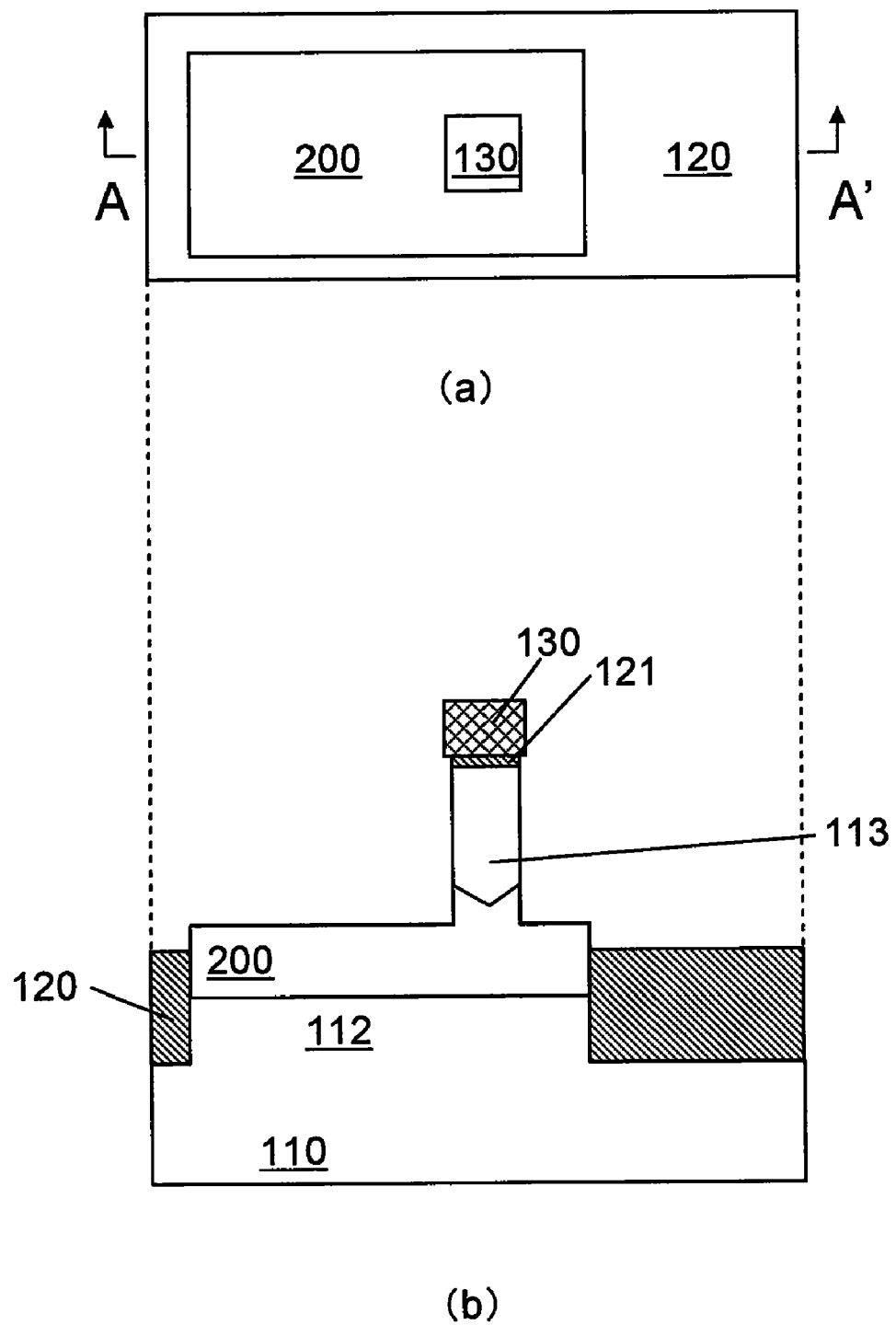
FIG. 15 (a) is a top plan view showing one step in the method.

Referring to FIG. 15, offset spacer 307 is etched.

Figure 16:
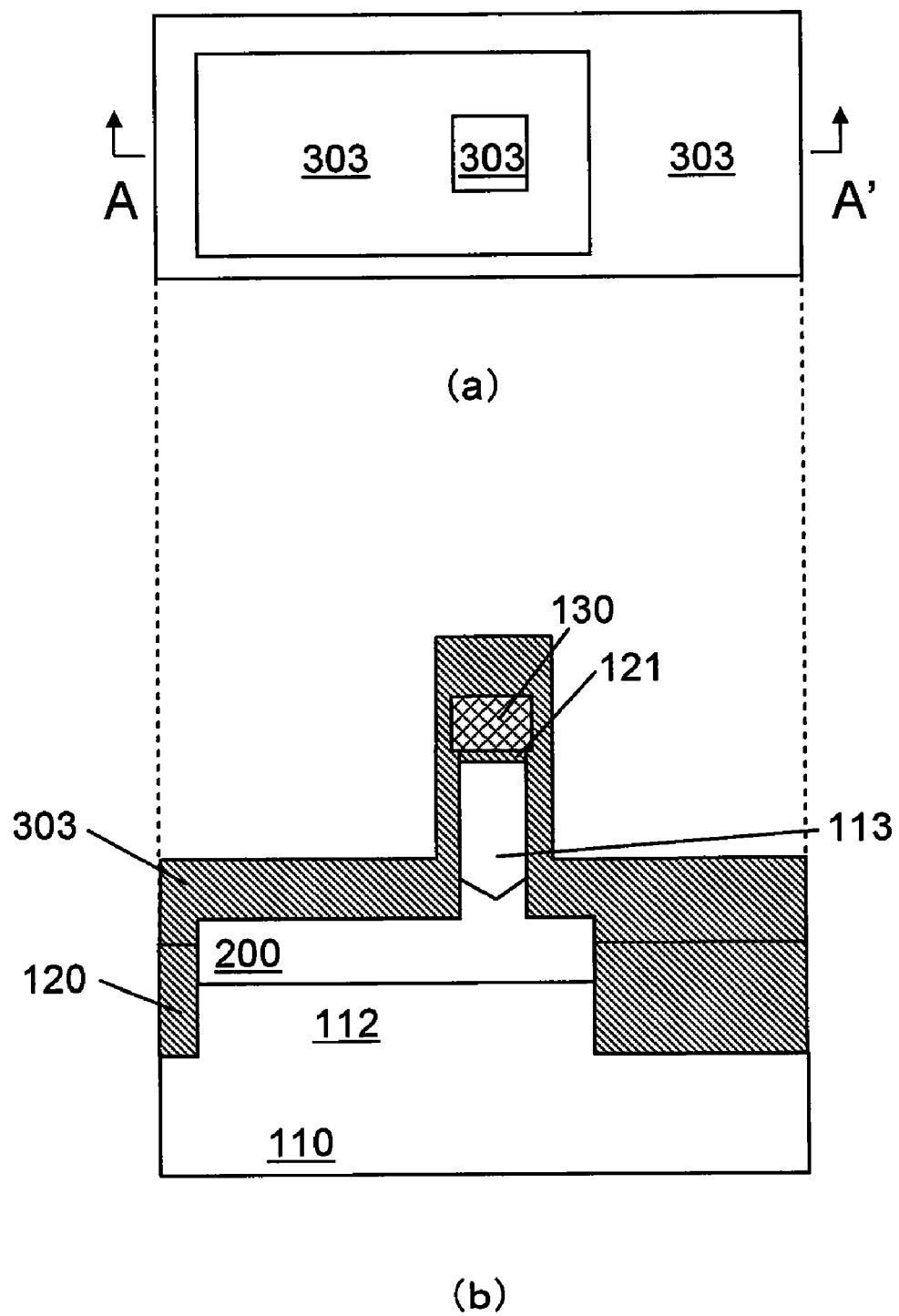
FIG. 16(a) is a top plan view showing one step in the method.
FIG. 16(b) is a sectional view taken along the line A-A' in FIG. 16(a).

Referring to FIG. 16, a first insulating film material 303, such as an oxide film, is deposited on the in-process structure in FIG. 15. Specifically, the first insulating film material 303 is formed around a lower sidewall of the first columnar silicon layer 113 and above the source diffusion layer 200 and the first columnar silicon layer 113, at a relatively large thickness, and formed around an intermediate/upper sidewall of the first columnar silicon layer 113 at a relatively small thickness.

Figure 17:
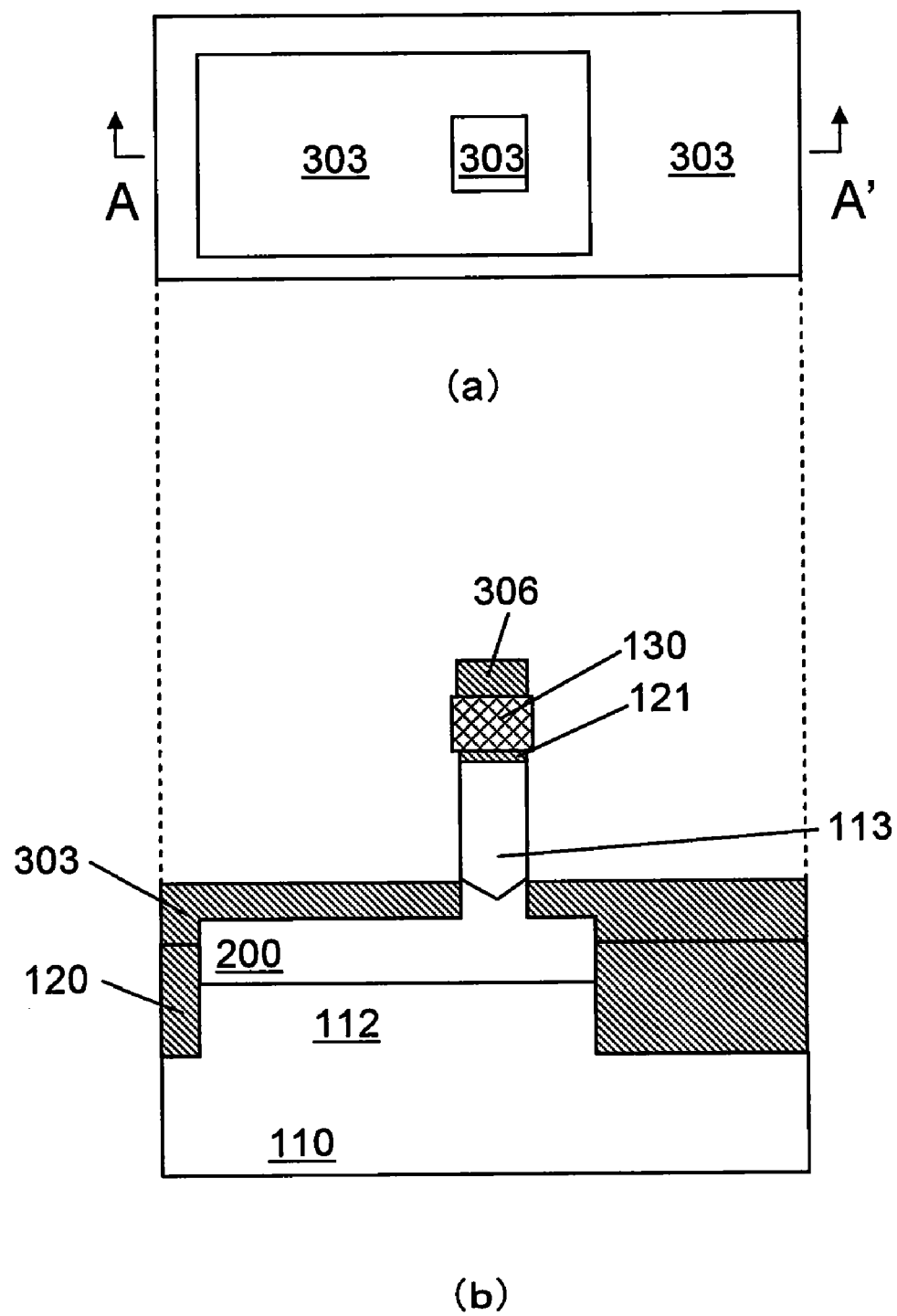
FIG. 17(a) is a top plan view showing one step in the method.
FIG. 17(b) is a sectional view taken along the line A-A' in FIG. 17(a).

Referring to FIG. 17, the first insulating film material 303 around the intermediate/upper sidewall of the first columnar silicon layer 113 is etched. Preferably, this etching process is an isotropic etching process. The first insulating film material 303 is formed around the lower sidewall of the first columnar silicon layer 113 and above the source diffusion layer 200 and the first columnar silicon layer 113, at a relatively large thickness, and formed around an intermediate/upper sidewall of the first columnar silicon layer 113 at a relatively small thickness, as mentioned above. Thus, even after the etching process, a part of the first insulating film material 303 remains around the lower sidewall of the first columnar silicon layer 113 and above the source diffusion layer 200 and the first columnar silicon layer 113 (a part of the first insulating film material 303 remaining above the first columnar silicon layer 113 will hereinafter be referred to as "insulating film 306"). The first insulating film material 303 remaining around the lower sidewall of the first columnar silicon layer 113 and above the source diffusion layer 200 will make up a "first insulating film 303 having a thickness larger than that of an after-mentioned gate insulating film 124", to be formed between the source diffusion layer 200 and the subsequently-formed gate electrode 141. This first insulating film 303 can reduce a parasitic capacitance between the source diffusion layer 200 and the subsequently-formed gate electrode 141.

The first insulating film 303 to be formed between the first flat silicon layer 112 (source diffusion layer 200) and the subsequently-formed gate electrode 141 may be formed by depositing an insulating film on the in-process structure in FIG. 15, and flattening the insulating film to have a surface flush with the upper surface of the first nitride film 130, and etching the insulating film.

Figure 18:
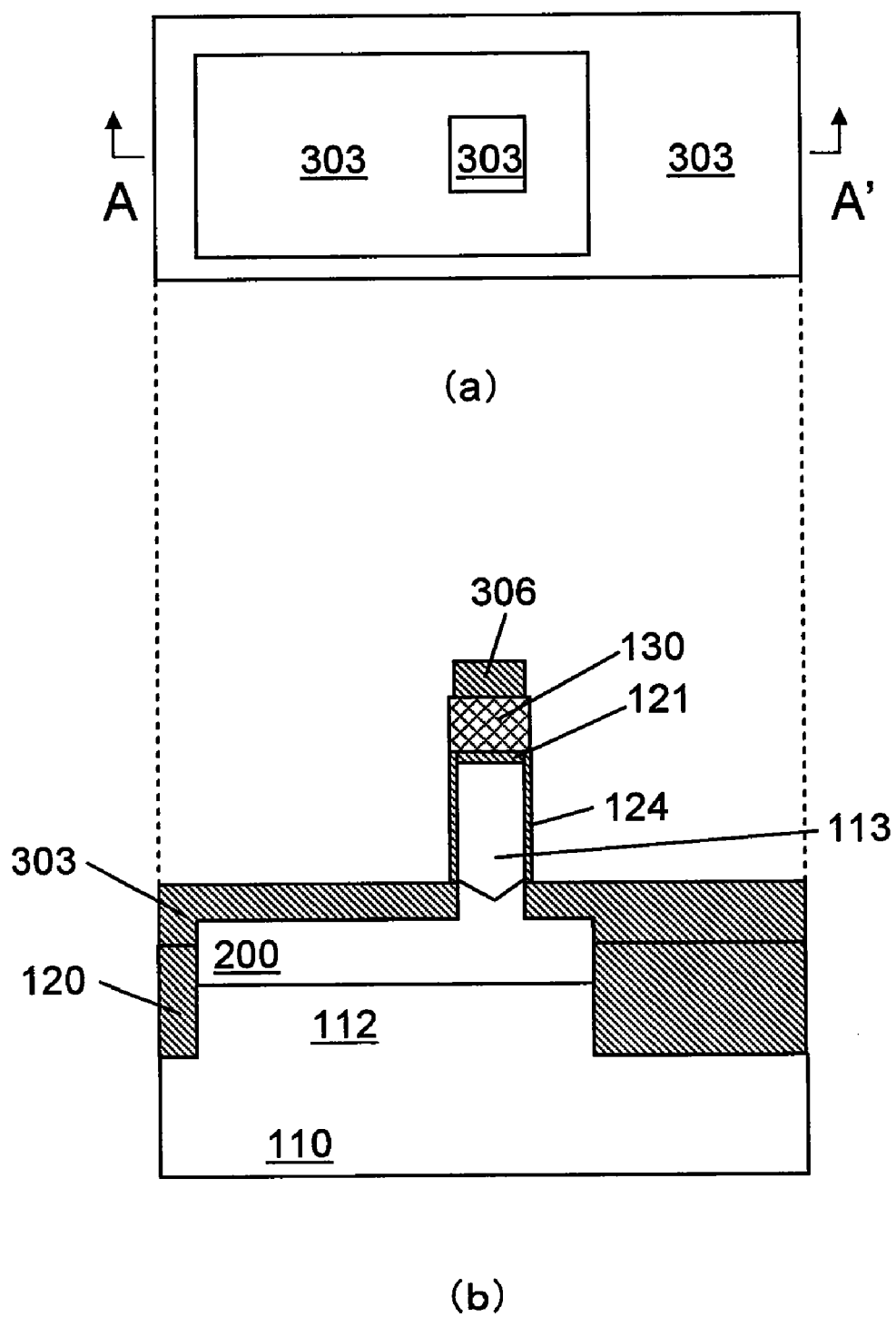
FIG. 18(a) is a top plan view showing one step in the method.
FIG. 18(b) is a sectional view taken along the line A-A' in FIG. 18(a).
Figure 19:
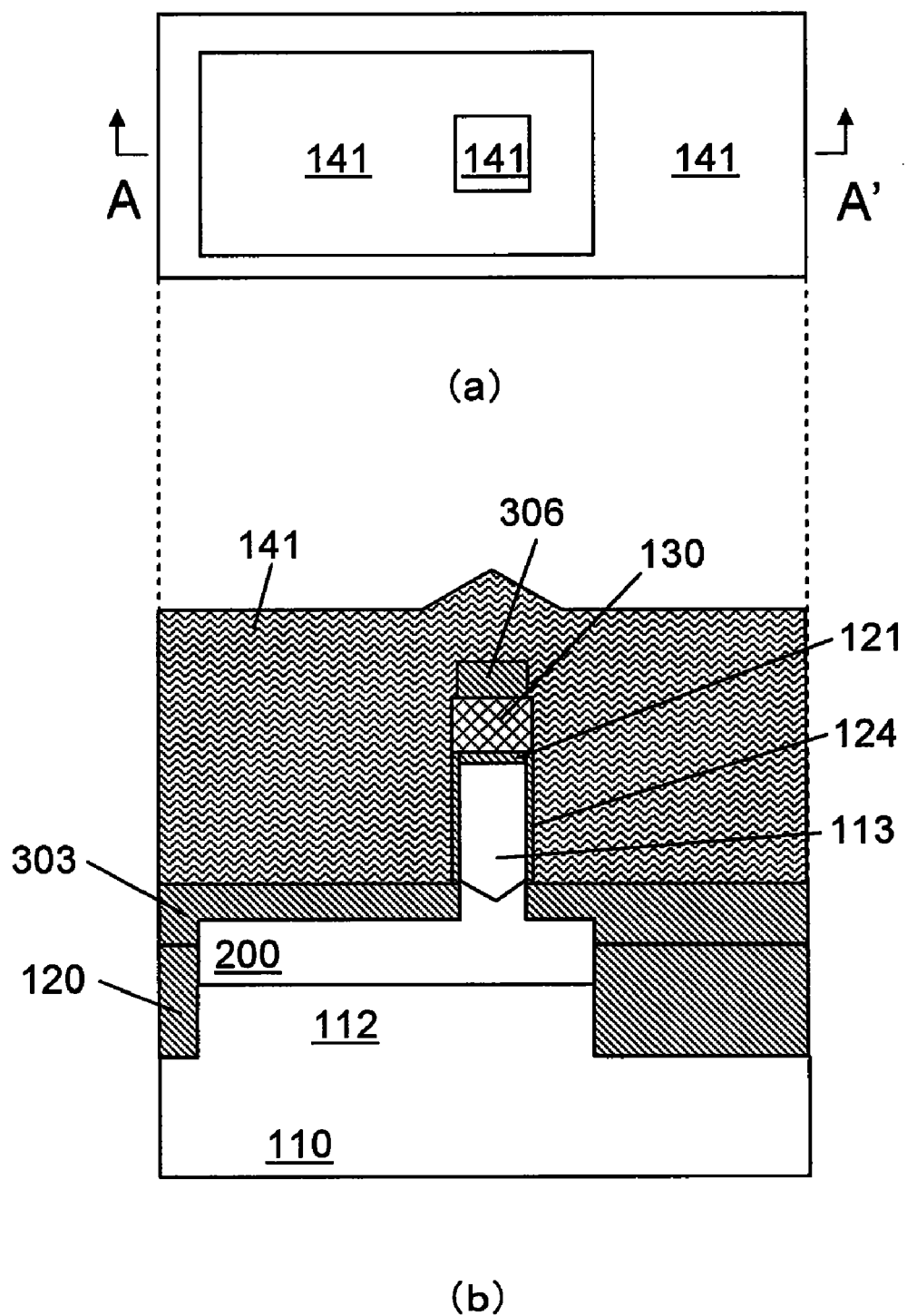
FIG. 19(*a*) is a top plan view showing one step in the method.

Referring to FIG. 18, a gate insulating film 124, such as an oxide film or a silicon oxynitride film, is formed on the sidewall of the pad oxide film 121 and the intermediate/upper sidewall of the first columnar silicon layer 113. Referring to FIG. 19, a second amorphous silicon or polysilicon film 141 which is a gate conductive film, is formed to allow the first columnar silicon layer 113 to be embedded therein.

Figure 20:
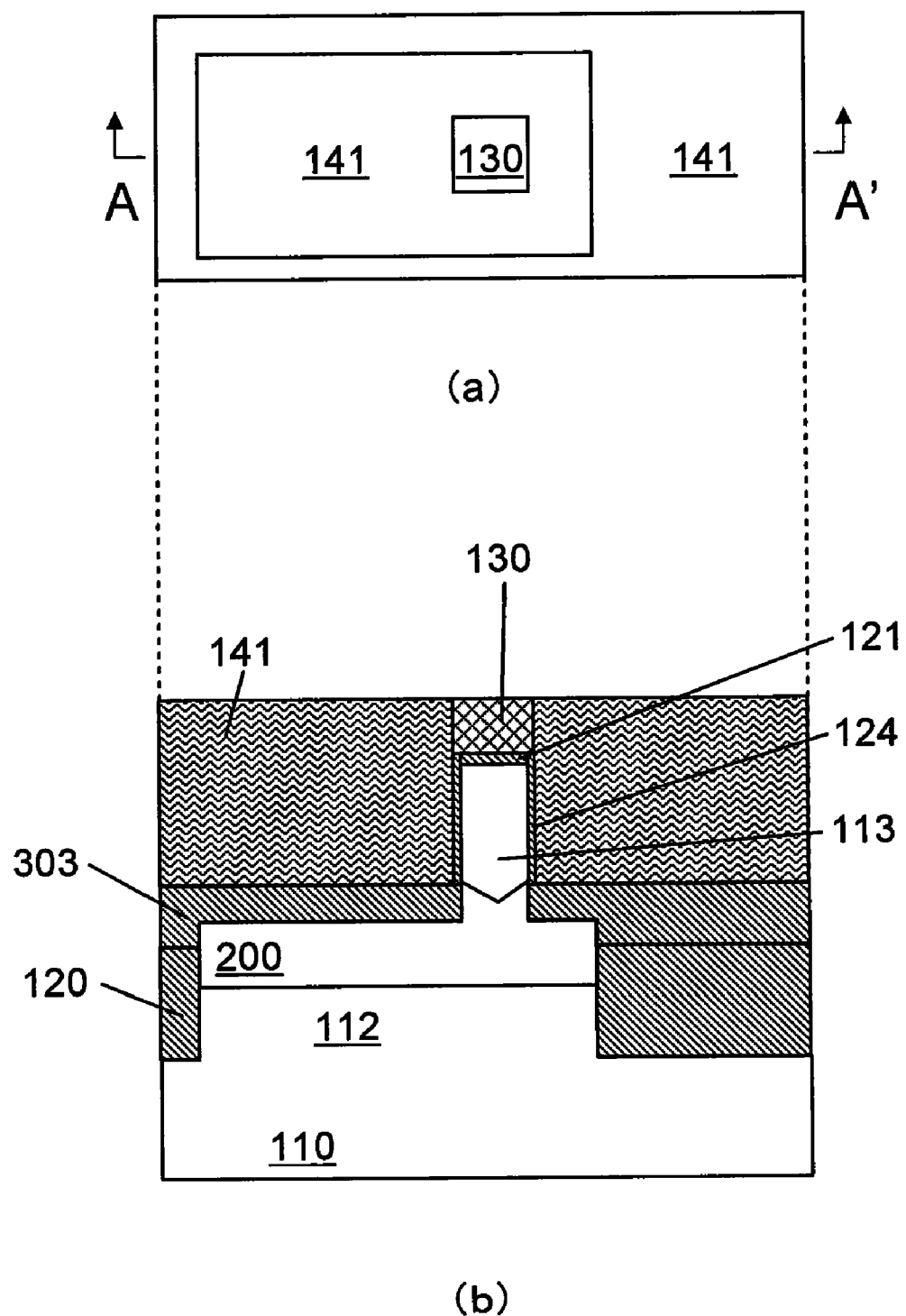
FIG. 20(*a*) is a top plan view showing one step in the method.

Referring to FIG. 20, the second amorphous silicon or polysilicon film 141 is polished by a chemical mechanical polishing (CMP) process to have a flattened upper surface flush with the upper surface of the first nitride film 130. In the CMP process, a polishing amount can be controlled with enhanced reproducibility by using, as a CMP stopper, the first nitride film 130 which is the first hard mask.

Figure 21:
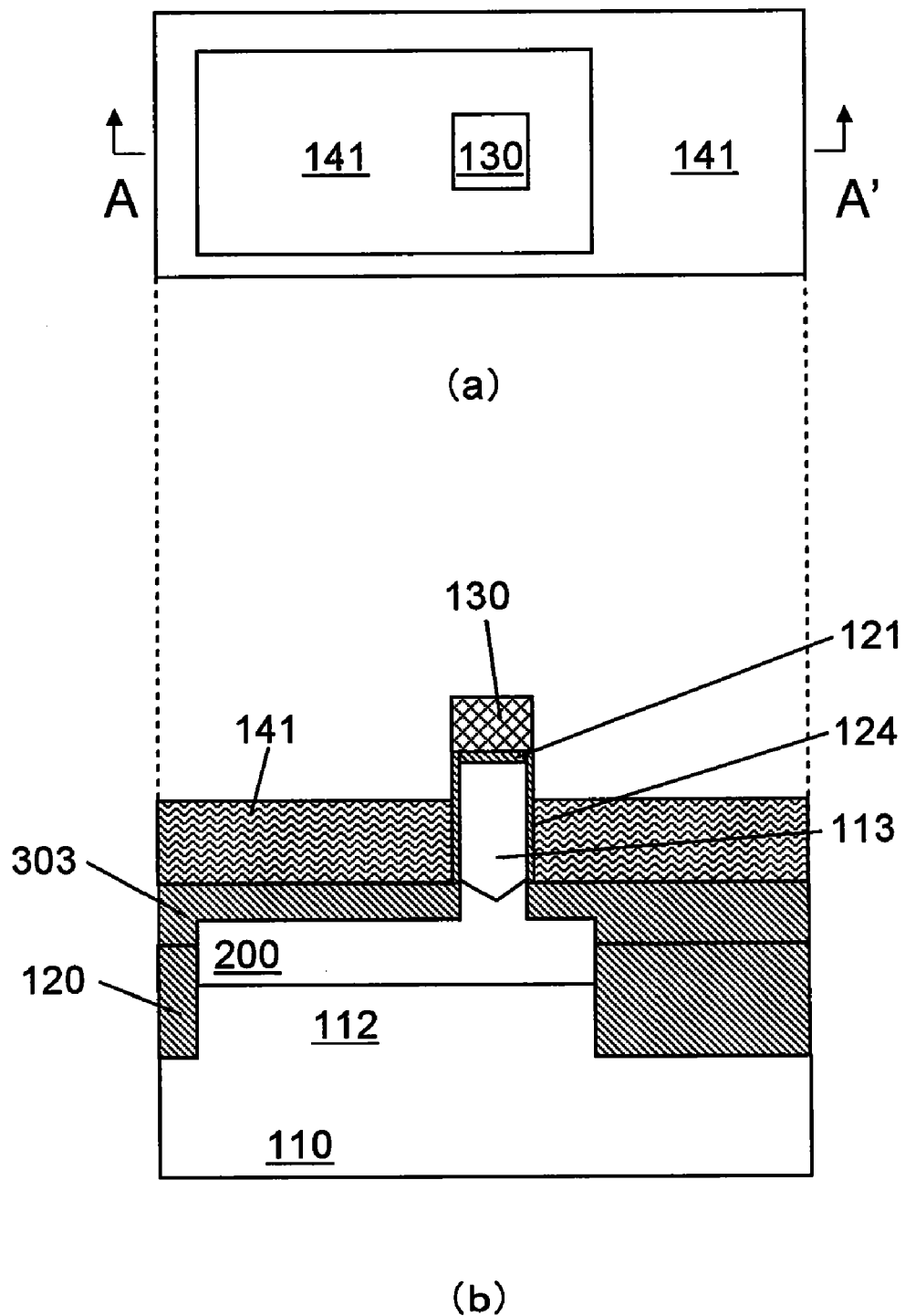
FIG. 21(*a*) is a top plan view showing one step in the method.

Referring to FIG. 21, the second amorphous silicon or polysilicon film 141 which is the gate conductive film, is etched back to determine a gate length.

Figure 22:
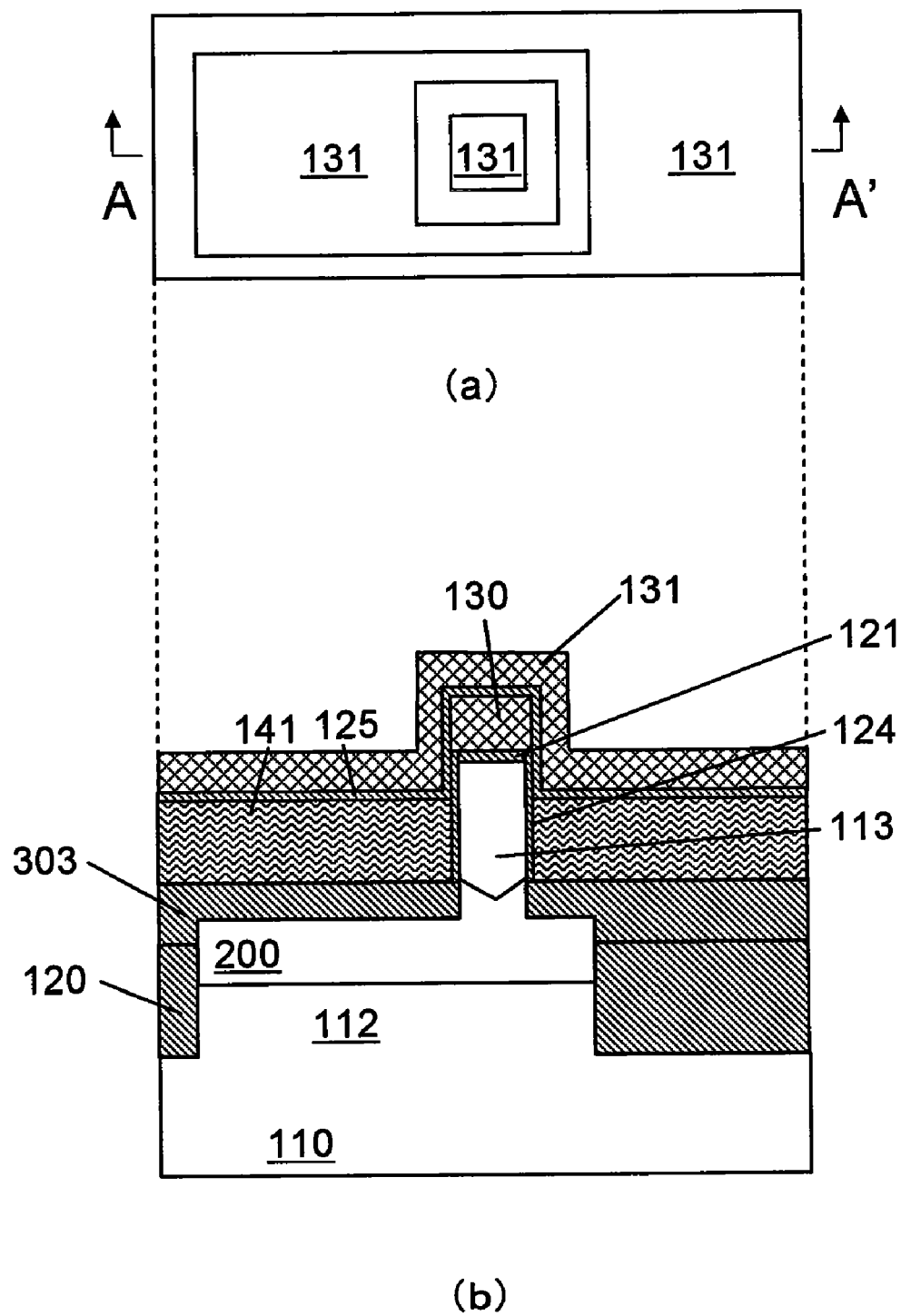
FIG. 22(*a*) is a top plan view showing one step in the method.

Referring to FIG. 22, a first oxide film 125 is deposited on the in-process structure in FIG. 21, and a second nitride film 131 is deposited on the first oxide film 125. The first oxide film 125 will protect an upper surface of the subsequently-formed gate electrode 141 from a wet etching or dry etching process to be performed in a subsequent step, so as to suppress a change in the gate length, i.e., a variation in the gate length, and damage of the gate insulating film 124 from the upper surface of the subsequently-formed gate electrode 141.

Figure 23:
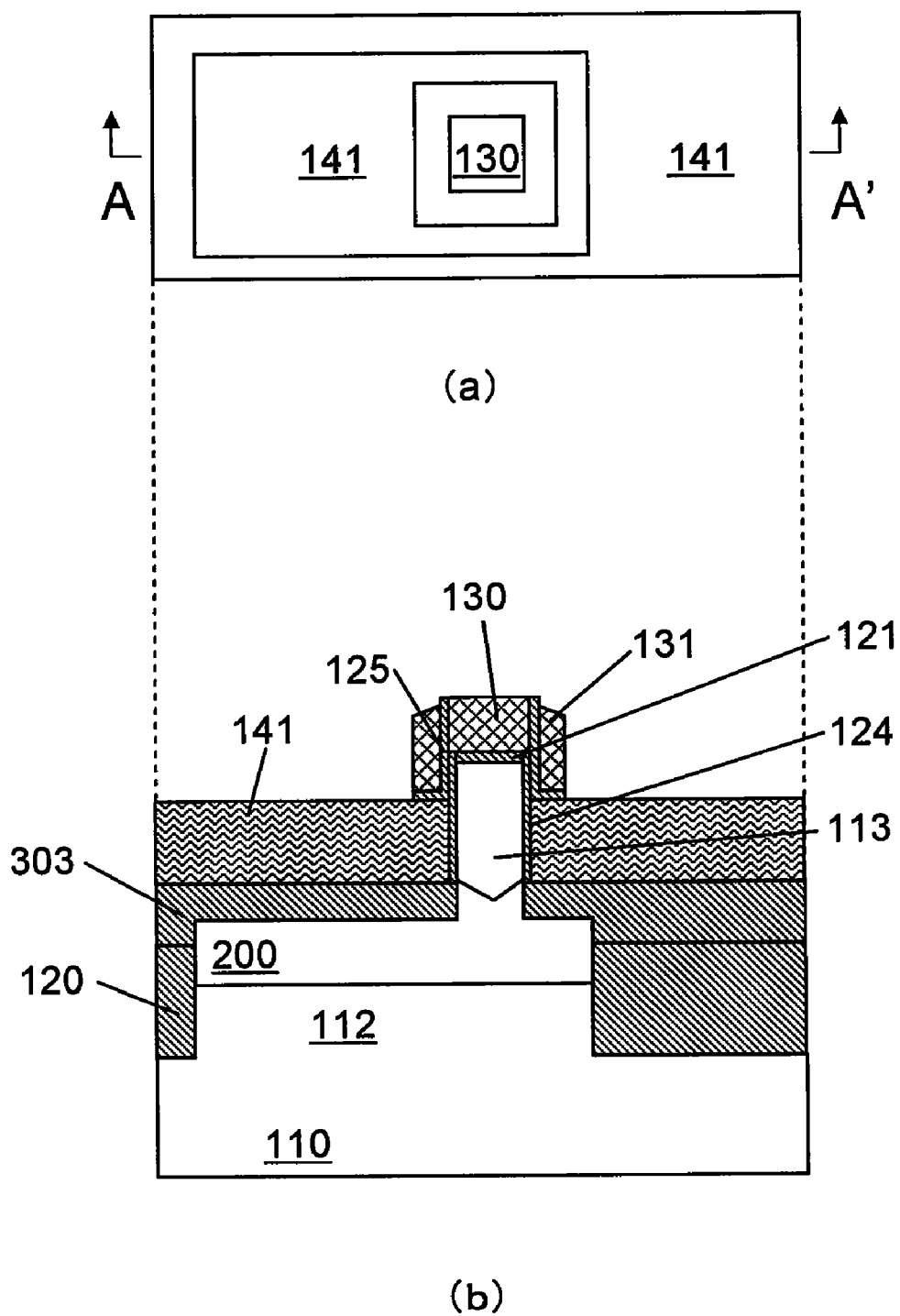
FIG. 23(*a*) is a top plan view showing one step in the method.

Referring to FIG. 23, the second nitride film 131 is etched back to form a third insulating film sidewall. In this process, the first oxide film 125 is also etched. A thickness of the third insulating film sidewall will determine a thickness of a subsequently-formed gate electrode body 141a. Thus, the subsequently-formed gate electrode body 141a can have a desired thickness by adjusting the thickness of the second nitride film 131 and conditions of the etching back process.

Figure 24:
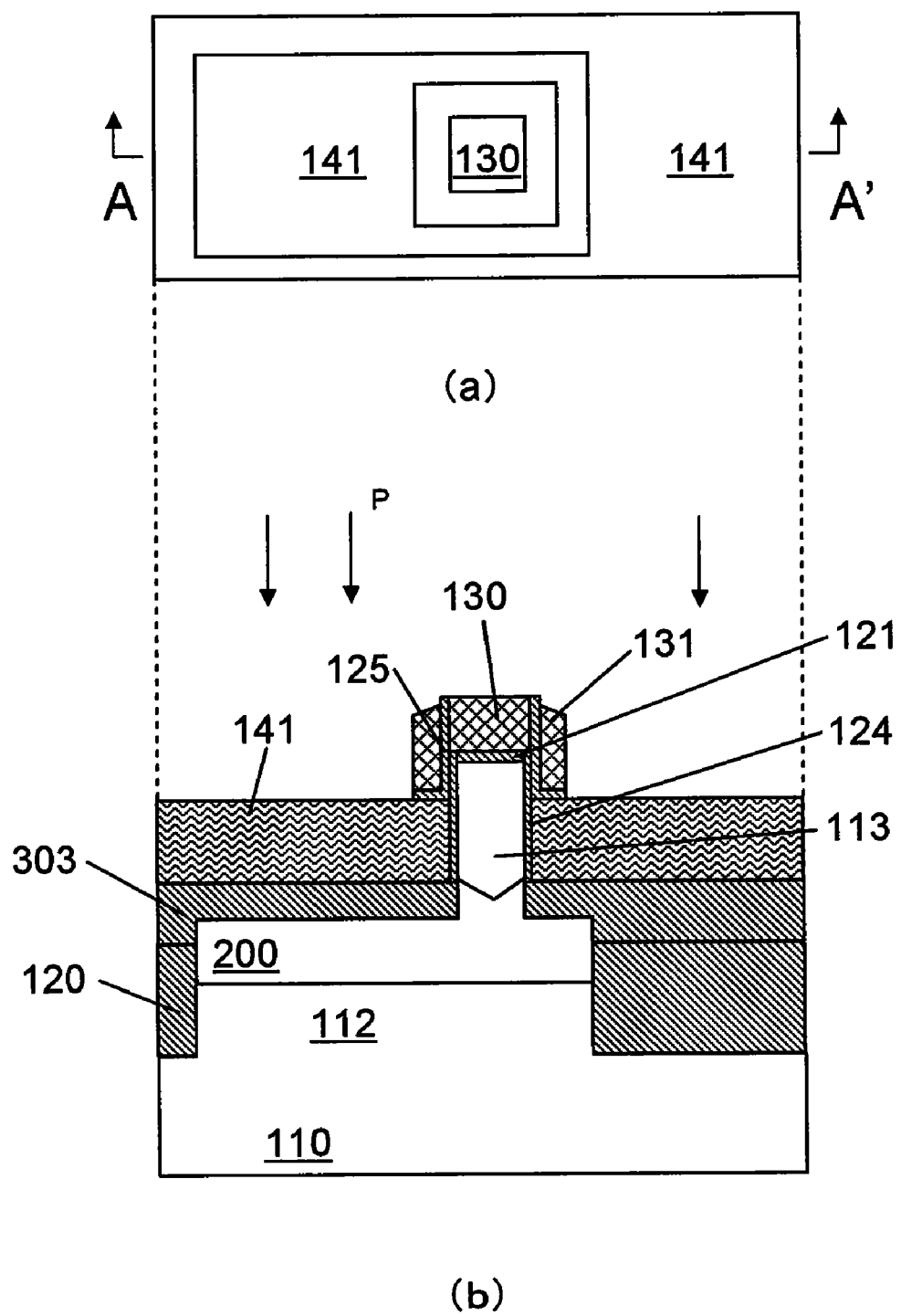
FIG. 24(*a*) is a top plan view showing one step in the method.

Referring to FIG. 24, an impurity, such as phosphorus (P), is injected into the second amorphous silicon or polysilicon film 141 which is the gate conductive film.

Figure 25:
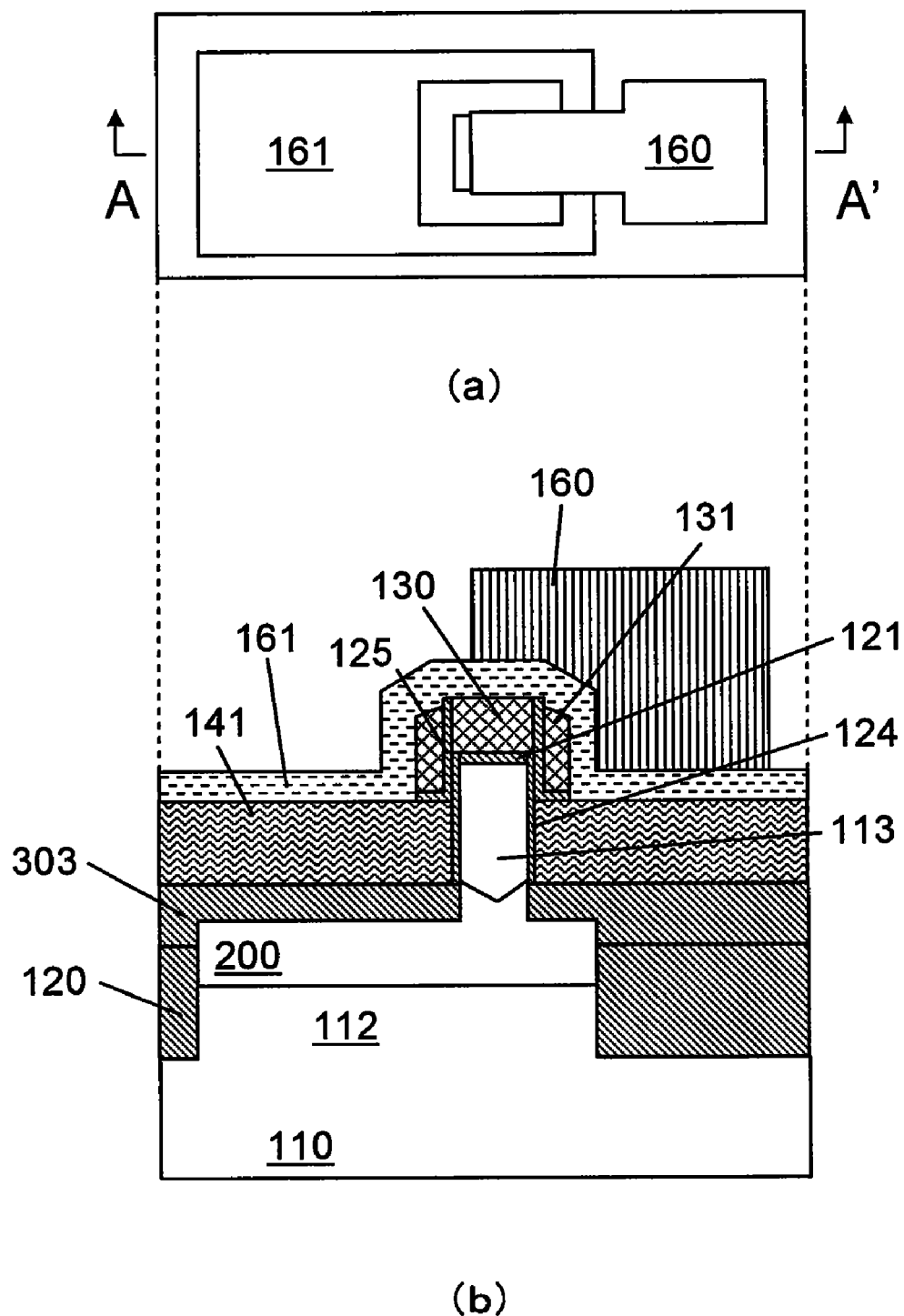
FIG. 25(*a*) is a top plan view showing one step in the method.

Referring to FIG. 25, a bottom anti-reflective coating (BARC) layer 161 is applied onto the in-process structure in FIG. 24. Then, a resist is applied onto the BARC layer 161, and a gate wiring pattern is transferred to the resist through lithography to leave a third resist 160 corresponding to the gate wiring pattern.

Figure 26:
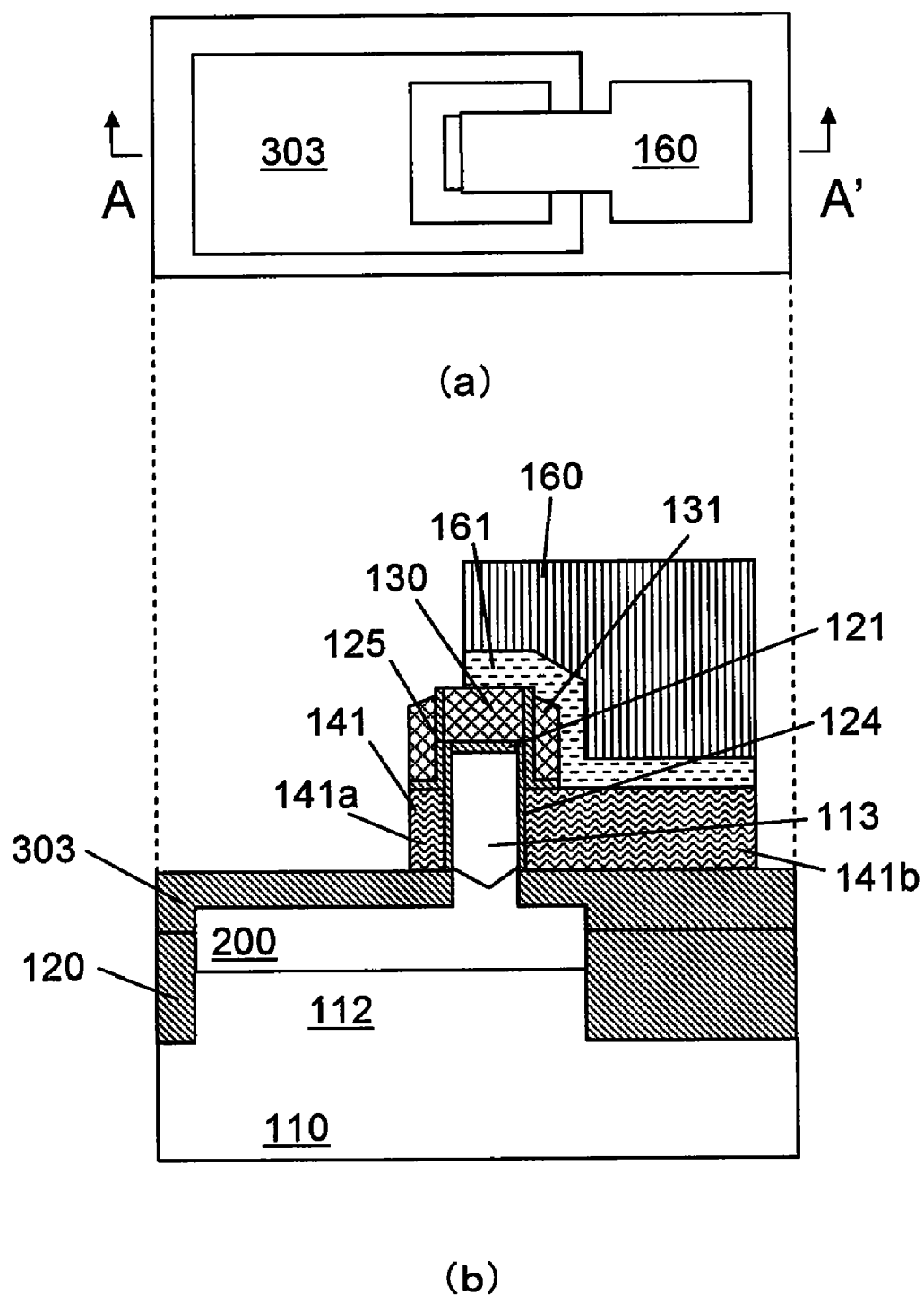
FIG. 26(*a*) is a top plan view showing one step in the method.

Referring to FIG. 26, the BARC layer 161, and the second amorphous silicon or polysilicon film 141 which is the gate conductive film, are etched using the third resist 160 as a mask to form a gate electrode 141 consisting of a gate electrode body 141a and a gate wiring 141b.

Figure 27:
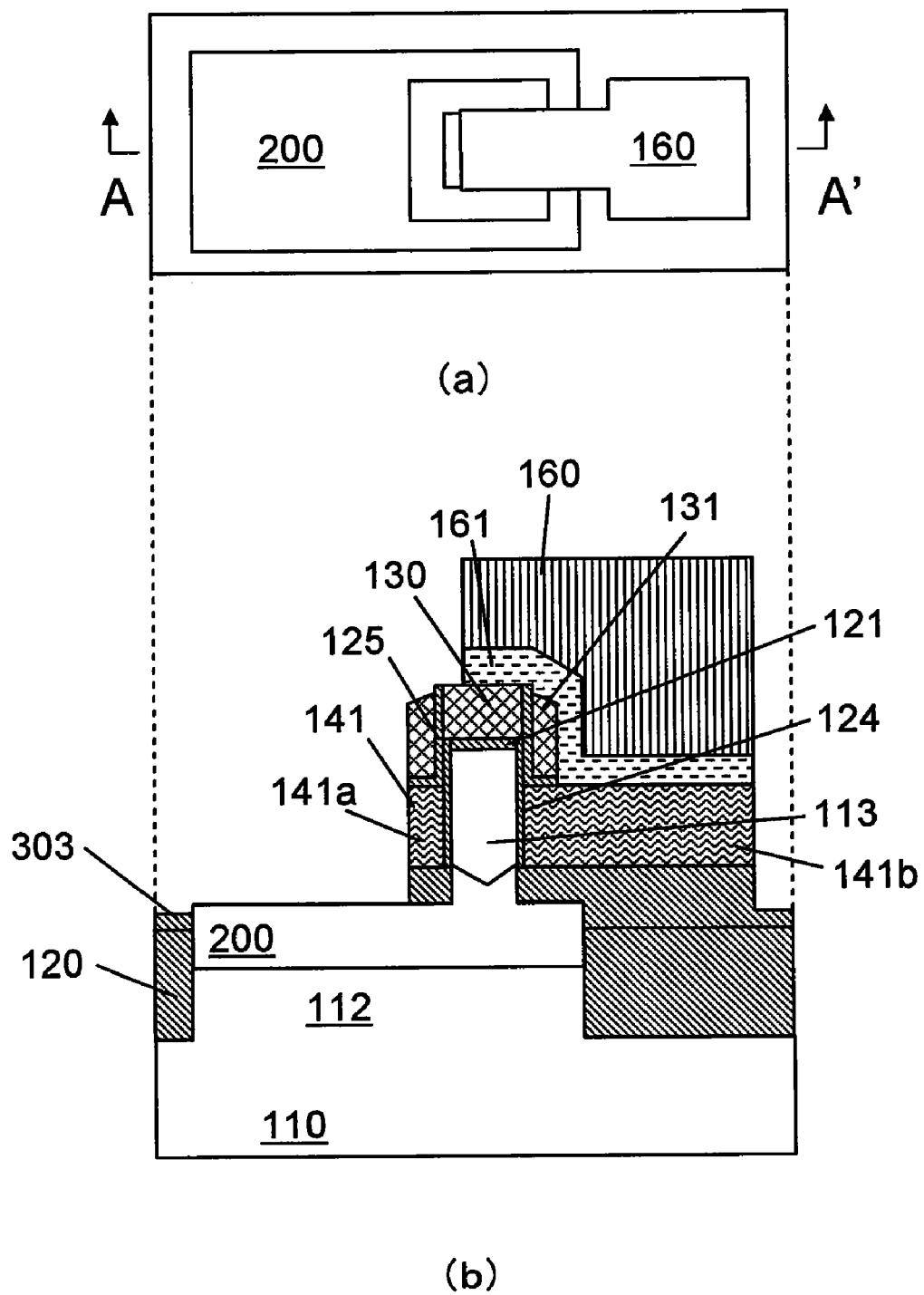
FIG. 27(*a*) is a top plan view showing one step in the method.

Referring to FIG. 27, the first insulating layer 303 is partly removed by a dry etching or wet etching process to allow the source diffusion layer 200 to be exposed.

Figure 28:
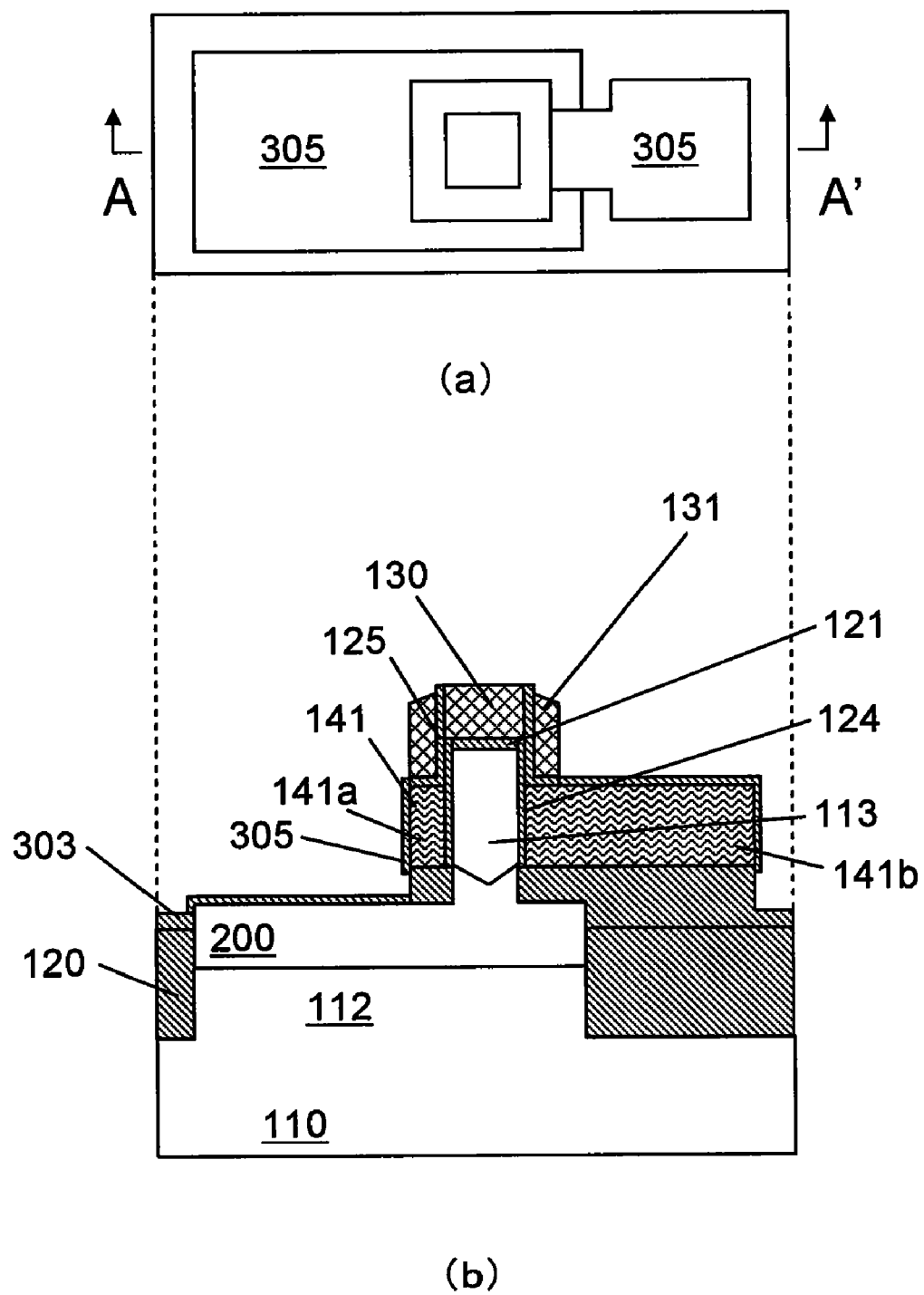
FIG. 28(*a*) is a top plan view showing one step in the method.

Referring to FIG. 28, the third resist 160 and the BARC layer 161 are removed and a fourth oxide layer 305 formed on an exposed surface of the gate electrode 141 and the source diffusion layer to protect the gate electrode 141 during a subsequent process of removing the first nitride film 130 and the second nitride film 131.

Figure 29:
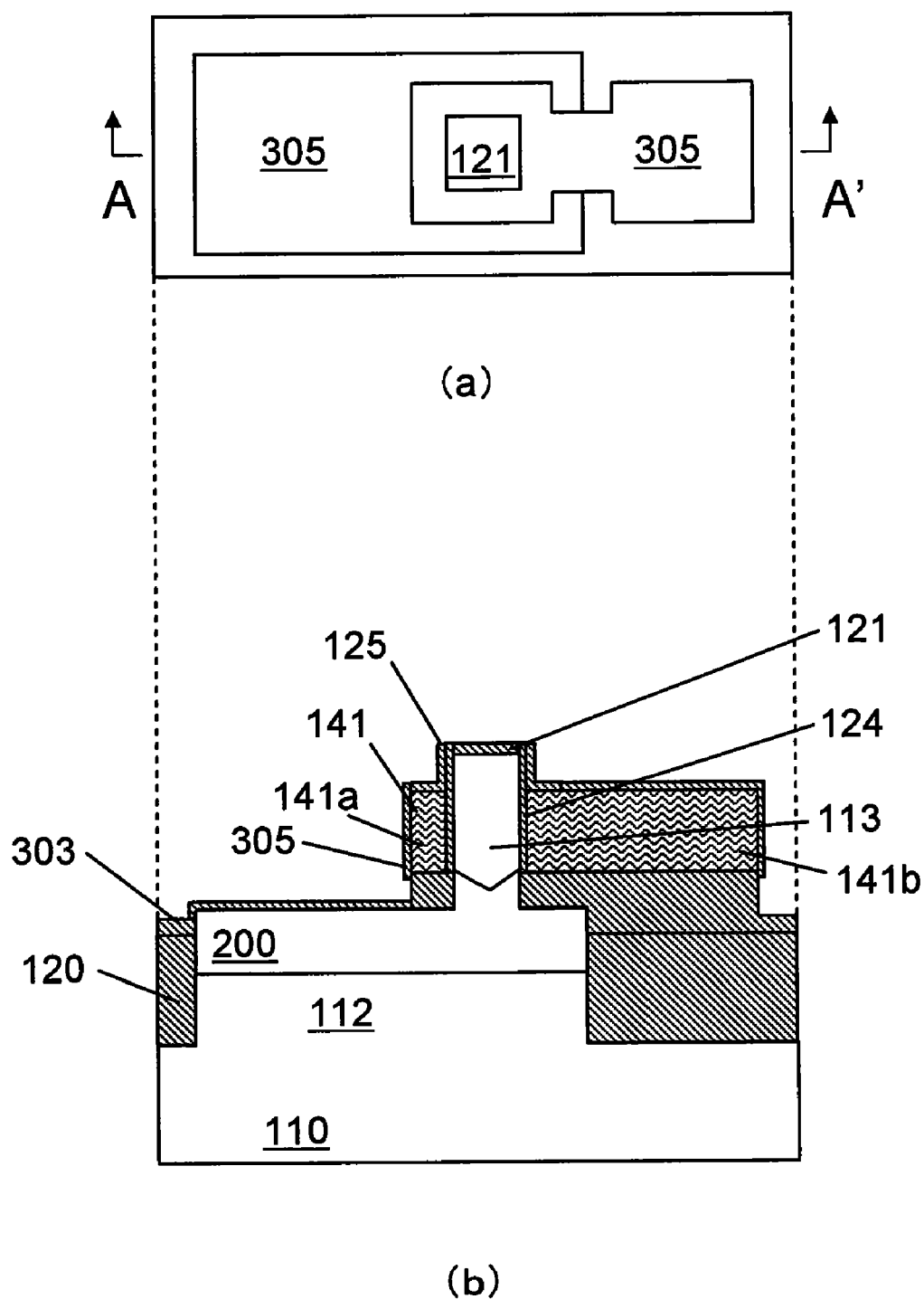
FIG. 29(*a*) is a top plan view showing one step in the method.

Referring to FIG. 29, the first nitride film 130 above the first columnar silicon layer 113 and the second nitride film 131 around the first columnar silicon layer 113 are removed by a dry etching or wet etching process.

Figure 30:
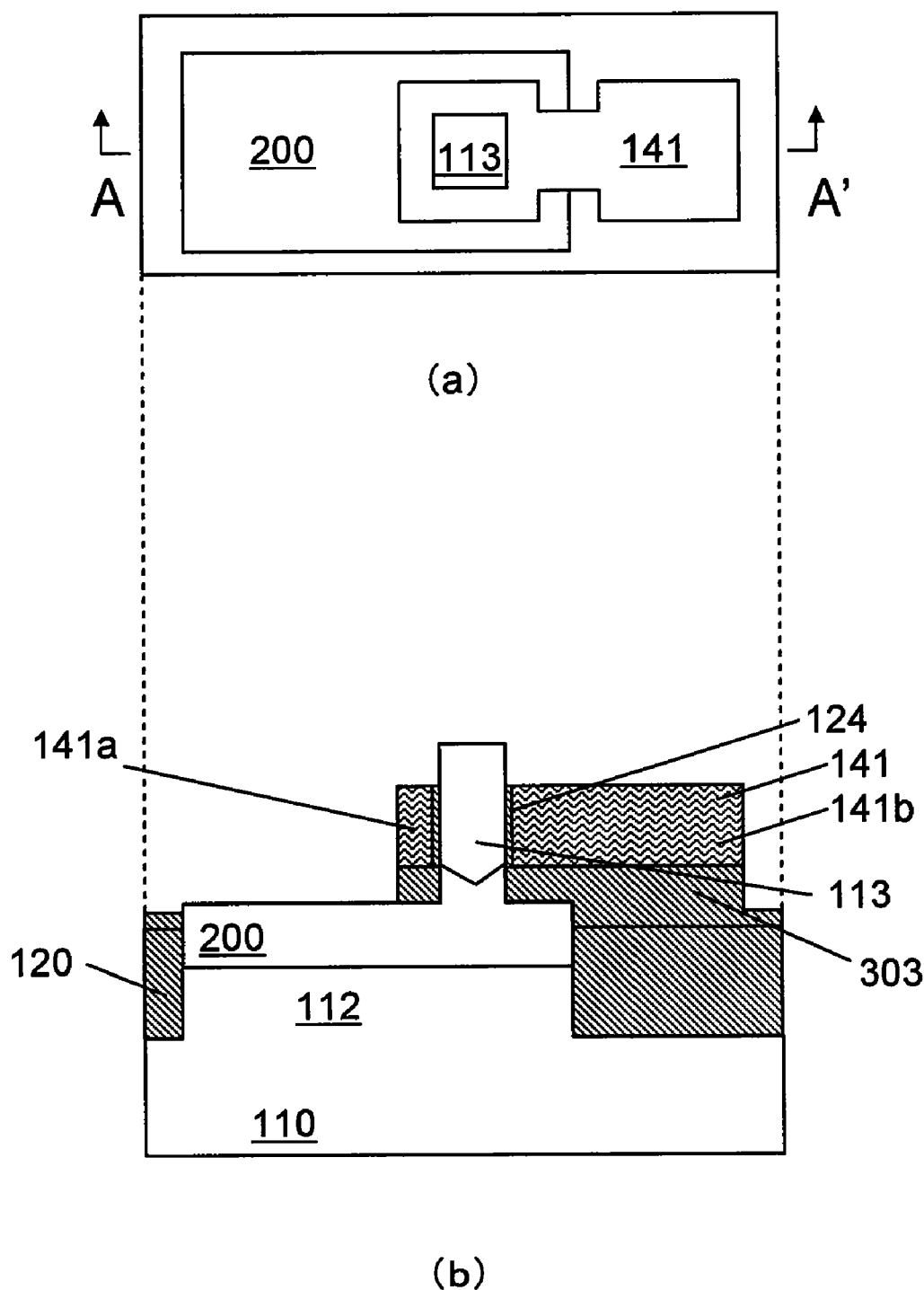
FIG. 30(*a*) is a top plan view showing one step in the method.

Referring to FIG. 30, the pad oxide film 121, the first oxide film 125 and the fourth oxide layer 305 are removed.

Figure 31:
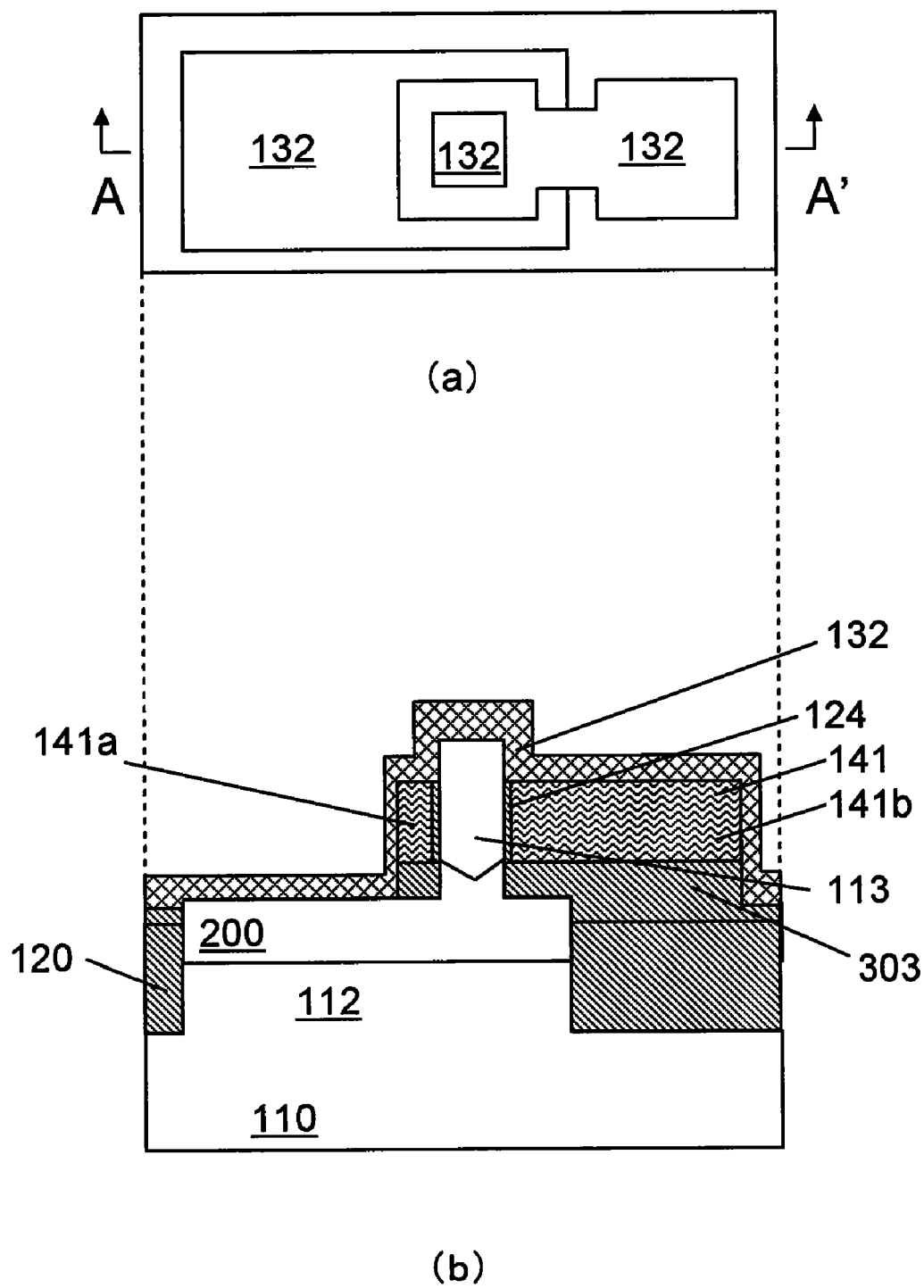
FIG. 31(*a*) is a top plan view showing one step in the method.

Referring to FIG. 31, a third nitride film 132 is formed on the in-process structure in FIG. 30.

Figure 32:
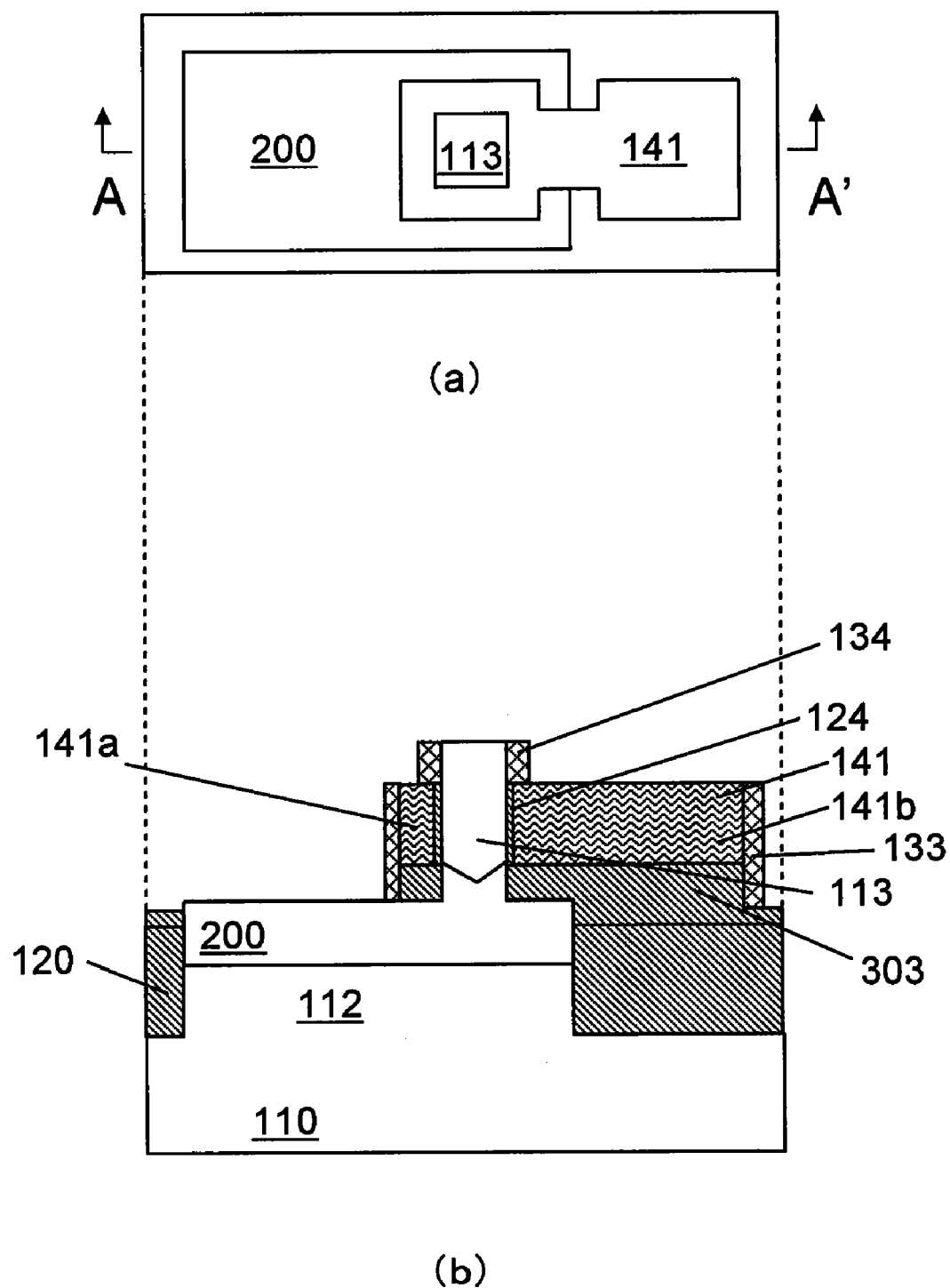
FIG. 32(*a*) is a top plan view showing one step in the method.

Referring to FIG. 32, the third nitride film 132 is etched back in such a manner that the respective upper surfaces of the source diffusion layer 200 and the first columnar silicon layer 113 are exposed, and a second insulating film sidewall 133 and a second insulating film sidewall 134 which serve as a sidewall-shaped second insulating film, are formed around a sidewall of the gate electrode 141 and an upper sidewall of the first columnar silicon layer 113, respectively. The second insulating film sidewalls 133, 134 can separate between the gate electrode 141 and respective ones of the source diffusion layer 200 and the after-mentioned drain diffusion layer 201 to be formed in the upper portion of the first columnar silicon layer 113, so as to prevent a short between the gate electrode 141 and respective ones of the source diffusion layer 200 and the after-mentioned drain diffusion layer 201 due to after-mentioned metal-semiconductor compounds. In addition, the second insulating film sidewall 134 covering the upper sidewall of the first columnar silicon layer 113 can prevent a metal-semiconductor compound from being formed on the upper sidewall of the first columnar silicon layer 113 in a subsequent step.

Figure 33:
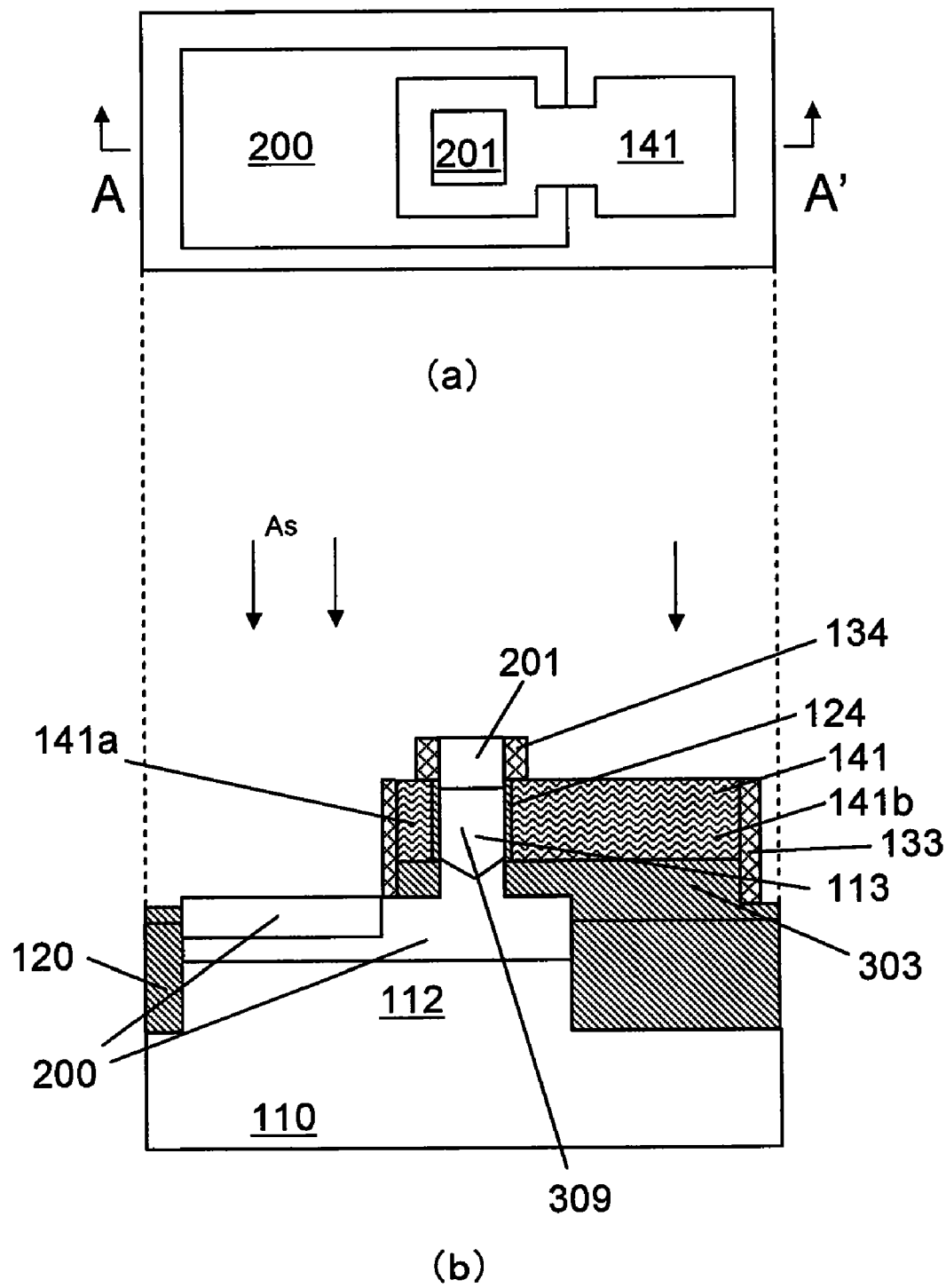
FIG. 33(*a*) is a top plan view showing one step in the method.

Referring to FIG. 33, an impurity, such as P or As, is introduced into the upper portion of the first columnar silicon layer 113 through an impurity introduction process comprising an impurity injection process, to form a drain diffusion layer 201 in the upper portion of the first columnar silicon layer 113. A portion of the first columnar silicon layer 113 between the source diffusion layer 200 and the drain diffusion layer 201 is formed as a body 309 which is a semiconductor layer of a first conductive type.

Figure 34:
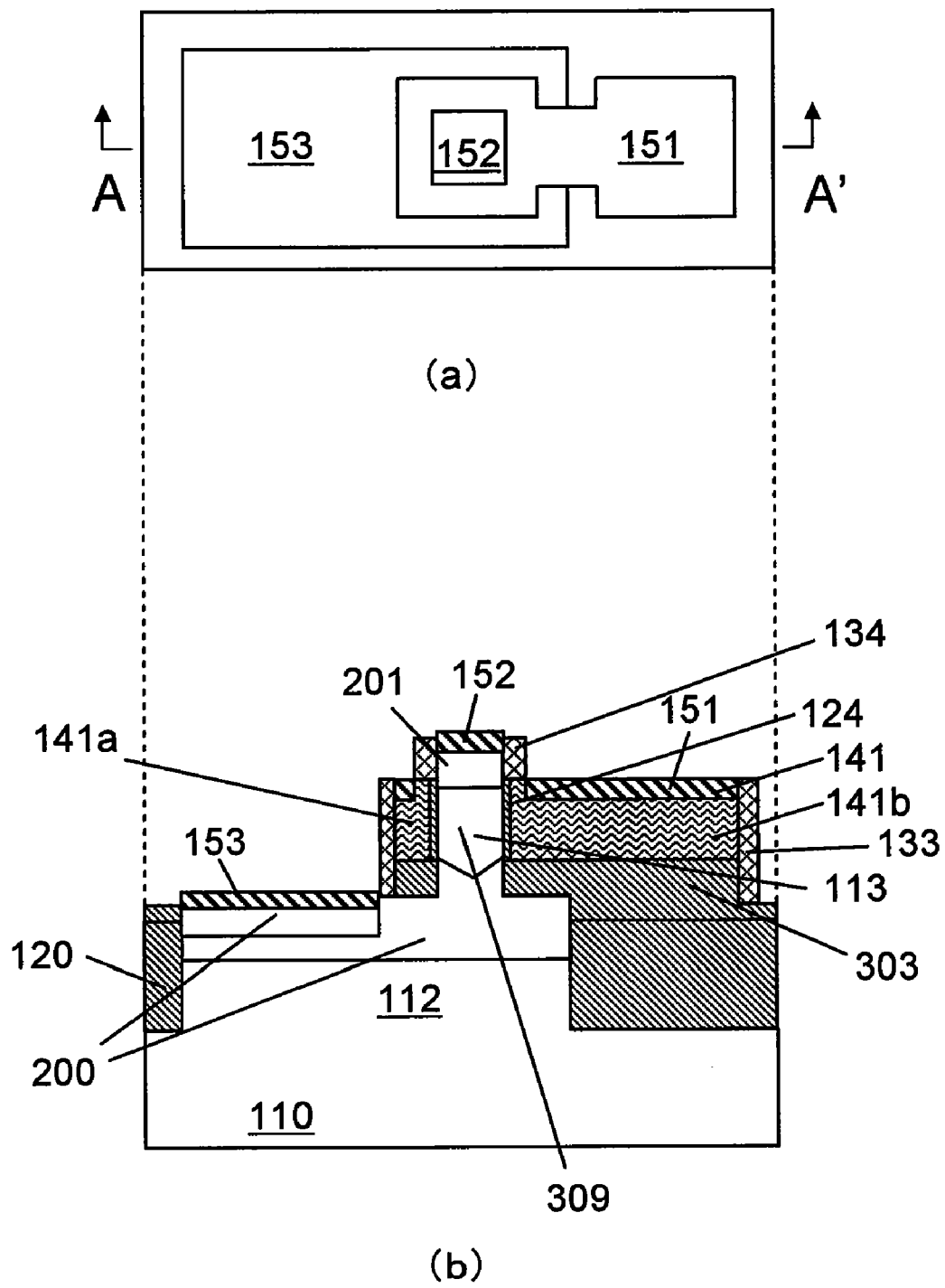
FIG. 34(*a*) is a top plan view showing one step in the method.

Referring to FIG. 34, a first metal film, such as a nickel (Ni) film or a cobalt (Co) film, is formed on the respective exposed surface of the source diffusion layer 200 and the gate electrode 141, and an upper surface of the drain diffusion layer 201 by a sputtering process. The first metal film is then subjected to a heat treatment, and an unreacted part of the heat-treated film is removed to form a metal-semiconductor compound 151, a metal-semiconductor compound 152 and a metal-semiconductor compound 153, on the gate electrode 141, the drain diffusion layer 201 and the source diffusion layer 200, respectively.

The metal-semiconductor compound 151 formed on the gate electrode 141 surrounding the first columnar silicon layer 113 can reduce a resistance of the gate electrode 141. As long as the width Wg of the gate electrode 141 and the width Ws of the second insulating film sidewall 134 are satisfy the following relation: Wg>Ws, and the upper surface of the gate electrode 141 is exposed, the metal-semiconductor compound 151 can be formed on the gate electrode 141.

Figure 35:
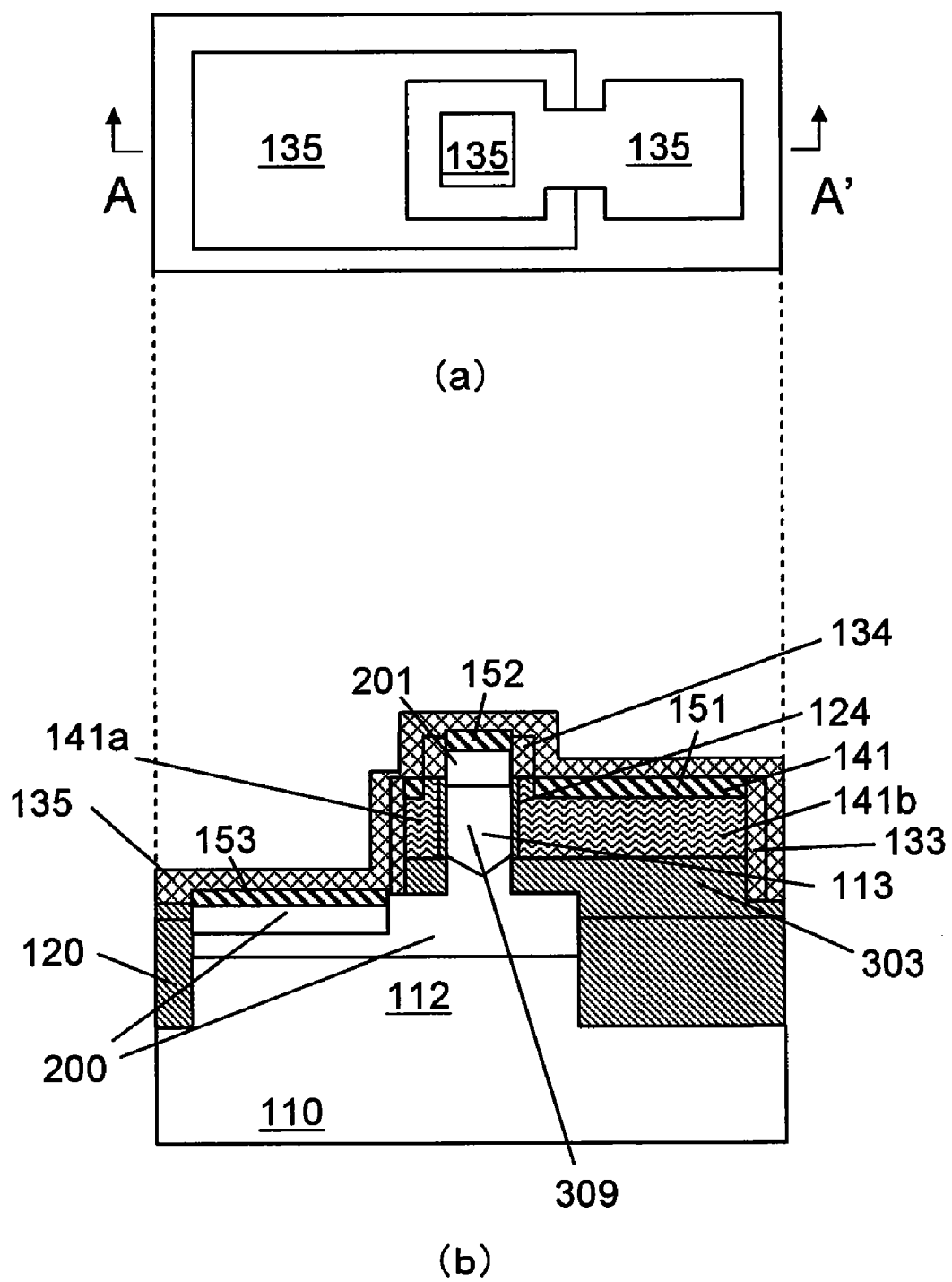
FIG. 35(*a*) is a top plan view showing one step in the method.

Referring to FIG. 35, a contact stopper 135, such as a nitride film, is formed on the in-process structure in FIG. 34.

Figure 36:
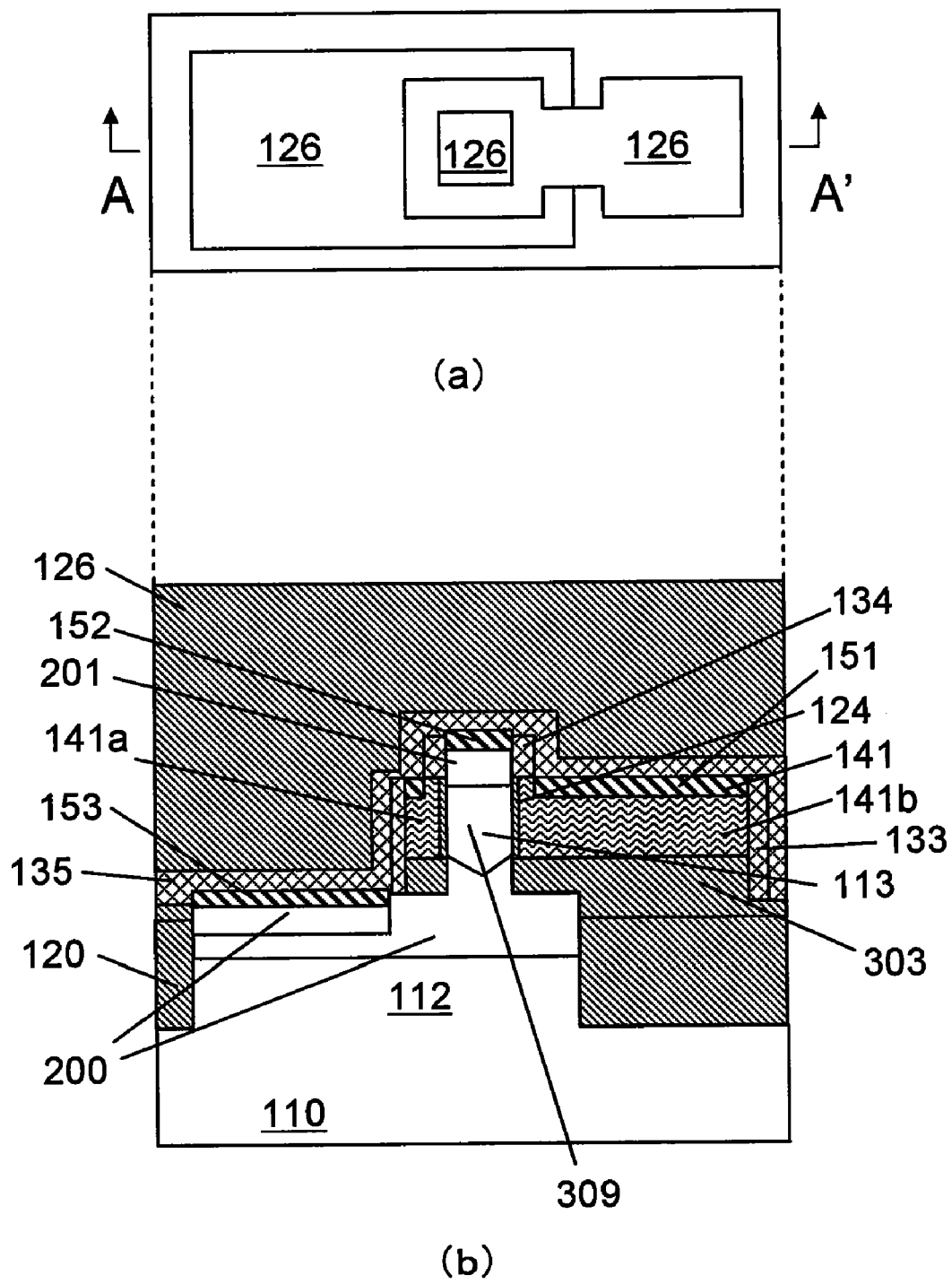
FIG. 36(*a*) is a top plan view showing one step in the method.

Referring to FIG. 36, an interlayer insulating film 126 which is a third oxide film, is formed on the in-process structure in FIG. 35, and then flattened by a CMP process.

Figure 37:
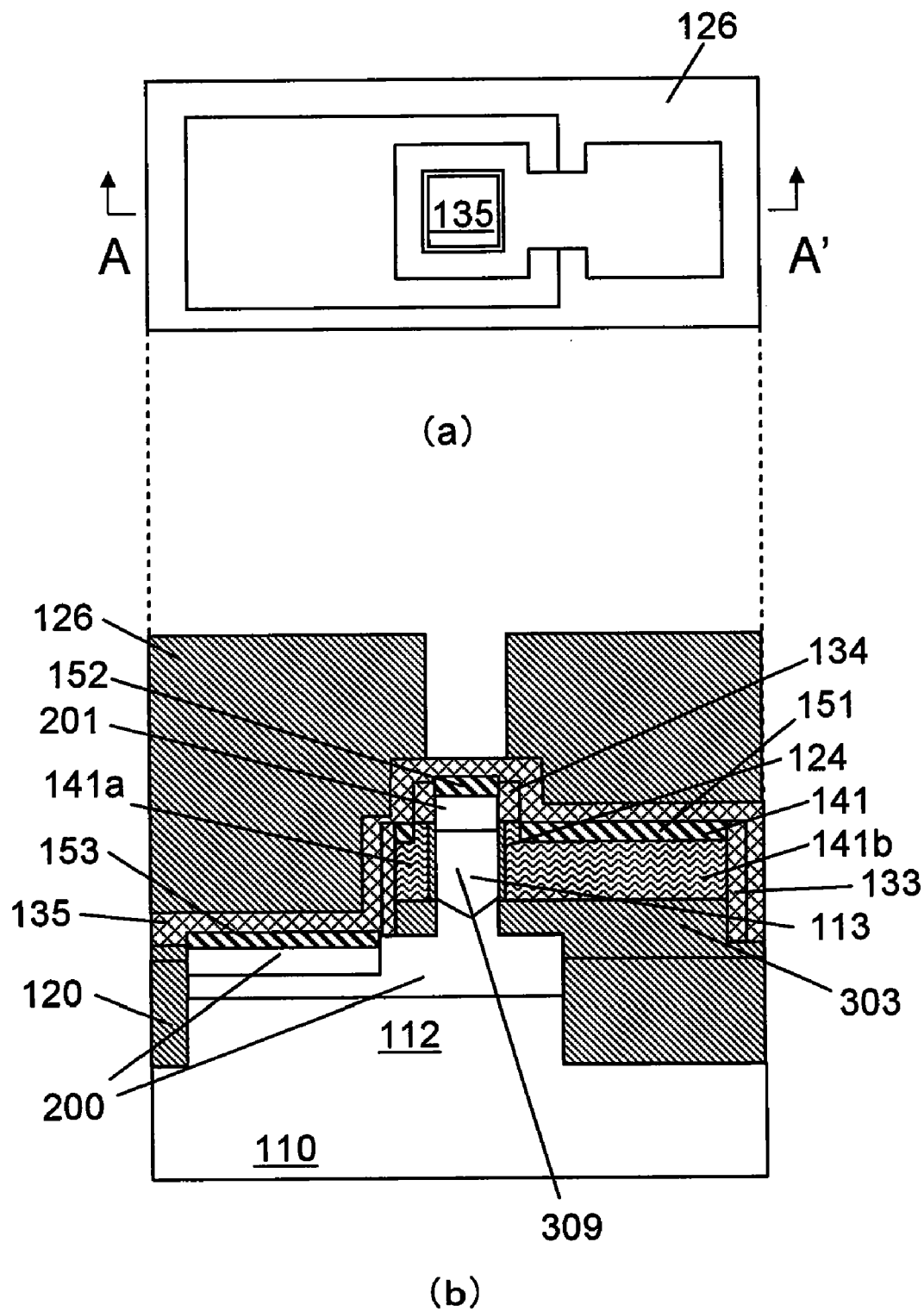
FIG. 37(*a*) is a top plan view showing one step in the method.

Referring to FIG. 37, a contact hole is formed in the interlayer insulating film 126 at positions on upper side of the drain diffusion layer 201 in the upper portion of the first columnar silicon layer 113 by an etching process. The etching process for the contact holes is stopped by the contact stopper 135.

Figure 38:
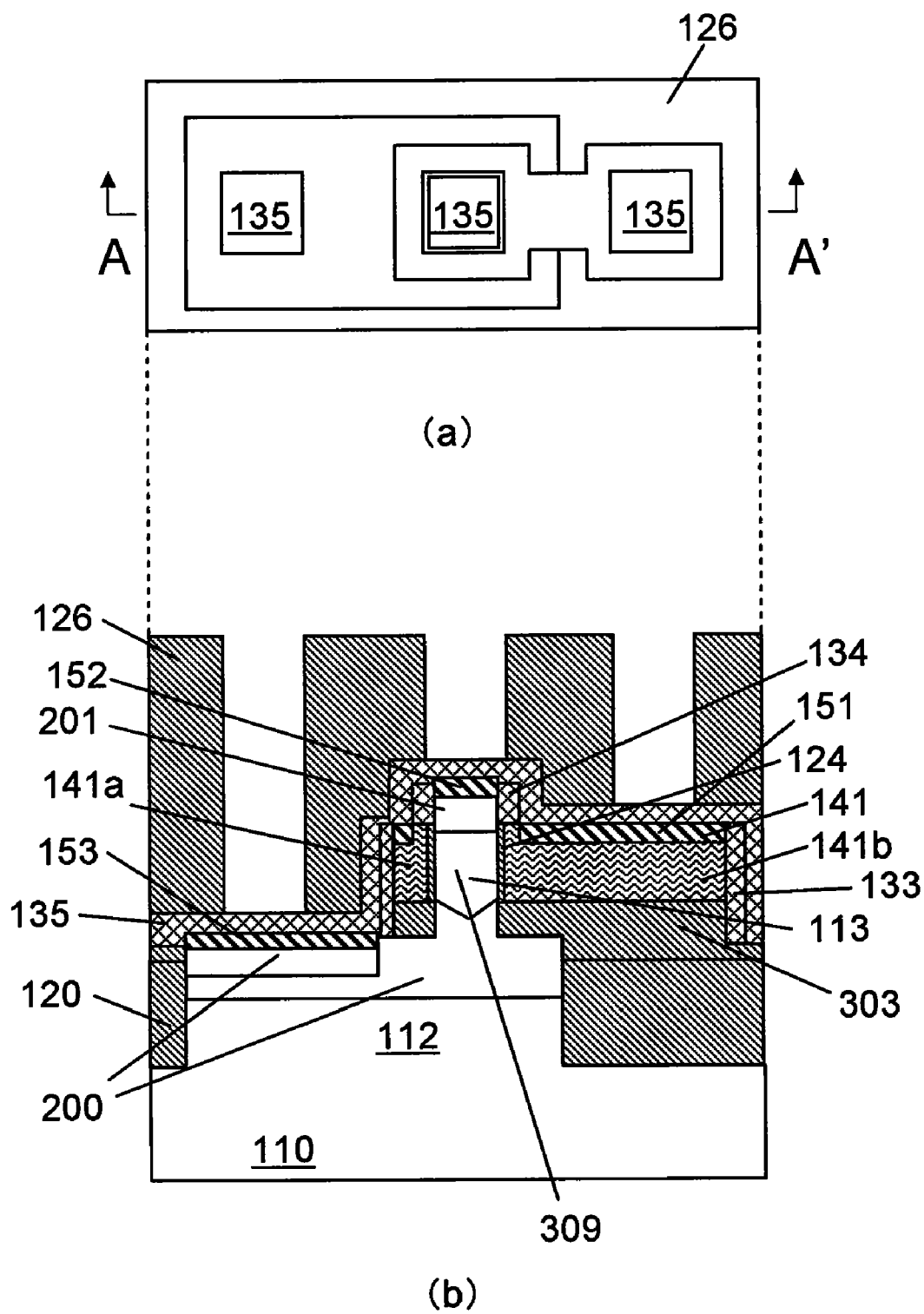
FIG. 38(*a*) is a top plan view showing one step in the method.

Referring to FIG. 38, two contact holes are formed in the interlayer insulating film 126 at positions on respective upper sides of the gate wiring 141b, and the source diffusion layer 200, by an etching process. The etching process for each of the contact holes is stopped by the contact stopper 135.

Figure 39:
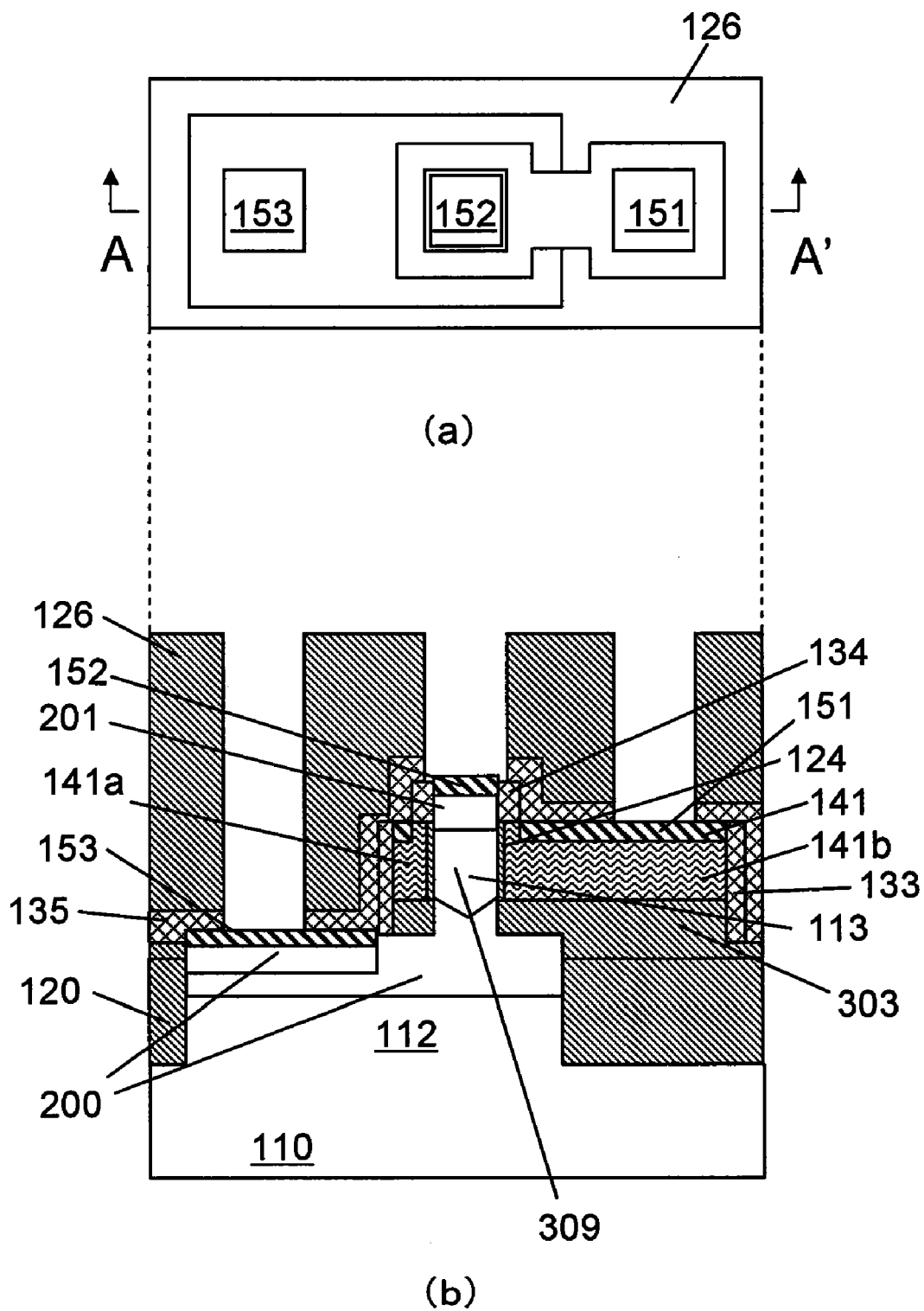
FIG. 39(*a*) is a top plan view showing a semiconductor device obtained by the method.

Referring to FIG. 39, portions of the contact stopper 135 corresponding to the respective contact holes are etched.

Figure 40:
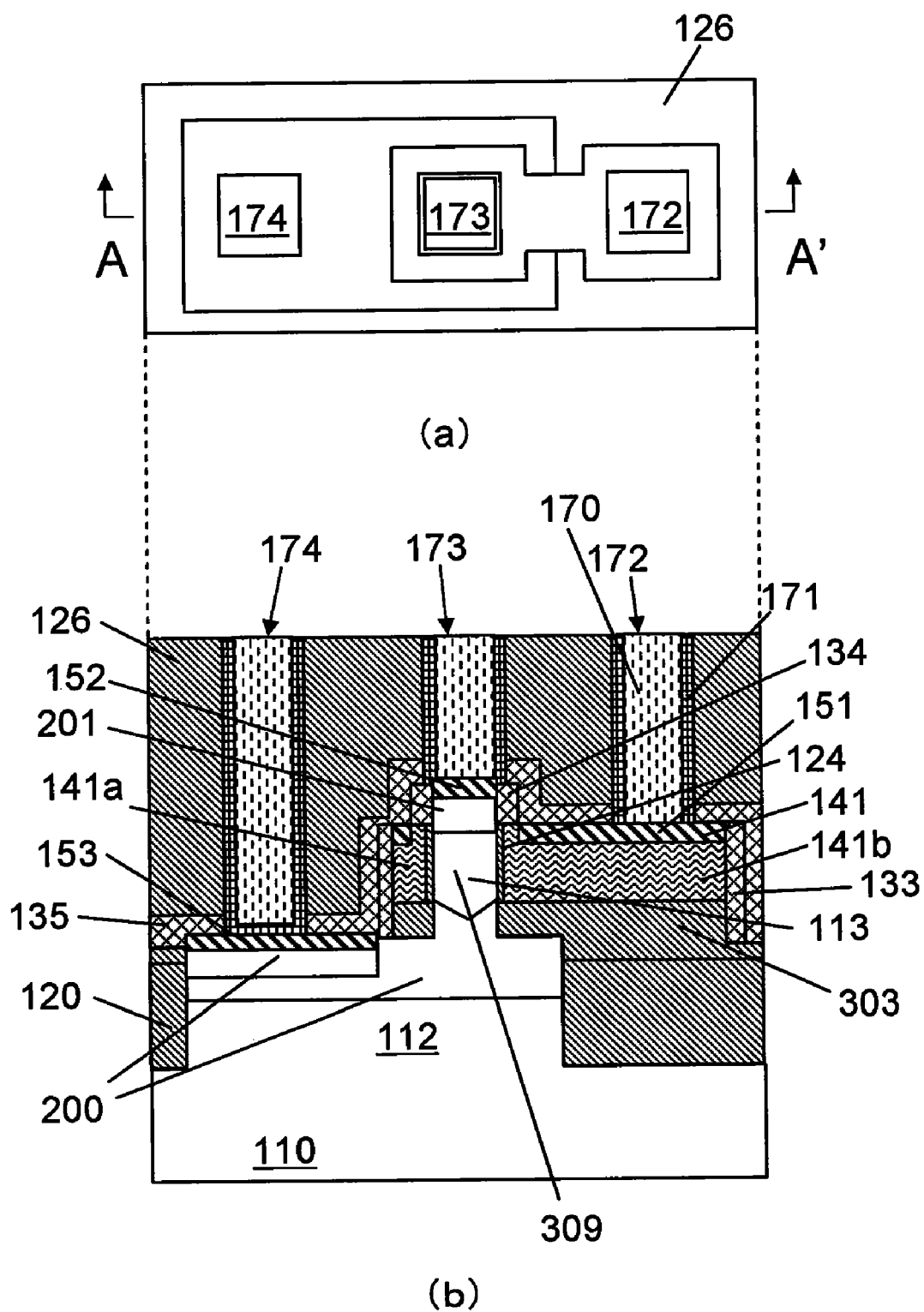
FIG. 40(*a*) is a top plan view showing a semiconductor device obtained by the method.

Referring to FIG. 40, a barrier metal film 171, such as a tantalum (Ta) film or a tantalum nitride (TaN) film, is formed on an inner peripheral surface of each of the contact holes. Then, a metal film, such as a copper (Cu) film, is formed on the barrier metal film 171 by a sputtering process or a plating process, and subjected to a CMP process to form three contacts (contact plugs) 172, 173, 174 corresponding to respective ones of the gate wiring 141b, the drain diffusion layer 201 and the source diffusion layer 200. A titanium (Ti) film or a titanium nitride (TiN) film may be used as the barrier metal film 171. A tungsten (W) film may also be used. Further, a copper-containing alloy film may be used.

Referring to FIG. 41, a barrier metal film 175, such as a Ta film or a TaN film, is formed on the in-process structure in FIG. 40, and then a metal film 176 is formed on the barrier metal film 175. Then, the barrier metal film 175 and the metal film 176 are subjected to lithography to form three first layer wirings 177, 178, 179 corresponding to respective ones of the contacts 172, 173, 174. A titanium (Ti) film or a titanium nitride (TiN) film may be used as the barrier metal film 175. A tungsten (W) film may also be used.

What is claimed is:

1. A method of manufacturing a semiconductor device, comprising the steps of:

forming a first columnar semiconductor layer on a substrate, and forming a first flat semiconductor layer in an upper portion of the substrate lying under the first columnar semiconductor layer;

forming a first semiconductor layer of a second conductive type in a lower portion of the first columnar semiconductor layer and an entirety or an upper portion of the first flat semiconductor layer;

forming a first insulating film around a lower sidewall of the first columnar silicon layer and above the first flat semiconductor layer;

forming a gate insulating film and a gate electrode around the first columnar silicon layer;

forming a sidewall-shaped second insulating film to surround an upper sidewall of the first columnar silicon layer while contacting an upper surface of the gate electrode and to surround a sidewall of the gate electrode and the first insulating film;

forming a second semiconductor layer of the second conductive type in an upper portion of the first columnar silicon layer, and forming a semiconductor layer of a first conductive type between the first semiconductor layer of the second conductive type and the second semiconductor layer of the second conductive type; and forming a metal-semiconductor compound on each of an upper surface of the first semiconductor layer of the second conductive type and an upper surface of the second semiconductor layer of the second conductive type, wherein the first insulating film has a thickness larger than that of the gate insulating film formed around the first columnar silicon layer.

2. The method as defined in claim 1, wherein a length between a central axis of the first columnar silicon layer and an edge of the first flat silicon layer is larger than a sum of a length between the central axis of the first columnar silicon layer and a sidewall of the first columnar silicon layer, the thickness of the gate insulating film, a thickness of the gate electrode, and a thickness of the sidewall-shaped second insulating film formed to surround the sidewall of the gate electrode and the first insulating film.

3. The method as defined in claim 1, wherein the gate electrode has a thickness larger than that of the sidewall-shaped second insulating film formed to surround the upper sidewall of the first columnar silicon layer while contacting the upper surface of the gate electrode.

4. The method as defined in claim 1, wherein:
the first flat semiconductor layer is a first flat silicon layer;
the first columnar semiconductor layer is a first columnar silicon layer;
the semiconductor layer of the first conductive type is a silicon layer of the first conductive type;
the first semiconductor layer of the second conductive type is a first silicon layer of the second conductive type; and
the second semiconductor layer of the second conductive type is a second silicon layer of the second conductive type.

5. The method as defined in claim 4, wherein:
the semiconductor layer of the first conductive type is a p-type silicon layer or a non-doped silicon layer;
the first semiconductor layer of the second conductive type is an n-type silicon layer; and
the second semiconductor layer of the second conductive type is an n-type silicon layer.

6. The method as defined in claim 4, wherein:
the semiconductor layer of the first conductive type is an n-type silicon layer or a non-doped silicon layer;
the first semiconductor layer of the second conductive type is a p-type silicon layer; and
the second semiconductor layer of the second conductive type is a p-type silicon layer.

7. The method as defined in claim 4, which includes the steps of:
forming a pad oxide film on the silicon substrate;
forming on the pad oxide film a first nitride film for use as a mask during the formation of the first columnar silicon layer;
forming a first amorphous silicon or polysilicon film on the first nitride film;
applying a resist onto the first amorphous silicon or polysilicon film, and transferring a first columnar layer pattern to the resist through lithography to leave a first resist corresponding to the first columnar layer pattern; and
etching the first amorphous silicon or polysilicon film and the first nitride film in turn to form a first hard mask.

8. The method as defined in claim 7, which includes the step of forming the first columnar semiconductor layer by a dry etching process using the first hard mask.

9. The method as defined in claim 8, wherein the first amorphous silicon or polysilicon film serving as the first hard mask is fully etched during the dry etching process to cause a change in plasma emission intensity detectable by a dry etching apparatus, and wherein the step of forming the first columnar semiconductor layer includes detecting the change in the plasma emission intensity, and determining a termination timing of the dry etching process based on the detection result to control a height dimension of the first columnar silicon layer.

10. The method as defined in claim 9, wherein a height dimension of the first amorphous silicon or polysilicon film before the dry etching process is less than that of the first columnar silicon layer.

11. The method as defined in claim 4, which includes the step of sacrificially oxidizing a surface of the first columnar silicon layer fabricated on the substrate so as to reduce irregularities of a sidewall of the first columnar silicon layer for use as a channel region while removing a surface portion of the first columnar silicon layer having carbon implanted thereinto during the dry etching process, and protect the first columnar silicon layer from contaminations including a by-product to be produced during a subsequent dry etching process.

12. The method as defined in claim 4, which includes the steps of:
applying a resist onto the substrate having the first columnar silicon layer and transferring a first flat silicon layer pattern to the resist through lithography to leave a second resist corresponding to the first flat silicon layer pattern; and
etching the silicon substrate to form the first flat silicon layer, and removing the second resist.

13. The method as defined in claim 4, which includes the steps of:
depositing a filling oxide film on the first flat silicon layer and substrate having the first columnar silicon layer;
flattening the filling oxide film; and
etching the filling oxide film in such a manner as to allow a surface of an upper portion of the first flat silicon layer to be exposed.

14. The method as defined in claim 4, which includes the step of the offset spacer formation on the sidewall of the first columnar silicon layer.

15. The method as defined in claim 4, wherein the first silicon layer of the second conductive type is formed in the lower portion of the first columnar semiconductor layer and the entirety or the upper portion of the first flat semiconductor layer by introducing an impurity of the second conductive type into the first flat semiconductor layer having the first columnar silicon layer with a offset spacer through an impurity introduction process comprising an impurity injection process. And then, the offset spacer is etched.

16. The method as defined in claim 4, wherein the first silicon layer of the second conductive type is formed in the lower portion of the first columnar semiconductor layer without injecting any impurity into the upper portion of the first columnar silicon layer.

17. The method as defined in claim 4, which includes the steps of:
depositing a first insulating film material above and around the first columnar silicon layer fabricated on the first flat silicon layer, in such a manner that the first insulating film material deposited above the first columnar silicon layer and around the lower sidewall of the first columnar silicon layer has a thickness larger than that of the first insulating film material deposited around an intermediate/upper sidewall of the first columnar silicon layer; and
etching the first insulating film material around the intermediate/upper sidewall of the first columnar silicon layer to form the first insulating film above the first columnar silicon layer and around the lower sidewall of the first columnar silicon layer, in such a manner as to have a thickness larger than that of the gate insulating film to be formed around the first columnar silicon layer.

18. The method as defined in claim 4, wherein the gate insulating film is formed on the sidewall of the first columnar silicon layer with a first hard mask of nitride film fabricated on the first flat silicon layer, and wherein the method includes the steps of:
forming a second amorphous silicon or polysilicon film serving as a gate electrode material, on an in-process structure obtained by the step of forming the gate insulating film, in such a manner as to allow the first columnar silicon layer to be embedded therein; and
polishing the second amorphous silicon or polysilicon film by a chemical mechanical polishing process to have a flattened upper surface, wherein the nitride film serving as the first hard mask is used as a stopper against the chemical mechanical polishing process to control a polishing amount with enhanced reproducibility.

19. The method as defined in claim 18, which includes the steps of:
etching back the second amorphous silicon or polysilicon film serving as the gate electrode material, to allow the gate electrode to be formed with a desired gate length; and
depositing a first oxide film on an in-process structure obtained by the step of etching back the second amorphous silicon or polysilicon film, whereby the first oxide film can protect an upper surface of the gate electrode from a wet etching or dry etching process to be performed in a subsequent step, so as to suppress a change or variation in the gate length and damage of the gate insulating film from the upper surface of the gate electrode.

20. The method as defined in claim 19, which includes the steps of:
forming a second nitride film on the first oxide film;
etching back the second nitride film to form a third insulating film sidewall, and etching the first oxide film;
applying a bottom anti-reflective coating (BARC) layer onto an in-process structure obtained by the step of etching back the second nitride film, applying a resist onto the BARC layer, and transferring a gate wiring pattern to the resist through lithography to leave a third resist corresponding to the gate wiring pattern;
etching the BARC layer, and the second amorphous silicon or polysilicon film serving as the gate electrode material, using the third resist as a mask, to form a gate electrode body and a gate wiring which make up the gate electrode;
partly removing the first insulating film by a dry etching or wet etching to allow the surfaces of the first semiconductor layer of the second conductive type lying under the first columnar silicon layer to be exposed;
the removing the resist and the BARC;
forming the fourth oxide layer on an exposed surface of the gate electrode and the surfaces of the first semiconductor layer of the second conductive type lying under the first columnar silicon layer;
removing the first nitride film above the first columnar silicon layer and the second nitride film around the first columnar silicon layer by an etching process; and
removing the pad oxide film, and the first oxide film and the fourth oxide layer.

21. The method as defined in claim 4, which includes the steps of:
forming a third nitride film on the first columnar silicon layer fabricated on the first flat silicon layer, the gate electrode surrounding the first columnar silicon layer, etching back the third nitride film in such a manner that the respective upper surfaces of the first semiconductor layer of the second conductive type lying under the first columnar silicon layer, and the upper portion of the first columnar silicon layer, are exposed, and forming a second insulating film sidewall serving as the sidewall-shaped second insulating film, to surround the upper sidewall of the first columnar silicon layer while contacting the upper surface of the gate electrode and to surround the sidewall of the gate electrode;
introducing an impurity of the second conductive type into the upper portion of the first columnar silicon layer through an impurity introduction process comprising an impurity injection process, to form the second silicon layer of the second conductive type in the upper portion of the first columnar silicon layer, and form the silicon layer of the first conductive type between the first silicon layer of the second conductive type and the second silicon layer of the second conductive type; and
forming a first metal film such as a nickel (Ni) film or a cobalt (Co) film, on the respective exposed surface of the first silicon layer of the second conductive type and the gate electrode, and an upper surface of the second silicon of the second conductive type, by a sputtering process, subjecting the first metal film to a heat treatment, and removing an unreacted part of the heat-treated film, to form a metal-semiconductor compound on each of the first silicon layer of the second conductive type and the second silicon layer of the second conductive type.

22. The method as defined in claim 4, which includes the steps of:
forming a contact stopper such as a nitride film, on the first columnar silicon layer fabricated on the first flat silicon layer, the gate electrode surrounding the first columnar silicon layer;
forming a third oxide film serving as an interlayer insulating film, on the contact stopper, and flattening the third oxide film by a chemical mechanical polishing process;
forming a contact hole in the third oxide film at position on the upper side of the second silicon layer of the second conductive type formed in the upper portion of the first columnar silicon layer, by an etching process;
forming contact holes in the third oxide film at positions on respective upper sides of the first silicon layer of the second conductive type formed in the entirety or the upper portion of the first flat semiconductor layer lying under the first columnar silicon layer, and the gate electrode, by an etching process;
etching the portion of the contact stopper corresponding to the respective contact holes.

23. A method of manufacturing a semiconductor device, comprising the steps of:
depositing an amorphous silicon or polysilicon film on a structure comprising:
a flat silicon layer;
a columnar silicon layer formed on the flat silicon layer;
a hard mask formed on the upper portion of the columnar silicon layer;
a source diffusion layer formed in the lower portion of the columnar silicon layer and on the flat silicon layer;
an insulating film formed at least on the source diffusion layer on the flat silicon layer; and
a gate insulating film formed around the columnar silicon layer, wherein the gate insulating film is thinner than the insulating film so as to bury the columnar silicon layer, and the amorphous silicon or polysilicon film forms a gate electrode and a gate wiring extending from the gate electrode;
flattening the amorphous silicon or polysilicon film by chemical mechanical polishing;
etching back the amorphous silicon or polysilicon film so as to be lower than the top of the columnar silicon layer, and defining a gate length of transistor;
depositing a first oxide film and a first nitride film to form a first sidewall used for patterning of the gate electrode;
etching back the first oxide film and the first nitride film, and forming the first sidewall on the side of the columnar silicon layer and on the amorphous silicon or polysilicon film;

injecting impurity into the amorphous silicon or polysilicon film so that the amorphous silicon or polysilicon film has the same conductive type as the source diffusion layer;

applying a resist onto the amorphous silicon or polysilicon film for the patterning of the gate wiring;

etching the amorphous silicon or polysilicon film using the first sidewall and the resist, and forming the gate electrode which is formed around the columnar silicon layer and the gate wiring extending from the gate electrode by patterning;

etching a part of the insulating film using the gate electrode and the gate wiring as a mask, and exposing the upper surface of the source diffusion layer which was formed on the flat silicon layer;

removing the resist;

forming a second oxide film on the surfaces of the gate electrode and the gate wiring;

removing the hard mask and the first nitride film of the first sidewall;

removing the first oxide film and the second oxide film;

depositing a second nitride film to form a second sidewall;

etching back the second nitride film, and exposing the upper surface of the gate electrode, the upper surface of the source diffusion layer on the flat silicon layer and the surface of the upper portion of the columnar silicon layer, and forming the second sidewall on the side of the columnar silicon layer and the side of the gate electrode;

forming a drain diffusion layer on the upper portion of the columnar silicon layer; and depositing a metal film, and processing a heat treatment, and forming metal-silicon compound layers on the exposed upper surface of the gate electrode, the upper surface of the source diffusion layer on the flat silicon layer, and the upper portion of the columnar silicon layer where the drain diffusion layer was formed, wherein the second sidewall is used to inhibit compounding during the forming of the metal-silicon compound layers.

* * * * *

UNITED STATES PATENT AND TRADEMARK OFFICE
CERTIFICATE OF CORRECTION

PATENT NO. : 8,080,458 B2
APPLICATION NO. : 12/761735
DATED : December 20, 2011
INVENTOR(S) : Fujio Masuoka et al.

Page 1 of 1

It is certified that error appears in the above-identified patent and that said Letters Patent is hereby corrected as shown below:

In the Claims

In column 25, claim 20, line 39, before "removing the resist and the" delete "the".

Signed and Sealed this
Twenty-fourth Day of April, 2012

David J. Kappos
*Director of the United States Patent and Trademark Office*